US011797474B2

(12) United States Patent
Vorbach

(10) Patent No.: US 11,797,474 B2
(45) Date of Patent: Oct. 24, 2023

(54) HIGH PERFORMANCE PROCESSOR

(71) Applicant: Hyperion Core, Inc., Los Gatos, CA (US)

(72) Inventor: Martin Vorbach, Lingenfeld (DE)

(73) Assignee: Hyperion Core, Inc., Los Gatos, CA (US)

( * ) Notice: Subject to any disclaimer, the term of this patent is extended or adjusted under 35 U.S.C. 154(b) by 0 days.

(21) Appl. No.: 17/079,465

(22) Filed: Oct. 24, 2020

(65) Prior Publication Data

US 2021/0286755 A1    Sep. 16, 2021

Related U.S. Application Data

(63) Continuation-in-part of application No. 16/042,803, filed on Jul. 23, 2018, now abandoned, which is a
(Continued)

(30) Foreign Application Priority Data

Feb. 17, 2011 (EP) ..................................... 11001304
Feb. 17, 2011 (EP) ..................................... 11001305
(Continued)

(51) Int. Cl.
*G06F 15/78* (2006.01)
*G06F 9/30* (2018.01)
(Continued)

(52) U.S. Cl.
CPC ........ *G06F 15/7839* (2013.01); *G06F 9/3017* (2013.01); *G06F 9/30043* (2013.01);
(Continued)

(58) Field of Classification Search
CPC .... G06F 9/30043; G06F 9/3017; G06F 9/345; G06F 9/38; G06F 15/7839; G06F 15/7821; G11C 8/16
See application file for complete search history.

(56) References Cited

U.S. PATENT DOCUMENTS 6,948,050 B1   9/2005   Gove et al.
7,237,071 B2   6/2007   Jahnke
(Continued)

FOREIGN PATENT DOCUMENTS

WO   2010/142432   2/2010
WO   2010/043401   4/2010
(Continued)

OTHER PUBLICATIONS

Microchip Technology, How to achieve deterministic code performance using a cortex-m cache controller, 2018 (Year: 2018).*
(Continued)

*Primary Examiner* — Ryan Bertram
(74) *Attorney, Agent, or Firm* — IP Spring

(57) ABSTRACT

Implementations relate to a data processor that includes a data processing unit having a plurality of processing elements and a cache hierarchy including a plurality of levels of data caches. The data caches include a first level data cache connected to a second level data cache, and a main memory connected to the highest level cache of the cache hierarchy. At least one of the first level data cache or second level data cache is divided into a plurality of cache segments, and during operation of the data processor, at least some of the plurality of cache segments are excluded from cache operation. Each of the excluded cache segments is dedicated to an associated processing element as tightly coupled local access memory.

21 Claims, 40 Drawing Sheets

Related U.S. Application Data continuation of application No. 14/000,155, filed as application No. PCT/EP2012/000713 on Feb. 17, 2012, now Pat. No. 10,031,888.

(30) Foreign Application Priority Data

| | | | |
|---|---|---|---|
| May 16, 2011 | (EP) | ................................... | 11004033 |
| Jun. 8, 2011 | (EP) | ................................... | 11004667 |
| Jun. 27, 2011 | (EP) | ................................... | 11005196 |
| Jul. 8, 2011 | (WO) | ................. | PCT/EP2011/003428 |
| Aug. 16, 2011 | (EP) | ................................... | 11006698 |
| Sep. 9, 2011 | (EP) | ................................... | 11007370 |
| Dec. 16, 2011 | (EP) | ................................... | 11009911 |
| Dec. 16, 2011 | (EP) | ................................... | 11009912 |
| Dec. 16, 2011 | (EP) | ................................... | 11009913 |
| Apr. 1, 2020 | (EP) | ................................... | 20020148 |
| May 6, 2020 | (EP) | ................................... | 20020206 |

(51) Int. Cl.

| | |
|---|---|
| G06F 9/345 | (2018.01) |
| G06F 9/38 | (2018.01) |
| G06F 12/0893 | (2016.01) |
| G11C 8/16 | (2006.01) |
| G11C 11/412 | (2006.01) |
| G06F 8/41 | (2018.01) |
| G06F 12/0877 | (2016.01) |

(52) U.S. Cl.
CPC ............... *G06F 9/345* (2013.01); *G06F 9/38* (2013.01); *G06F 12/0893* (2013.01); *G06F 15/7821* (2013.01); *G06F 8/4441* (2013.01); *G06F 8/452* (2013.01); *G06F 12/0877* (2013.01); *G06F 2212/2515* (2013.01); *G06F 2212/282* (2013.01); *G06F 2213/0038* (2013.01); *G11C 8/16* (2013.01); *G11C 11/412* (2013.01); *Y02D 10/00* (2018.01)

(56) References Cited

U.S. PATENT DOCUMENTS

| | | | | |
|---|---|---|---|---|
| 7,627,723 | B1 | 12/2009 | Buck et al. | |
| 2008/0147989 | A1* | 6/2008 | Williams, III | ........ G06F 12/126 |
| | | | | 711/145 |
| 2008/0177909 | A1* | 7/2008 | Sapp | ........................ G06F 13/28 |
| | | | | 710/27 |
| 2008/0201528 | A1* | 8/2008 | Hsu | ..................... G06F 12/0895 |
| | | | | 711/E12.001 |
| 2009/0157817 | A1* | 6/2009 | Williamson | ............. H04L 51/04 |
| | | | | 709/206 |
| 2010/0037117 | A1 | 2/2010 | Pescatore et al. | |
| 2012/0137075 | A1* | 5/2012 | Vorbach | .............. G06F 12/0815 |
| | | | | 711/E12.024 |
| 2014/0040553 | A1* | 2/2014 | Liang | .................. G06F 12/0893 |
| | | | | 711/E12.024 |
| 2021/0042228 | A1* | 2/2021 | Herdrich | ............. G06F 9/30047 |

FOREIGN PATENT DOCUMENTS

| | | |
|---|---|---|
| WO | 2011/079942 | 7/2011 |
| WO | 2012/003997 | 1/2012 |

OTHER PUBLICATIONS

Microchip Technology, How to achieve deterministic code performance using a cortex-m cache controller, 2018, available at: http://ww1.microchip.com/downloads/en/DeviceDoc/How-to-Achieve-Deterministic-Code-Performance-using-CortexM-Cache-Controller-DS90003186A.pdf (Year: 2018).*

Max Maxfield, 2D vs. 2.5D vs. 3D ICs 101, Apr. 2012, available at: https://www.eetimes.com/2d-vs-2-5d-vs-3d-ics-101/# (Year: 2012).*

Rambus XDR Architecture; DL-0161 Advance Information, Version 0. 8.

WIPO, International Search Report mailed in PCT Application No. PCT/EP2012/000713, dated Sep. 6, 2012, 5 pages.

WIPO, Written Opinion mailed in PCT Application No. PCT/EP2012/000713, dated Sep. 6, 2012, 8 pages.

Arm Ltd., ARM926EJ-S™ Revision: r0p5 Technical Reference Manual; DI0198E_arm926ejs_r0p5_trm.pdf.

Dilillo, et al., "Minimizing Test power in SRAM through Reduction of Precharge", Southampton and Patrick Girard of Laboratoire d'informatique, de Robotique et de Microelectronique de Montpellier.

Micron Technology, Inc., "Technical Note FBDIMM—Channel Utilization (Bandwidth)", PDF: 09005aef8251c075, tn4721.fm—Rev. B 1/10 EN.

Shanley, "Pentium PRO and Pentium II System Architecture", Second Edition, Mindshare Inc.; ISBN978-0-201-30973-7, 1998, 619 pages.

Shanley, "The Unabridged Pentium 4", IA32 Processor Genealogy; Mindshare Inc.; ISBN0-321-25656-X, 2004, 394 pages.

USPTO, Final Office Action for U.S. Appl. No. 16/042,803, dated Apr. 24, 2020, 10 pages.

USPTO, Non-final Office Action for U.S. Appl. No. 14/000,155, dated Dec. 10, 2015, 9 pages.

USPTO, Non-final Office Action for U.S. Appl. No. 14/000,155, dated Jan. 30, 2017, 12 pages.

USPTO, Notice of Allowance for U.S. Appl. No. 14/000,155, dated Mar. 26, 2018, 8 pages.

USPTO, Final Office Action for U.S. Appl. No. 14/000,155, dated Mar. 31, 2016, 11 pages.

USPTO, Final Office Action for U.S. Appl. No. 14/000,155, dated May 22, 2017, 14 pages.

USPTO, Non-final Office Action for U.S. Appl. No. 16/042,803, dated Oct. 17, 2019, 10 pages.

USPTO, Non-final Office Action for U.S. Appl. No. 14/000,155, dated Sep. 5, 2017, 17 pages.

Videolan, http://www.videolan.org/developers/x264.html: VLC media player and x264 are trademarks registered (or in registration process) by the VideoLAN non-profit organization. Software are licensed under the GNU General License.

Wechsler, "Inside Intel® Core™ Microarchitecture: Setting New Standards for Energy-Efficient Performance", White Paper; Copyright © 2006; Intel Corporation; Printed in the United States.0306/RMR/HBD/2K 311830-00IUS, 2006, 12 pages.

Weste, et al., "A circuits and systems perspective", CMOS VLSI Design; Fourth Edition; Addison-Wesley; ISBN-13:978-0-321-54774-3, 867 pages.

"AT14971: SMART SAM E70 TCM Memory", Atmel Corporation, retrieved from Internet: https://www.avrfreaks.net/sites/default/files/forum_attachments/tcm.pdf, 2015, 17 pages.

"Chiplets: the Path to IoT Diversity", Cambridge Consultants, retrieved from Internet: https://www.cambridgeconsultants.com/sites/default/files/2019-10/Chiplets%20-%20The%20path%20to%20IoT%20diversity.pdf, 2019, 19 pages.

"How to Optimize Usage of SAM S70/E70/V7x Architecture", Atmel Corporation, retrieved from Internet: http://ww1.microchip.com/downloads/en/appnotes/atmel-44047-cortex-m7-microcontroller-optimize-usage-sam-v71-v70-e70-s70-architecture_application-note.pdf, 2016, 21 pages.

Homan, Spencer "The Demand for High-Performance Memory", Micron White Paper, Micron Technology, Inc., retrieved from Internet: https://media-www.micron.com/-/media/client/global/documents/products/white-paper/high_performance_memory_white_paper.pdf?rev=cc16375182244b81865a8832290c4977, 2020, 7 pages.

Kehlet, David, "Accelerating Innovation Through a Standard Chiplet Interface: the Advanced Interface Bus (AIB)", Intel White Paper, Intel Corporation, retrieved from Internet: https://www.intel.com/

(56) References Cited

OTHER PUBLICATIONS content/dam/www/public/us/en/documents/white-papers/accelerating-innovation-through-aib-whitepaper.pdf, 2017, 9 pages.

* cited by examiner

Fig. 10a

```
imul    ebx, DWORD PTR [edx+12+eax*4], 42659
imul    esi, DWORD PTR [edx+8+eax*4], 8407
add     esi, ebx
imul    ebx, DWORD PTR [edx+4+eax*4], 7031
add     esi, ebx
imul    ebx, DWORD PTR [edx+eax*4], 3323
add     esi, ebx
imul    ebx, DWORD PTR [edx+ecx*4], 30124
lea     ebx, [esi+ebx]
mov     DWORD PTR [edi+ecx*4], ebx
```

Fig. 10b

```
<<ldr>>     vr0, base=edx, ofs=eax*4+12
<<imul>>    ebx, vr0, 42659
<<ldr>>     vr1, base=edx, ofs=eax*4+8
<<imul>>    esi, vr1, 8407
<<add>>     esi, ebx
<<ldr>>     vr2, base=edx, ofs=eax*4+4
<<imul>>    ebx, vr2, 7031
<<add>>     esi, ebx
<<ldr>>     vr3, base=edx, ofs=eax*4
<<imul>>    ebx, vr3, 3323
<<add>>     esi, ebx
<<ldr>>     vr4, base=edx, ofs=ecx*4
<<imul>>    ebx, vr4, 30124
<<lea>>     ebx, [esi+ebx]
<<str>>     base=edi, ofs=ecx*4, ebx
```

Fig. 10c

```
<<ldr>>     vr0, base=edx, ofs=eax*4+12
<<ldr>>     vr1, base=edx, ofs=eax*4+8
<<ldr>>     vr2, base=edx, ofs=eax*4+4
<<ldr>>     vr3, base=edx, ofs=eax*4
<<ldr>>     vr4, base=edx, ofs=ecx*4
<<imul>>    ebx, vr0, 42659
<<imul>>    esi, vr1, 8407
<<add>>     esi, ebx
<<imul>>    ebx, vr2, 7031
<<add>>     esi, ebx
<<imul>>    ebx, vr3, 3323
<<add>>     esi, ebx
<<imul>>    ebx, vr4, 30124
<<lea>>     ebx, [esi+ebx]
<<str>>     base=edi, ofs=ecx*4, ebx
```

Fig. 10d

```
<<ldrm4>>   [vr0, vr1, vr2, vr3], base=edx,
            ofs=[eax*4+12, eax*4+8, eax*4+4, eax*4]
<<ldr>>     vr4, base=edx, ofs=ecx*4
<<imul>>    ebx, vr0, 42659
<<imul>>    esi, vr1, 8407
<<add>>     esi, ebx
<<imul>>    ebx, vr2, 7031
<<add>>     esi, ebx
<<imul>>    ebx, vr3, 3323
<<add>>     esi, ebx
<<imul>>    ebx, vr4, 30124
<<lea>>     ebx, [esi+ebx]
<<str>>     base=edi, ofs=ecx*4, ebx
```

```
<<ldrm5>>   [vr0, vr1, vr2, vr3, vr4], base=edx,   1001
            ofs=[eax*4+12, eax*4+8, eax*4+4, eax*4, ecx*4]
```

Fig. 10

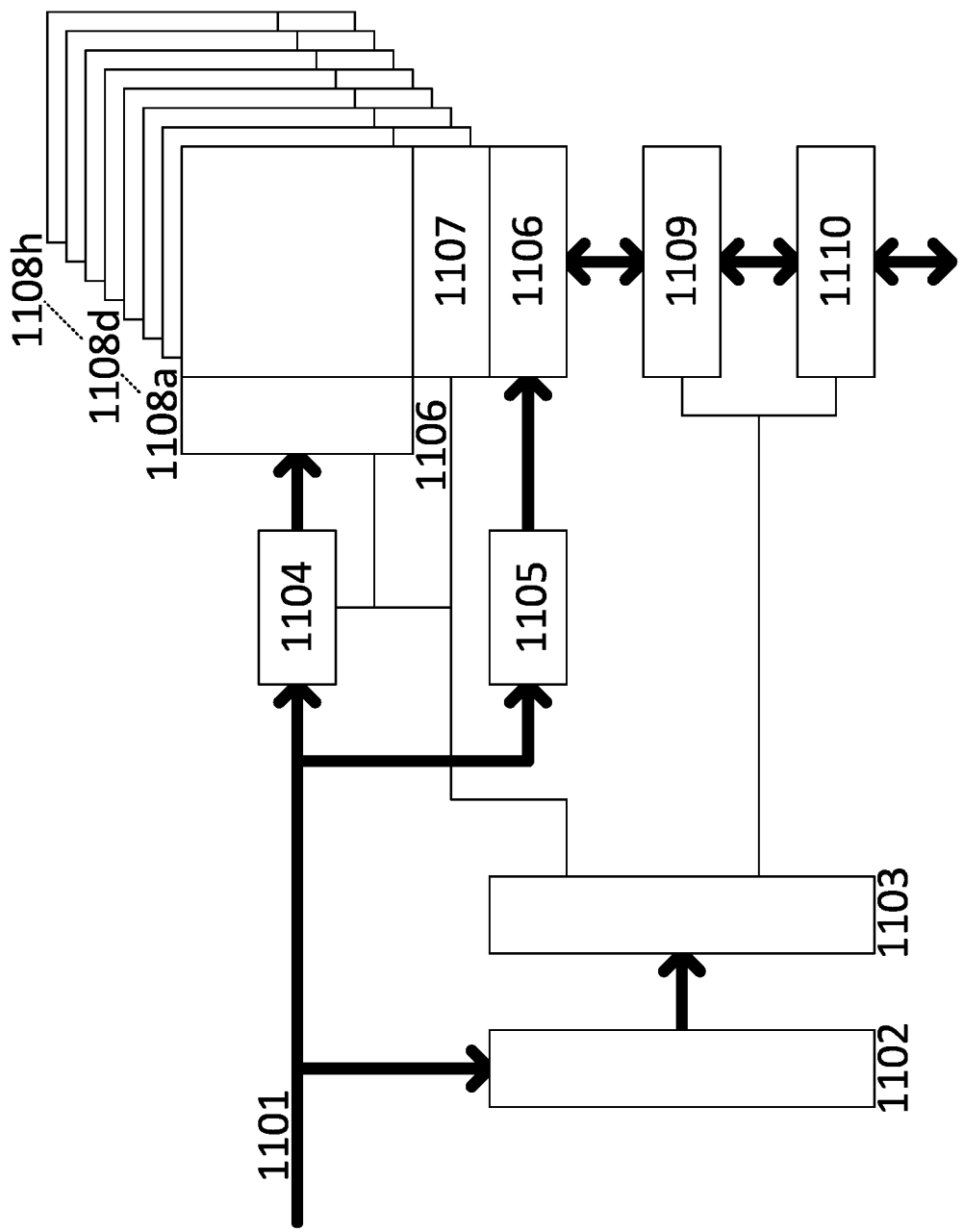
Fig. 11 - Prior Art

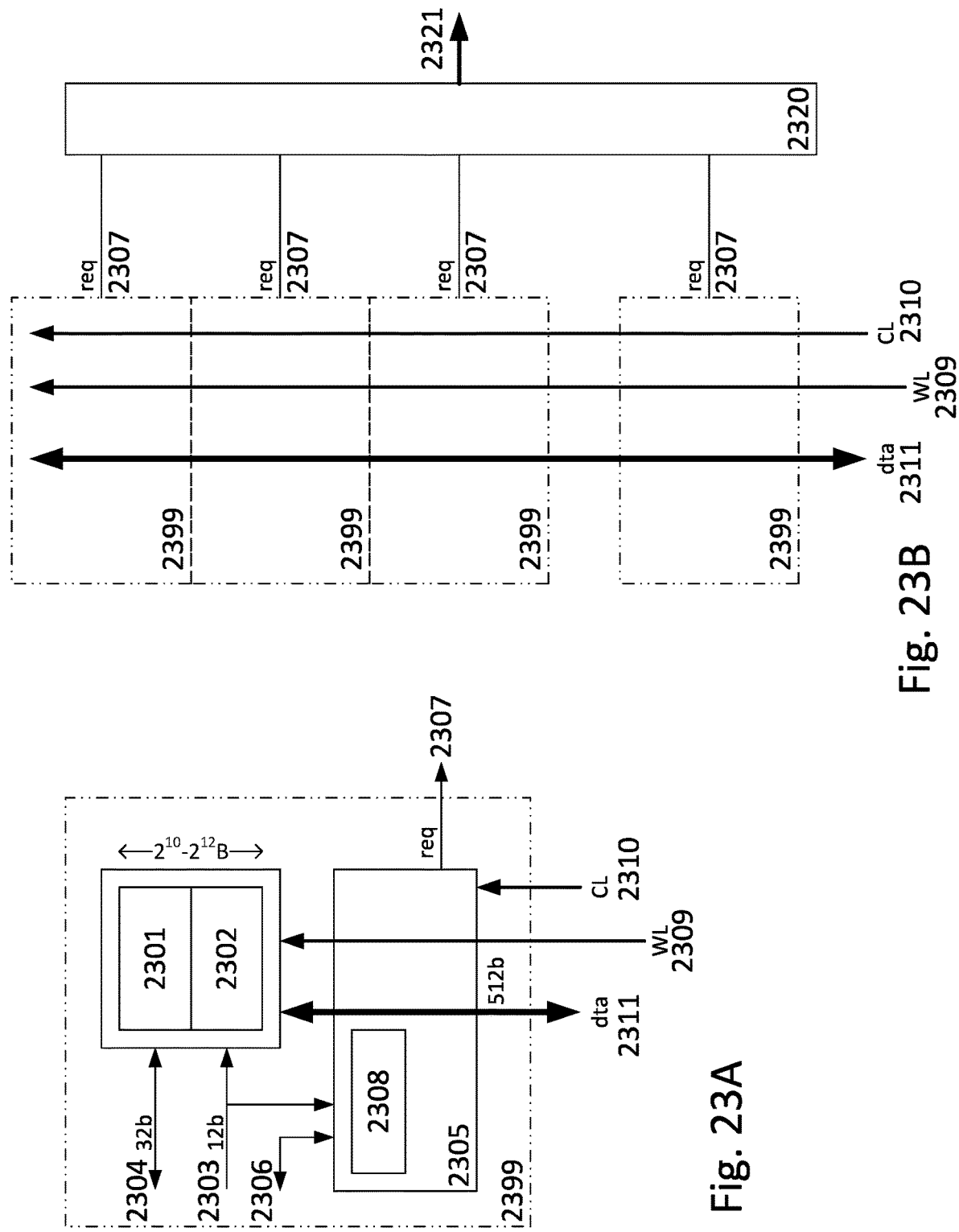

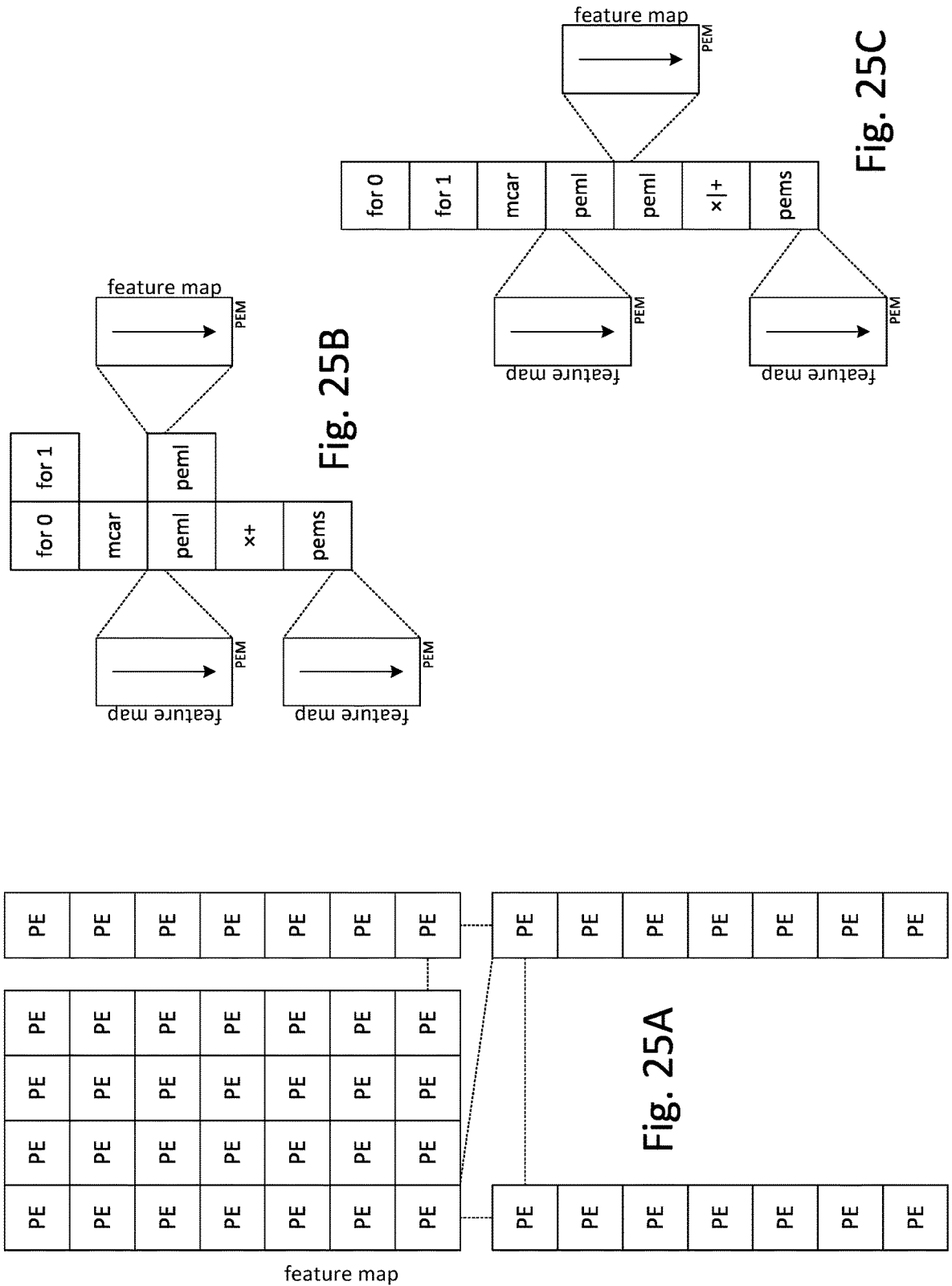

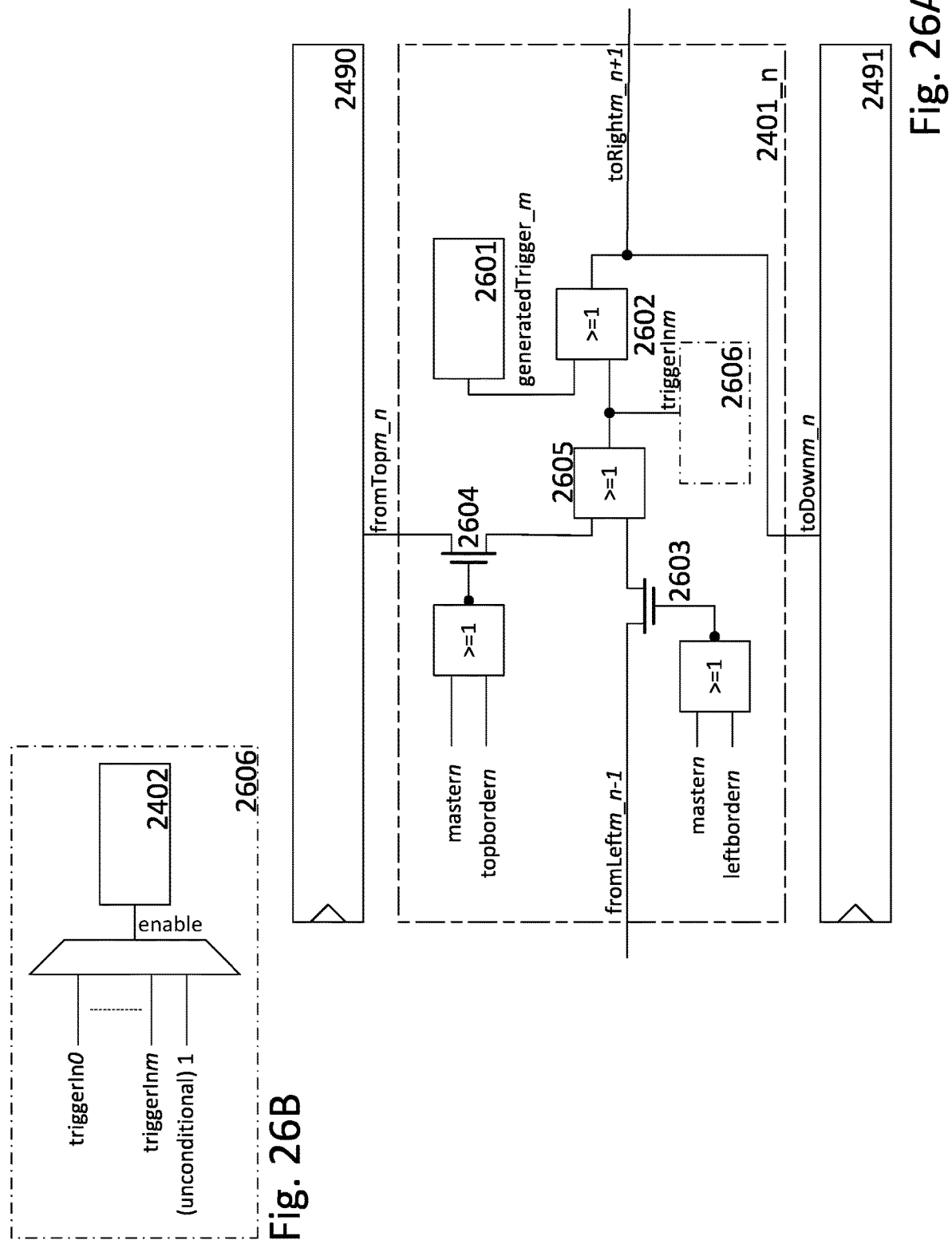

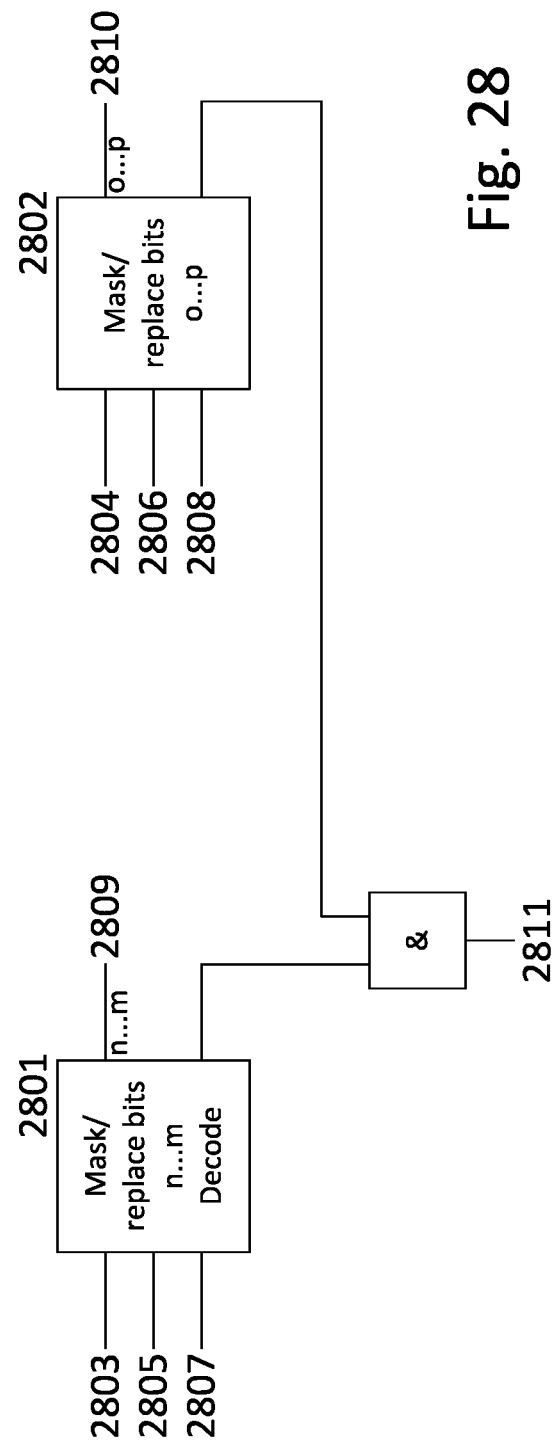

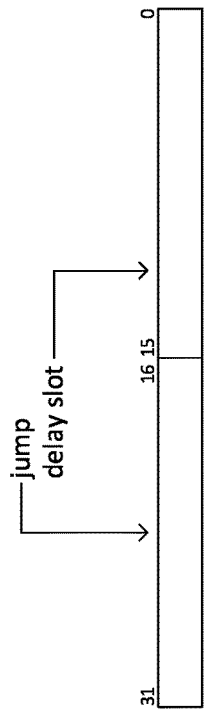
Fig. 32A
Fig. 32B
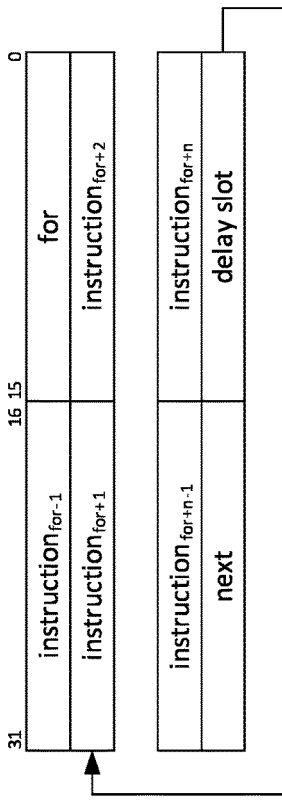
Fig. 32C
Fig. 32D
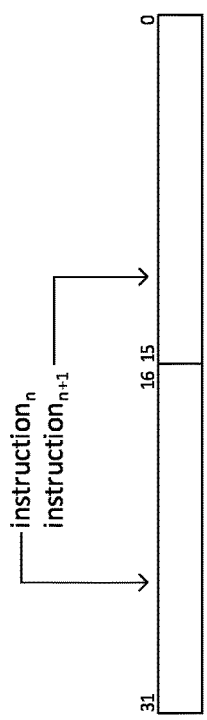
Fig. 32E

HIGH PERFORMANCE PROCESSOR

CROSS-REFERENCE TO PRIOR APPLICATIONS

The present application claims priority to:
EP 20020148.1 filed on Apr. 1, 2020, and
EP 20020206.7 filed on May 6, 2020; and the present application is a continuation-in-part of U.S. patent application Ser. No. 16/042,803, filed Jul. 23, 2018, which is a continuation of U.S. patent application Ser. No. 14/000,155, filed Nov. 7, 2013 (now U.S. Pat. No. 10,031,888), which claims priority to PCT/EP2012/000713, filed on Feb. 17, 2012, which claims priority to the following applications:
EP 11009913.2 filed on Dec. 16, 2011;
EP 11009912.4 filed on Dec. 16, 2011;
EP 11009911.6 filed on Dec. 16, 2011;
EP 11007370.7 filed on Sep. 9, 2011;
EP 11006698.2 filed on Aug. 16, 2011;
International Patent Application No. PCT/EP2011/003428 filed on Jul. 8, 2011;
EP 11005196.8 filed on Jun. 27, 2011;
EP 11004667.9 filed on Jun. 8, 2011;
EP 11004033.4 filed on May 16, 2011;
EP 11001305.9 filed on Feb. 17, 2011; and
EP 11001304.2 filed on Feb. 17, 2011,
the contents of all of which are all incorporated herein by reference in their entireties.

INTRODUCTION AND FIELD OF INVENTION

The present inventions relate to data processing in general and to data processing architecture in particular.

Energy efficient, high speed data processing is desirable for any processing device. This holds for all devices wherein data are processed such as cell phones, cameras, hand held computers, laptops, workstations, servers and so forth having different processing power.

Data processing generally is done according to software and often, the same kind of data processing needs to be effected on different devices. Since coding software is expensive, it is be desirable to have software which can be compiled to a large number of different platforms having different processing power.

It would be desirable to provide a data processing architecture that can be easily adapted to different processing powers needed while necessitating only minor adaptations to coded software.

BRIEF DESCRIPTION OF DRAWINGS

FIG. 10, including
FIGS. 10a, 10b, 10c, and 10d, is a diagrammatic illustration of an example implementation of microcode splitting and fusion on complex instruction set computer (CISC) instructions;
FIG. 11 is a diagrammatic illustration of an example dynamic random access memory (DRAM) of the prior art;
FIG. 23A is a block diagram of an example processing element memory;
FIG. 23B is a diagrammatic illustration of an arrangement of processing element memories in a column;
FIG. 25A is a diagrammatic illustration of an execution unit that includes an array of processing elements;
FIGS. 25B and 25C are diagrammatic illustrations of mappings of example code to processing elements;

FIG. 26A is a diagrammatic illustration of trigger logic for a processing element;

FIG. 26B is a diagrammatic illustration of an example implementation of enable logic of FIG. 26A;

FIG. 28 is a diagrammatic illustration of an X address decoder and a Y address decoder of a processing element;

FIGS. 32A-32E are diagrammatic illustrations of example formats and sequences of instructions for processing elements.

DETAILED DESCRIPTION

Figure 2:
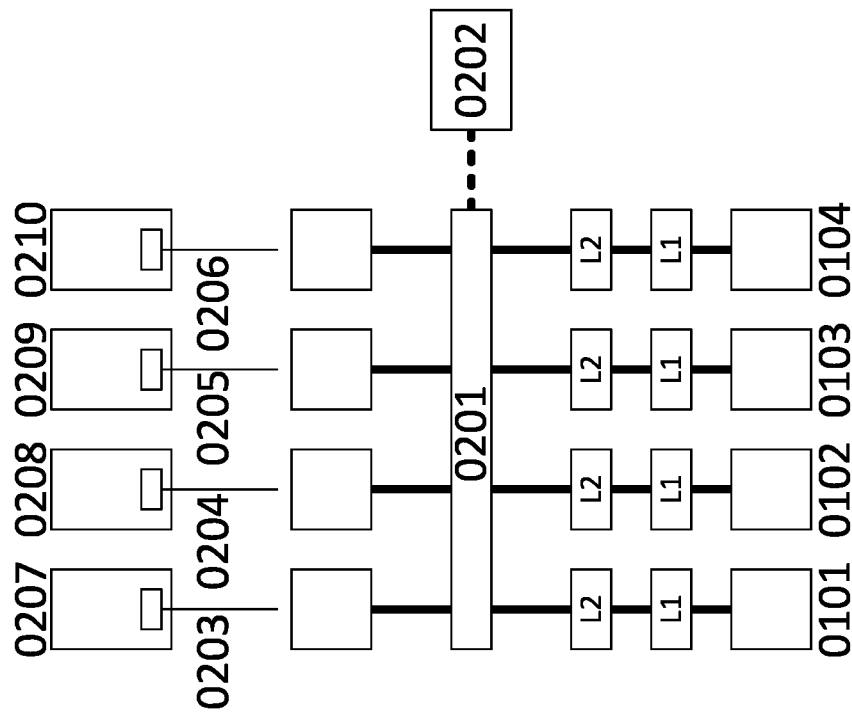
FIG. 2 is a diagrammatic illustration of an example multi-core processor memory architecture of the present disclosure.

Described features provide at least a partial improvement over the prior art of processing architectures with respect to at least one of data processing efficiency, power consumption and use of the same software coding.

The present disclosure describes a new processor architecture called ZZYX thereafter, overcoming the limitations of both, sequential processors and dataflow architectures, such as reconfigurable computing.

It shall be noted that whereas hereinafter, frequently terms such as "each" or "every" and the like are used when certain preferred properties of elements of the architecture and so forth are described, this is done so in view of the fact that generally, it will be highly preferred to have certain advantageous properties for each and every element of a group of similar elements. It will be obvious to the average skilled person however, that some if not all of the advantages of the features disclosed hereinafter might be obtainable, even if only to a lesser degree, if only some but not all similar elements of a group do have a particular property. Thus, the use of certain words such as "each", "any" "every" and so forth is intended to disclose a preferred mode and whereas it is considered feasible to limit any claim to only such preferred embodiments, it will be obvious that such limitations are not meant to restrict the scope of the disclosure to only the embodiments preferred. Also, it will be noted that frequently, embodiments are described in a manner that gives best results in implementation, for example because a plurality of advantageous features are described to be simultaneously present, although an embodiment still improved over the prior art glass preferred could be implemented by a person skilled in the yard without each and every advantageous feature described.

It shall also be noted that notwithstanding the fact that a completely new architecture is disclosed hereinafter, several aspects of the disclosure are considered inventive per se, even in cases where other advantageous aspects described hereinafter are not realized.

The architecture disclosed herein can be implemented e.g. in hardware as a single chip e.g. made from a single piece of semiconductor wafer material or as a system-on-a-chip comprising a plurality of pieces packaged together into a chip interconnected internally by additional connections such as those provided by interconnection layers.

The ZZYX processor comprises one or a plurality of ALU-Blocks. Each ALU-Block contains a plurality of multidimensionally arranged (e.g. in an array or cube) arithmetic (and/or logic) data processing elements (e.g. Arithmetic-Logic-Units, i.e. ALUs). The data processing elements in the ALU-Block might be all the same in a homogeneous arrangement. Yet, in some embodiments some of the data processing elements can be floating-point data processing elements, logic FPGAlike data processing elements, or any other programmable or fixedly implemented data processing function such that the ALU-Block can comprise a heterogeneous arrangement of data processing elements. Typically the function of each of the data processing elements is independently programmable by software instructions according to e.g. the executed application, task, thread and/or operating system.

The data processing elements are typically arranged in rows and columns. In some embodiments, pipeline stages are implemented between each row of ALU-Blocks. At least some of the data processing element may comprise additional internal pipeline stages. Example ALU-Blocks can be found in [1] (see end of this description for all referred references in brackets), e.g. FIGS. 4, 5, 6, 11, 27 and 27a or in [7], e.g. FIG. 1, 2, 3, 12; or [4], e.g. FIGS. 12, 15, 22; or and in particular [10], e.g. FIG. 1. In particular the entire specification of [10] is relevant of ALU-Block processing code out-of-order.

In contrast to reconfigurable processors data flows preferably in one direction only, in the following example embodiments from top to bottom. Each ALU may execute a different instruction on a different set of data, whereas the structure may be understood as a MIMD (Multiple Instruction, Multiple Data) machine. The array typically is a 2 dimensional array, but multidimensional arrays could also be implemented, for example using stacked chiplets; typically, in a multi-dimensional array, there will be more interconnections and/or faster interconnections within a chiplet, while between triplets, in particular between stacked chiplets or chiplets arranged side by side, the number of interconnections is smaller and/or interconnections are slower and/or latency is larger. Also, dataflow may be purely in one direction within a triplets or chip or a preferred direction of dataflow may be provided, meaning that only a smaller number of interconnections are provided for a backward transmission of data, for example of results, status signals and so forth, compared to a forward direction of data transmission; and/or that data transmission in a backward direction (backward relative to the preferred dataflow) only extends over a distance smaller than transmission allowed in a forward direction, in particular only within one ALU or ALU block; and/or that data transmission in a backward direction is slower and/or have a higher latency. Then, it would also be understood that despite the dataflow being preferred to go in only one direction, a forking and/or multiple forking of data paths to 2 or more recipients in a downstream direction may still be allowed. also, where a stacked arrangement is used, the preferred dataflow in one plane might go for example from left to right whereas in an adjacent plane of each adjacent plane, goes from right to left. In this manner, interconnections at the border of the chiplets could be used, although the average skilled person will understand that where interconnections between planes are provided in a more central area, it might be preferred if the preferred data flow leads away from such central area.

The ZZYX processor is optimized for loop execution. In contrast to traditional processors, instructions once issued to the ALUs may stay the same for a plurality of clock cycles, while multiple data words are streamed through the ALUs. Each of the multiple data words is processed based on the same temporarily fixed instructions. After a plurality of clock cycles, e.g. when the loop has terminated, the operation continues with one or a set of newly fetched, decoded and issued instructions.

The ZZYX processor provides sequential VLIW-like processing combined with superior dataflow and data stream processing capabilities. The ZZYX processor cores are scalable in at least 3 ways:
1. The number of ALUs can be scaled at least two dimensionally according to the required processing performance; the term multi-dimensional is to refer to "more than one dimension". It should be noted that stacking several planes will lead to a three dimensional arrangement;
2. the amount of Load/Store units and/or Local Memory Blocks is scalable according to the data bandwidth required by the application;
3. the number of ZZYX cores per chip is scalable at least one dimensionally, preferably two or more dimensionally, according to the product and market. Low cost and low power mobile products (such as mobile phones, PDAs, cameras, camcorders and mobile games) may comprise only one or a very small amount of ZZYX cores, while high end consumer products (such as Home PCs, HD Settop Boxes, Home Servers, and gaming consoles) may have tens of ZZYX cores or more.
   High end applications, such as HPC (high performance computing) systems, accelerators, servers, network infrastructure and high and graphics may comprise a very large number of interconnected ZZYX cores, such as at least 100, at least 200, at least 500 or at least 1000 cores.

The ALUs within an ALU Block are also called Processing Elements (PEs). The functionality of Processing Elements is in no way limited by the term ALU. PEs may comprise more complex functions such as floating point, calculation of Taylor series, and in the most complex extend even complete processors or controllers.

An ALU Block is also called an Execution Unit, as it is virtually forming an Execution Unit resource of a processor.

As is known from previous applications of the applicant and/or will become obvious hereinafter, a major benefit of the ZZYX processor concept is the implicit software scalability. Software written for a specific ZZYX processor will run on a single processor as well as on a multi-processor arrangement or a multicore processor arrangement without modification as will be obvious from the text following hereinafter. Thus, the software scales automatically according to the processor platform it is executed on.

The concepts of the ZZYX processor are applicable on traditional processors, multithreaded processors and/or multi-core processors. A traditional processor is understood as any kind of processor, which may be a microprocessor, such as an AMD Phenom, Intel Pentium or Xeon, IBM's and Sony's CELL processor, ARM, Tensilica or ARC; but also DSPs such as the C64 family from TI, 3DSP, Starcore, or the Blackfin from Analog Devices.

The concepts disclosed are also applicable on reconfigurable processors, such as SiliconHive, IMEC's ADRES, the DRP from NEC, Stretch, or IPFlex; or multi-processors systems such as Picochip or Tilera. Most of the concepts, especially the memory hierarchy, local memories elements, and Instruction Fetch units as well as the basic processor model can be used in FPGAs, either by configuring the according mechanisms into the FPGAs or by implementing according hardwired elements fixedly into the silicon chip. FPGAs are known as Field Programmable Gate Arrays, well known from various suppliers such as XILINX (e.g. the Virtex or Spartan families), Altera, or Lattice.

The concepts of the ZZYX processor are particularly well applicable on stream processors, graphics processors (GPU) as for example known from NVidia (e.g. GeForce), ATI/AMD and Intel (e.g. Larrabee), and especially General Purpose Graphics Processors (GPGPU) also know from NVidia, ATI/AMD and Intel.

ZZYX processors may operate stand alone, or integrated partially, or as a core into traditional processors or FPGAs; it is noted that any such FPGA integrating a ZZYX processor as disclosed hereinafter will be or have coarse granular elements. While a ZZYX processor may operate as a co-processor or thread resource connected to a processor (which may be a microprocessor or DSP), it may be integrated into FPGAs as processing device. FPGAs may integrate just one ZZYX core or multiple ZZYX cores arranged in a horizontal or vertical strip or as a multi-dimensional matrix.

All described embodiments are examples and solely for the purpose of outlining the inventive apparatuses and/or methods. Different described aspects and features can be implemented or combined in various ways and/or within or together with a variety of other apparatuses and/or methods.

Sequential processors are well known. For years, deep pipelined ALU paths have been in use. Instructions are issued to the pipelined ALU, enabling the execution of multiple subsequent instructions within the pipelined ALU path, operating on different sets of data. Classically, only one pipelined ALU is implemented. In modern (VLIW/multi-thread/superscalar) processors, multiple ALUs are integrated, yet each of them works independently only connected through the Register File.

Also known are SIMD architectures, where Multiple Data is processed by multiple ALUs executing one Single Instruction (Single Instruction Multiple Data).

The structure of the ZZYX processor comprises Multiple ALU-Blocks, preferably in an array, where the ALUs operate pipelined with either a) each executing the same instruction or b) at least some execute different instructions, on either a) different sets of data or b) the same set of data. The ZZYX processor is regarded as a new and inventive kind of multi-core processor. Furthermore the Instruction Issue to multiple ALUs in a pipelined manner, such enabling a column of ALUs or even an array of ALUs to operate pipelined without empty slots (bubbles), is regarded novel.

Particularly reference is made to following related patent applications: [1], [2], [3], [4], [5], [6], [7], [10], and [15].

The patents listed above are fully incorporated by reference herein in their entireties for detailed disclosure.

In some embodiments, a typical ZZYX processor comprises an Execution Unit (EXU) (formerly called ALU Block) containing an array of (Data) Processing Elements (PEs) (formerly called ALUs). In a typical embodiment the array is a fully populated (i.e. a (Data) Processing Element (PE) is located at each position in the array) arrangement of equal (or, in some embodiments, almost equal) (Data) Processing Elements. Each (Data) Processing Element is capable of processing at least a joint instruction set. Or in other words each of the (Data) Processing Elements in the array has the capability to process at least a joint set of common instructions. In some embodiments, the Processing Elements have at least a scalar instruction set. Each Processing Element is supplied with and capable of performing scalar instructions. Yet, some PEs might be specialized. For example division or square root are rarely required functions. It would be inefficient to implement such features in each PE. Thus only some PEs might have the capability to process rarely required instructions (e.g. division and/or square root). The front end detects respective instructions and selects respective PEs and issues the instructions to them for execution.

Consequently, in some embodiments, some Processing Elements might be able to perform additional functions and/or instructions beyond the capabilities of the majority of Processing Elements.

In some embodiments a small subset of Processing Elements might have a special instructions set performing special operations. In some embodiments those special instruction set Processing Elements might not be able to process the joint instruction set (or only process a very small subset) which the majority of Processing Elements are capable of processing. In some embodiments the ratio between the special instruction set Processing Elements and the majority of Processing Elements is approximately 32:1. In other embodiments the ratio might be approximately 8:1. In yet other embodiments the ratio might be as low as approximately 2:1.

In other words a ZZYX processor comprises a largely homogeneous array of Processing Elements each of them capable of processing a largely identical set of instructions. While in some embodiments VLIW and/or SIMD instructions may combine the instructions for multiple PEs into a single instruction word, most embodiments will instruct each PE with a dedicated scalar instruction. Particularly the instruction for each PE in horizontal and/or vertical direction may differ in contrast to pure SIMD processing. Particularly the instruction for each PE in horizontal and/or vertical direction may be independently generated and scheduled by the compiler, and further independently scheduled by the processor front end, in contrast to VLIW instructions.

While (at least some of) the features are described on basis of a latency tolerant processor, e.g. for servers, particularly analytics servers, it shall be expressively noted that described features are applicable on all kind of data processors, for example the above mentioned CPUs, GPUs, GPGPUs, and FPGAs.

All described embodiments are examples and solely for the purpose of outlining the inventive apparatuses and/or methods. One skilled in the art, however, will understand that the described implementations may have additional variations, or may be practiced without several of the details or in conjunction with slightly different details or amendments described in the following description. Different aspects of described implementations can be implemented or combined in various ways and/or within or together with a variety of other apparatuses and/or methods.

System Architecture

A typical processor core currently operates at clock frequencies between 2 GHz and about 4 GHz, resulting in a cycle time of 500 ps down to 250 ps. Large flash memories operate at latencies in the range of 10 μs and it is expected that the latencies even increase in the near future to approx. 20 μs. On that basis, read access times of flash memories are in the range of 20000 to 80000 clock cycles.

The traditional approach for hiding latency is to switch to another task. This works reasonably well for peripheral accesses which are very slow and happen relatively infrequently. But the case of analytics processors flash memory shall be used instead of peripheral disks to increase the system performance. In fact flash should replace DRAM and by such fast access times are required. Switching context to another task (or thread) is too time consuming. Simultaneous multi-threading is also no solution to the problem: Hundreds, if not thousands, of tasks have to run simultaneously on a respective processor core, but today's simultaneous multithread (SMT) processors switch between two (or only a very few) tasks.

Assuming a data structure loaded from memory is about 1 KB large. Further it is assumed that for typical algorithms in average 100 to 1000 clock cycles (active processing time, APT) are required to process the loaded data structure. Thereafter new data must be loaded from memory.

Consequently, during the time a first task is blocked for 20000 to 80000 clock cycles for reading data from memory, 20 to 800 other tasks (than the first one) could be processed until the data for the first task becomes available from memory. Averaging this number again, a processor system managing 400 tasks is required.

As before said, in the prior art task switches are used to hide latency. On a server, enough tasks would be available, but the effort for a task switch easily is in the range of hundreds to thousands of clock cycles. The overhead for task switching is far too high compared to the active processing time (APT) of 100 to 1000 clock cycles.

Figure 14:
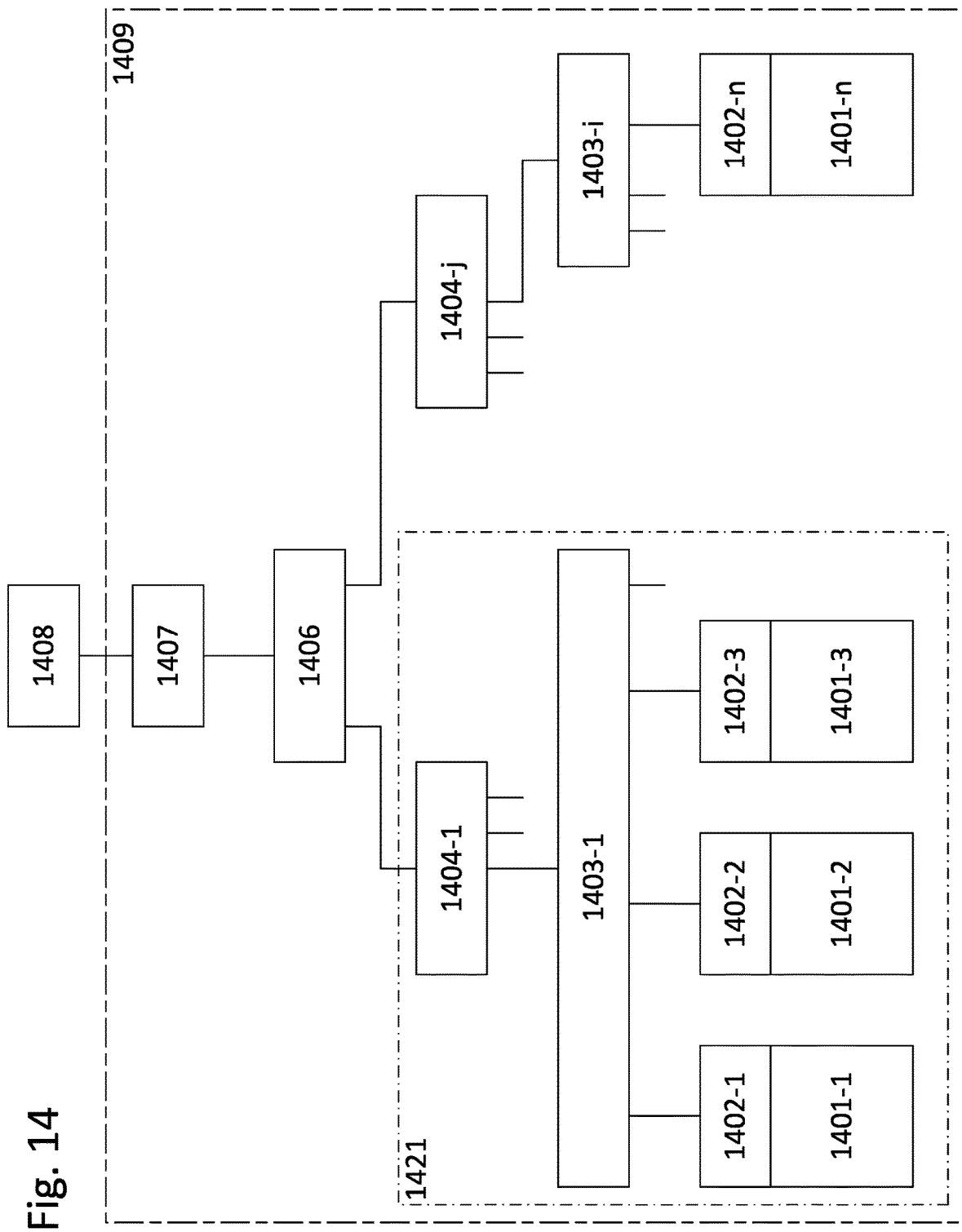
FIG. 14 is a diagrammatic illustration of a basic system architecture including processor cores and interconnected tree structure.

The overhead for task switching is avoided in processor architectures providing intrinsic thread switching capabilities (e.g. Simultaneous multithreading, SMT). For that at least a duplicated register file for each of the amount of simultaneously managed threads is required. Most modern processor architectures support 2 to 4 simultaneous threads. Beyond this amount the hardware overhead becomes unreasonably large. Considering all issues, in particular the system architecture, the following architecture has been developed:

System Architecture FIG. 14 shows the basic system architecture. A number of processor cores (1401-1 to 1401-n, with n typically in the range of 64 to 512) are implemented on a processor chip (1409). Via a tree structure the processor cores are connected to a database main memory (DBM, 1408) which holds the database. DBM might be implemented using DRAM or, preferably, using flash memories. Each processor core has a dedicatedly assigned Level-1 cache (1402-1 to 1402-n) for storing database data to minimize the penalty of the access time (i.e. latency) for the DBM.

The processor cores (1401) and Level-1 caches (1402) are connected to first level tree nodes (1403-1 to 1403-i). Each node manages and arbitrates data transfer from a subset of processor cores, e.g. 1403-1 manages the processor cores 1401-1, 1401-3, 1401-4, and (in this example) one more core, including their associated Level-1 caches. The nodes of the first tree level are connected to nodes of a second tree level (1404-1 to 1404-j), each of them managing a subset of the nodes of the first tree level. Ultimately a top level node (1406) manages all nodes below. It shall be expressively mentioned that the shown tree is an example embodiment. Depending on the number of processor cores on chip, the amount, frequency, pattern and/or type of data transfers in the tree network more or less nodes and tree levels can be implemented.

It shall be further mentioned, that nodes can be limited to an arbiter functionality merely selecting one of the plurality of data channels for transfer. In other embodiments the node may comprise lookup-tables and/or directories and/or cache structures for locating and/or storing/caching data in the tree structure.

In particular reference is made to [2]. The tree structures described in [2] are further example embodiments for tree structures suitable for these implementations.

A memory controller (1407) is connected to the highest level node (1406). Depending on the type of main database memory (DBM) it might be for example a DRAM controller or flash memory controller.

The structure of FIG. 14 contains a number of issues, for example it does not scale well. The tree gets deeper with each core of an increasing number of cores and might get too deep at some point. Naturally the number of edges (or branches) can increase to reduce the depth of the tree, yet there is always design effort required to make respective modifications. Respectively scaling the number of leaves (processor cores) may lead to considerable design effort.

Figure 15:
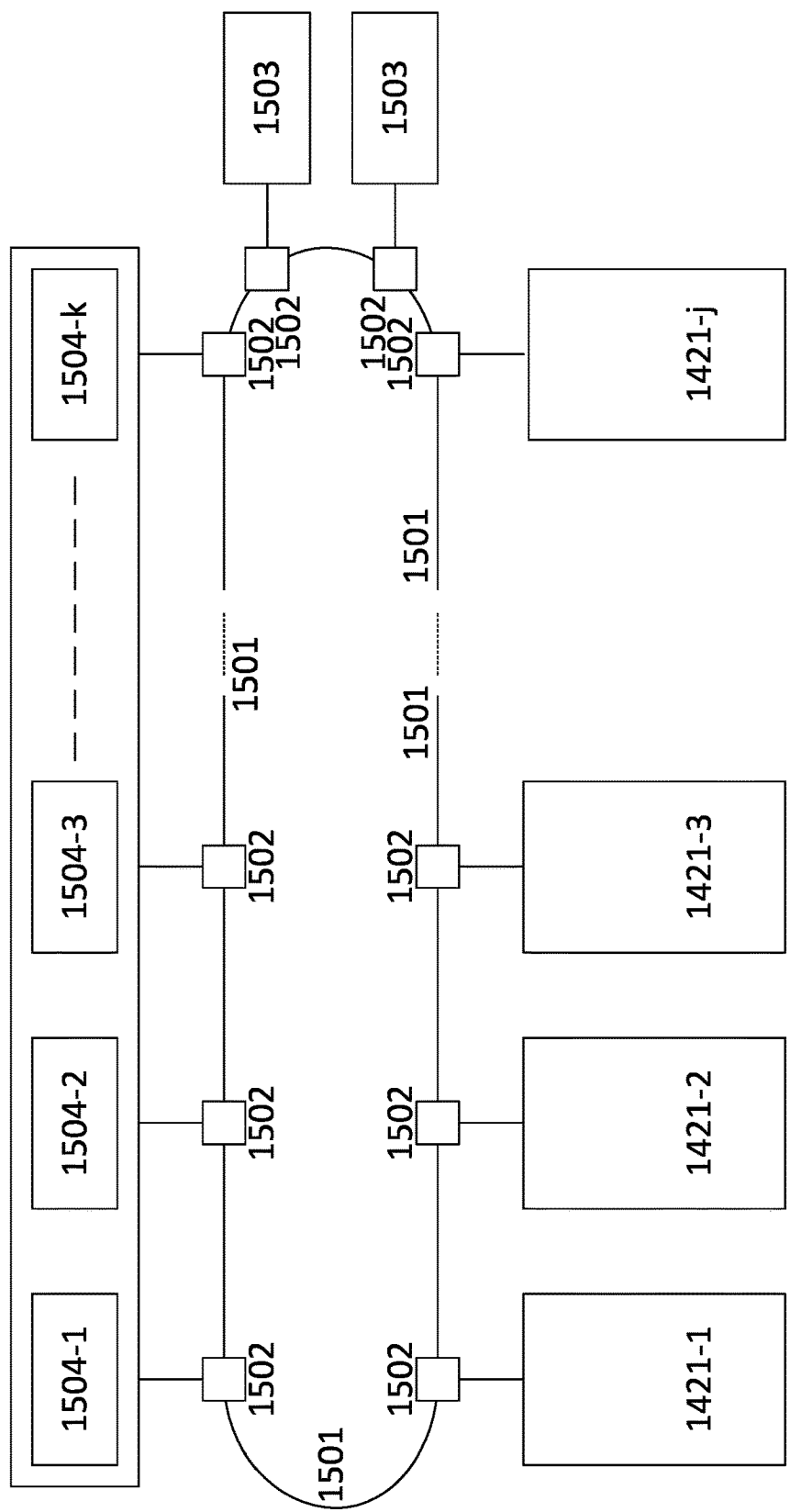
FIG. 15 is a diagrammatic illustration of an example implementation in which processor cores are interconnected by a tree structure forming slices of sub-trees.

FIG. 15 shows one preferred implementation. Processor cores are interconnected by a tree structure forming slices of sub-trees. For this example the sub-tree (or slice) 1421 of FIG. 14 is used. It shall be explicitly mentioned, that 1421 is an example embodiment. For example, the depth of the tree, the edges per nodes, the number of nodes and processors might differ between implementations. Yet, preferably a minimum tree depth of 3 (one leaf (processor core) level plus 2 levels of nodes) appears reasonable.

The slices are connected to either a linear bus structure or a ring bus structure via bus nodes (1502). Shown in FIG. 15 is a ring bus (1501) structure. The ring bus structure is segmented such that each between each of two adjacent nodes an independent segment exists which is controlled and arbitrated for data transmission independent of the other segments. In particular all segments can independently transmit different data for different pairs of senders and receivers. Connected to the bus structure is also a preferably segmented high level cache (1503), whereas preferably each segment (1504-1 to 1504-k) has its specific bus node (1502). The overall address range and data content of the high level cache (1503) is distributed over all segments, so that each segment holds a specific and exclusive subset of the data. The respective structures are known in the prior art. Particular reference is made to the patents [11], [12], [13], 14] of the same inventor, herewith incorporated by reference. Further such structures are well known from Intel's Ringbus architecture in Sandybridge and later processors. The bus structure further connects to a number of periphery and/or memory controllers (e.g. 1503), which might be inserted anywhere into the bus structure, in some cases (and with difference to FIG. 15) at opposite ends.

Overclocking

In a system comprising a large amount of processor cores of which each specific single one may operate only sporadically due to waiting for data, the cores might be significantly over-clocked for the time period of operation. For overclocking a core, its specific power supply voltage is increased. While operating at a high clock frequency the specific region of the silicon die (meaning the area including the area operating at a high clock frequency as well as some of the adjacent areas) will heat up. Yet, as soon as operating stalls due to another couple of (possibly hundreds to thousands of clock cycles) the region will cool down again. Heat sensors are implemented to measure the heat build-up for each specific region. If a regions thermal budget is exceeded, the specific region is clocked down. Regions within a vicinity can be grouped into islands, which are in addition regarded as a whole. Exceeding an islands power budget will lead to downclocking of the whole island and/or to restricting overclocking. The grouping can be hierarchical, so that in the end the whole processor chip is clocked down in case its thermal budget is exceeded.

Effects of the Tree Structure on the Operating System

One of the major benefits of the tree structure is the capability to efficiently cache and share data for and between processor cores being leaves of a respective node comprising the cache. If a node does not comprise a full cache it might comprise at least a directory to find the respective data in a cache either below or above. Respective tree structures are described in [2] and further the patents [8] and [9] of the same inventor, herewith fully incorporated by reference. Preferably the Operating System schedules tasks and/or threads with a joint set of data for processors in a close vicinity, so that the processors share nodes and caches within the tree structure at the lowest possible level. This decreases the access times, optimizes coherence protocols and avoids bandwidth congestions.

In some embodiments, the Operating System has access to the nodes of the tree and bus structure such that the nodes can report the data usage and traffic back to the operating system. The reports may include which processor(s) are accessing which data sets and/or caches. Based on the traffic information, the operating system can optimally schedule (at least over time) threads and task for specific cores.

Register File Optimization

As discussed before, switching between many tasks (or threads) solves the latency problem. Tasks (or threads) are started, as soon as they stall due to missing data execution is switched to another task which operand data is available, until this stalls. In the end, many tasks, for example a couple of 10 to a couple of 100, are in flight. The ones which have all operands available are processed, the others idle. The instruction per cycle rate (IPC) per task is still low, but the overall IPC is high, given that switching between tasks can be performed fast enough.

Switching tasks (or threads) fast precludes operating system or software based switching. Software controlled task switches may take hundreds to thousands of clock cycles.

A major issue for efficiently switching between multiple threads or tasks is the processor's register file. Naturally the register content is related to each specific thread (or task) and such by changing threads, the register content of the stopped and to be evicted thread (or task) must be saved and the one of the to be started thread has to be restored. Processors with Simultaneous Multithreading (SMT) capabilities, such as for example Intel's i7 and Xeon series, typically use duplicated physical register files. So each thread has its own register file inside the processor. This is expensive and limits the number of simultaneous threads (or tasks), typically to 2 threads per processor. The problem exists regardless of the processor architecture (e.g. AMD, ARM, Intel, IBM, Hyperion ZZYX, etc).

Register File Eviction

The following inventive architecture is driven by the consideration that taking the memory and/or peripheral latency into consideration some additional latency for switching the register file is acceptable as long as it is in the range of a couple of clock cycles. Based on this consideration the Register File (RF) could be spilled (offloaded) to a high performance low access time memory, such as a cache. In some embodiments, the level-1 cache could be used. Yet its latency might be still considerable and furthermore, cache pollution might become an issue. If the respective sections in the cache have been replaced and by such offloaded to level-2 or even higher levels of the memory hierarchy switching to another thread might become expensive (in terms of clock cycles). Thus, in some embodiments a separated level-0 or thread-cache is used. It is separate from the level-1 data and/or instruction cache and just holds processor core internal data, such as register file, status, in some embodiments branch history and/or the Register Allocation Table or Register Alias Table (RAT). The level-0 cache can be implemented as a tightly coupled high-bandwidth and low-latency cache. Details are subsequently discussed. The level-0 cache is preferably connected to either the level-1 data cache or the level-2 cache. This allows replacing data in the cache in case the number of threads (or tasks) is very high.

It shall be noted that the Program Pointer (PP) might be and preferably is treated like a register of the Register File and might therefore be respectively evicted.

Figure 16:
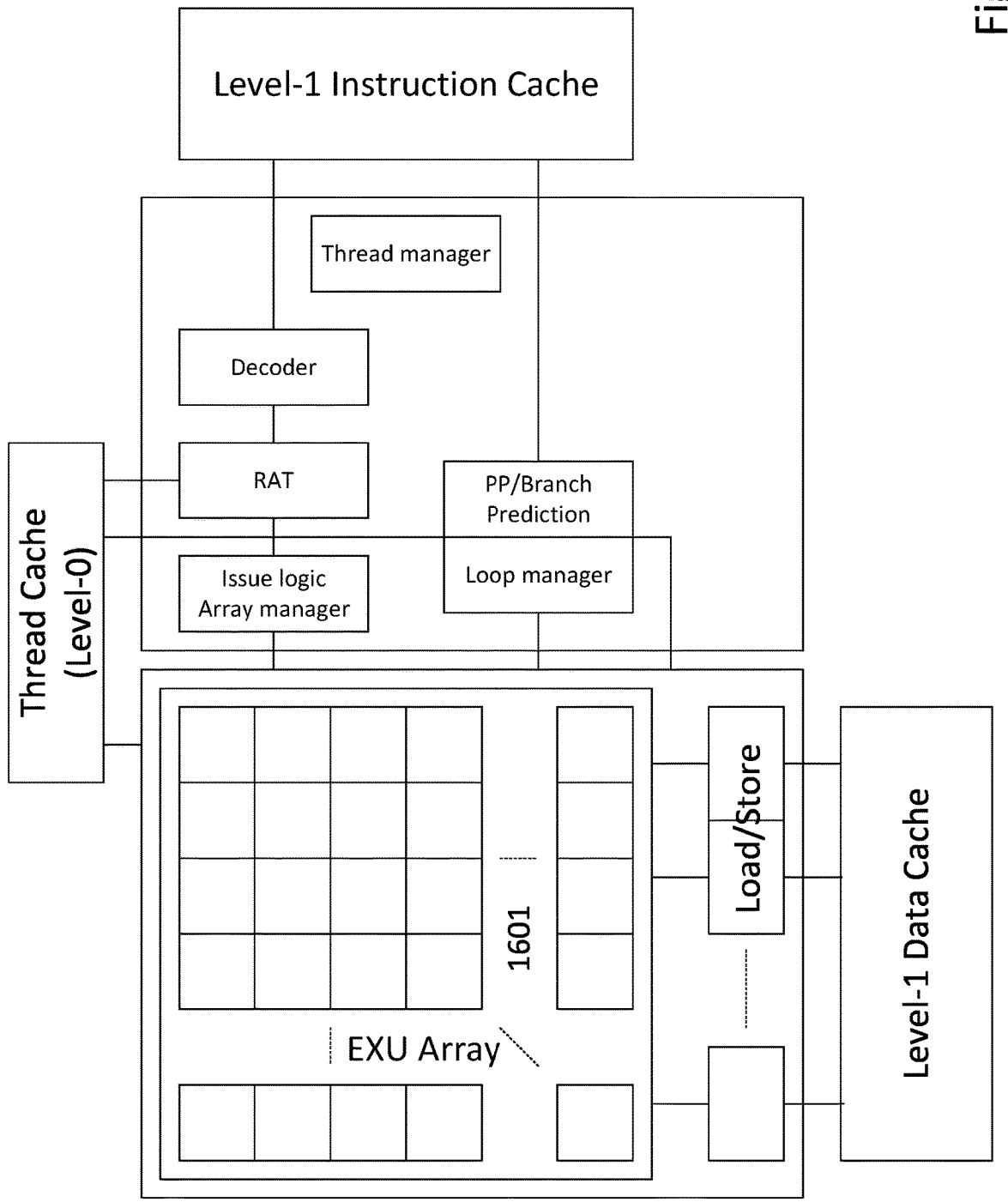
FIG. 16 is a diagrammatic illustration of an example architecture based on a processor.

An example architecture based on the ZZYX processor is shown in FIG. 16.

Out-of-Order Processors/Register Alias Table

Some processor architectures, in particular out-of-order processors require a Register Allocation Table or Register Alias Table (RAT) referencing the register indicated by the instruction to an actual physical register in the processor hardware. This allows for example the extension of the physical register file beyond the capabilities of the Instruction Set Architecture (particularly Intel or AMD processors increase by such the rather tiny logical register set). In Hyperion processors the RAT might, in addition, reference to an element within the Array (e.g. ALU Block) of execution units. The reference might indicate in which register of an execution unit the respective data is stored.

For Hyperion processors the RAT might point to
1. A register located in the Array of execution units, particularly to a specific execution unit.
2. A register located in the Register File, if a Register File is implemented. Note: Hyperion processors do not require a dedicated Register File (reference is made to [15]).
3. And, according to described features and depending on the management of the level-0 cache, to a location in the level-0 memory where an evicted register is stored.

Processors, according to described implementations, executing hundreds of threads simultaneously require a respectively large enough RAT, to store the register reference for each of the threads. Consequently a large table is required in hardware which not only increases hardware cost, but also access time and power dissipation. Thus, according to some implementations, the RAT can be evicted, such as the Register File, to an external memory (e.g. level-1 or level-0/thread cache).

Eviction Strategy

Either single registers and RAT entries might be evicted or all RAT entries and registers of a thread jointly together. The eviction strategy might depend on the Thread Manager described below.

Two basic approaches might be used, either exclusively or in combination:
1. Each RAT entry comprises an eviction counter (e.g. 1709 of FIG. 17) counting up with each clock cycle. If the counter overflows, an overflow flag is set to shorten the counter width. When a RAT entry is used, e.g. for referencing to a specific register, the respective counter and its overflow flag is reset. If a thread switch occurs or a new thread is started and RAT and Register File entries must be freed, the ones with the overflow flag set are evicted; if no overflow flag is set, the ones with the highest counter value are evicted.
2. When a thread executes a load instruction, it receives information relating to or explicitly about the expected latency. For example the Memory Management Unit (MMU) might have entries in the TLB structure indicating the type, distance, and/or latency of the accessed source.

In an advanced version this might be combined with hit/miss information from the nearest caches. In case a long latency is reported (e.g. a far away memory or a memory with a long latency is accessed and (if implemented) a cache miss occurred), the thread might be stopped and the RAT and Register File of that thread are evicted.

Figure 17:
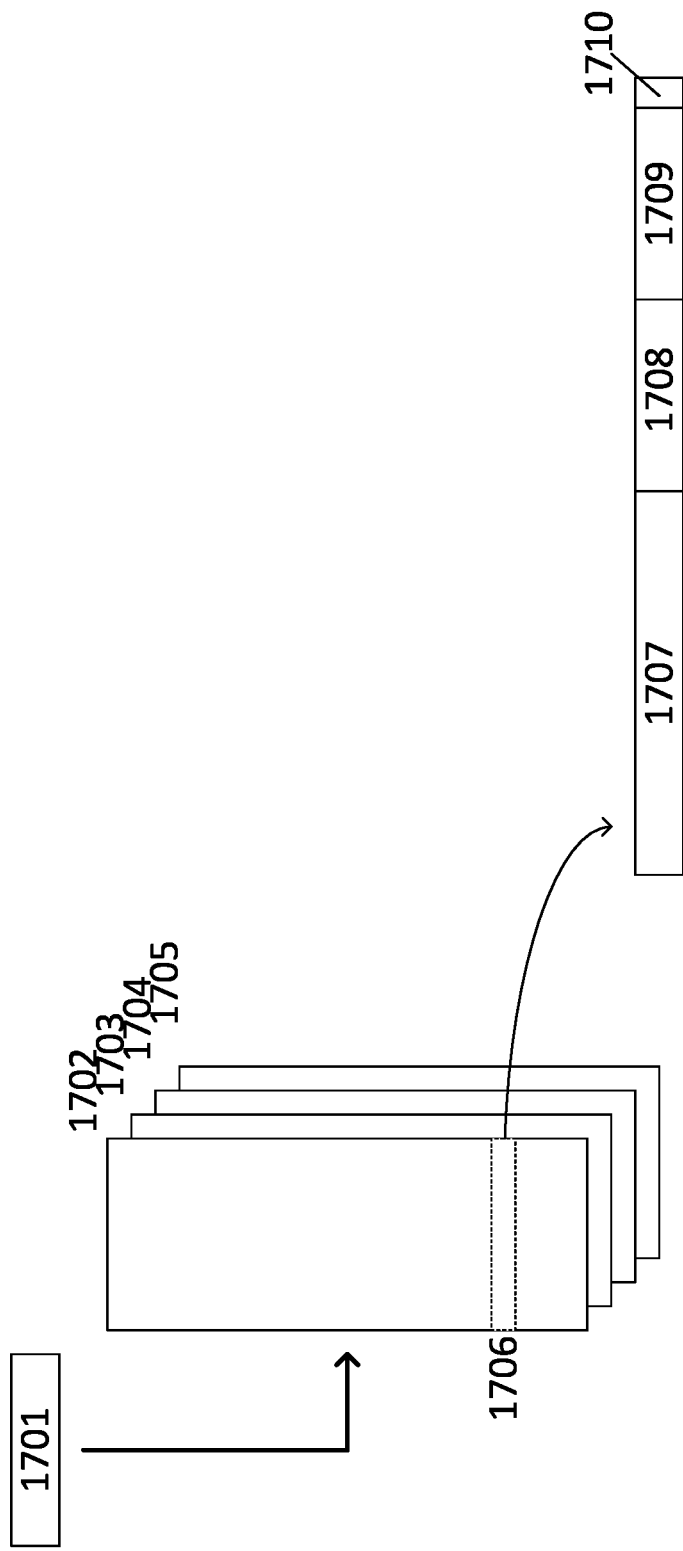
FIG. 17 is a diagrammatic illustration of an example register alias table (RAT) structure.

In other words, the eviction might be driven by one or more of the at least the following factors:
1. Last recently active thread;
2. Stalled by memory or peripheral access, if so
    a) Expected latency/duration of the stall, e.g. DRAM access, flash memory access, database access RAT Details FIG. 17 shows an example embodiment of a RAT structure. Shown are 4 associative RAT tables, allowing for 4 threads being simultaneously processed, while more are evicted to memory (e.g. level-0 cache). 4 to 8 might be a reasonable number for standard processors (such as e.g. Intel, AMD or ARM); typical Hyperion based processors might have 16-32 associative RAT tables.

The register identifier (1701) from the instruction references to a location in each of the n-tables (for example 1702, 1703, 1704, 1705). Each table has an entry for each logical register of the Instruction Set Architecture. For example entry 1706 contains the reference (1707) to the actual location of the register, the thread-ID (TID) (1708) of the thread the entry belongs to. Further it contains the eviction counter (1709) and its overflow flag (0410). To that respect the RAT is not a simple memory table, but contains active logic (the eviction counter) for each entry.

Since the RAT structure is associative, the correct set has to be selected by comparing the TID of each selected entry of each set with the TID of the register identifier's instruction. Finally the entry of the set with the matching TID is selected.

If no TID matches the thread is either new or has previously been evicted. In the first case one thread has to be evicted to memory (e.g. level-0 cache) and an empty RAT/Register File structure is created. In the latter one thread has to be evicted to memory (e.g. level-0 cache) and the respective thread must be loaded from memory (e.g. level-0 cache)

Evicting Execution Units of the Array

In an advanced implementation Hyperion architecture based processors might evict Execution Units inside the Array. Reference is made to [15] which is embodied in its entirety by reference. The Hyperion architecture provides out-of-order processing capabilities in a way that instructions are issued to Execution Units in the Array of Execution Units (e.g. 1601 of FIG. 16). After an instruction has been received an Execution Units waits for all operand data to become available and then performs the operation according to the instruction. The Execution Unit is inactively waiting until all operand data are available. Details of this functionality can be found in [15], which are incorporated herein by reference.

In many thread processor architectures, the waiting units might pollute the Array in way that no more threads can be started, since all resources in the Array are blocked by waiting Execution Units.

In some embodiments, the content of Execution Units might be evicted to the memory (e.g. level-0 or level-1 cache). The content of an Execution Unit might be for example already present operands, the instruction and possibly an internal status.

The eviction frees resources in the Array of Execution Units (1601) for other threads.

If a once evicted thread is restored, simple embodiments might require that once evicted Execution Units are restored at exactly the same position. However, in even further advanced embodiments, the different Execution Units might be selected, e.g. according to the current availability. The references in the respective RAT are then accordingly amended during the process of restoring the evicted thread.

Task/Thread-Manager

A hardware thread manager unit (also known as the CPU scheduler) decides which of the ready, in-memory processes is to be executed (allocated a CPU) after a clock interrupt, an I/O interrupt, an operating system call or another form of signal. This scheduler can be preemptive, implying that it is capable of forcibly removing processes from a CPU when it decides to allocate that CPU to another process, or nonpreemptive (also known as "voluntary" or "co-operative"), in which case the scheduler is unable to "force" processes off the CPU.

A preemptive scheduler relies upon a programmable interval timer which invokes an interrupt handler that runs in kernel mode and implements the scheduling function.

Dispatcher

Another component that is involved in the CPU-scheduling function is the dispatcher, which is the module that gives control of the CPU to the process selected by the short-term scheduler. It receives control in kernel mode as the result of an interrupt or system call. The functions of a dispatcher involve the following:
 i) Context switches, in which the dispatcher saves the state (also known as context) of the process or thread that was previously running; the dispatcher then loads the initial or previously saved state of the new process.
 ii) Switching to user mode.
 iii) Jumping to the proper location in the user program to restart that program indicated by its new state.

The dispatcher should be as fast as possible, since it is invoked during every process switch. During the context switches, the processor is virtually idle for a fraction of time, thus unnecessary context switches should be avoided. The time it takes for the dispatcher to stop one process and start another is known as the dispatch latency.

It shall explicitly noted that in this description the terms "thread", "task", and "(software-)process" are used synonymously. The term shall refer to the code instances actually being processed by the processor.

The thread manager detects stalling threads and evicts them, in turn it detects threads ready for execution due to the availability of all operand data (i.e. the data from memory arrived).

The thread execution is monitored by the thread manager. For example the amount of finished instructions is monitored (reference is made to [15]), or memory access to high latency memories are detected (for example based on feedback from the Memory Management Unit (MMU) as described below). On that basis the thread manager decides which threads are stalled and evicts them (e.g. to level-0 cache).

Incoming data from memory or periphery is monitored in an input data buffer. If all or at least some outstanding data for a specific thread has arrived in the input data buffer, the thread manager might decide to schedule the respective thread for execution and load it again (e.g. from level-0 cache).

Memory Management Unit, Page Table and Translation Lookaside Buffer

In some embodiments, the Memory Management Unit (MMU) is enhanced such that it reports the type of memory accesses back to the processor core, preferably to the thread manager.

The type of memory access could be for example:
1. Type of memory and related latency, for example DRAM, SRAM, flash memory
2. Distance to the memory and expected transmission latency
3. Type and/or distance and/or latency to data storage means, such as disk or SSD drives.

The respective information are preferably stored in the page table. In accordance to the accessed page, the MMU delivers the data back to the processor core, in some embodiments to preferably to the thread manager.

As described before the eviction and thread switching strategies might depend on said information.

A page table is the data structure used by a virtual memory system in a computer operating system to store the mapping between virtual addresses and physical addresses. Virtual addresses are used by the accessing process, while physical addresses are used by the hardware, or more specifically, by the RAM subsystem.

In operating systems that use virtual memory, every process is given the impression that it is working with large, contiguous sections of memory. Physically, the memory of each process may be dispersed across different areas of physical memory, or may have been moved (paged out) to another storage, typically to a hard disk drive. one When a process requests access to data in its memory, it is the responsibility of the operating system to map the virtual address provided by the process to the physical address of the actual memory where that data is stored. The page table is where the operating system stores its mappings of virtual addresses to physical addresses, with each mapping also known as a page table entry (PTE).

The CPU's memory management unit (MMU) stores a cache of recently used mappings from the operating system's page table. This is called the translation lookaside buffer (TLB), which is an associative cache.

When a virtual address needs to be translated into a physical address, the TLB is searched first. If a match is found (a TLB hit), the physical address is returned and memory access can continue. However, if there is no match (called a TLB miss), the handler will typically look up the address mapping in the page table to see whether a mapping exists (a page walk). If one exists, it is written back to the TLB (this must be done, as the hardware accesses memory through the TLB in a virtual memory system), and the faulting instruction is restarted (this may happen in parallel as well). This subsequent translation will find a TLB hit, and the memory access will continue.

The simplest page table systems often maintain a frame table and a page table. The frame table holds information about which frames are mapped. In more advanced systems, the frame table can also hold information about which address space a page belongs to, statistics information, or other background information.

The page table holds the mapping between a virtual address of a page and the address of a physical frame. There is also auxiliary information about the page such as a present bit, a dirty or modified bit, address space or process ID information, amongst others.

Secondary storage, such as a hard disk, can be used to augment physical memory. Pages can be paged in and out of physical memory and the disk. The present bit can indicate what pages are currently present in physical memory or are on disk, and can indicate how to treat these different pages, i.e. whether to load a page from disk and page another page in physical memory out.

The dirty bit allows for a performance optimization. A page on disk that is paged in to physical memory, then read from, and subsequently paged out again does not need to be written back to disk, since the page has not changed. However, if the page was written to after it is paged in, its dirty bit will be set, indicating that the page must be written back to the backing store. This strategy requires that the backing store retain a copy of the page after it is paged in to memory. When a dirty bit is not used, the backing store need only be as large as the instantaneous total size of all paged-out pages at any moment. When a dirty bit is used, at all times some pages will exist in both physical memory and the backing store.

In operating systems that are not single address space operating systems, address space or process ID information is necessary so the virtual memory management system knows what pages to associate to what process. Two processes may use two identical virtual addresses for different purposes. The page table must supply different virtual memory mappings for the two processes. This can be done by assigning the two processes distinct address map identifiers, or by using process IDs. Associating process IDs with virtual memory pages can also aid in selection of pages to page out, as pages associated with inactive processes, particularly processes whose main code page have been paged out, are less likely to be needed immediately than pages belonging to active processes.

As an alternative to tagging page table entries with process-unique identifiers, the page table itself may occupy a different virtual-memory page for each process so that the page table becomes a part of the process context. In such an implementation, the process's page table can be paged out whenever the process is no longer resident in memory.

Executing a large number of threads on a processor core has impact on the MMU structure. Usually processors architectures tend to implement fast Translation Lookaside Buffers (TLB) which are located in fast memories or even preferably cached.

A translation lookaside buffer (TLB) is a cache that memory management hardware uses to improve virtual address translation speed. The majority of desktop, laptop, and server processors includes one or more TLBs in the memory management hardware, and it is nearly always present in any hardware that utilizes paged or segmented virtual memory.

The TLB is sometimes implemented as content-addressable memory (CAM). The CAM search key is the virtual address and the search result is a physical address. If the requested address is present in the TLB, the CAM search yields a match quickly and the retrieved physical address can be used to access memory. This is called a TLB hit. If the requested address is not in the TLB, it is a miss, and the translation proceeds by looking up the page table in a process called a page walk. The page walk requires a lot of time when compared to the processor speed, as it involves reading the contents of multiple memory locations and using them to compute the physical address. After the physical address is determined by the page walk, the virtual address to physical address mapping is entered into the TLB. The PowerPC™ 604, for example, has a two-way set-associative TLB for data loads and stores.

A translation lookaside buffer (TLB) has a fixed number of slots containing page table entries and segment table entries; page table entries map virtual addresses to physical addresses and intermediate table addresses, while segment table entries map virtual addresses to segment addresses, intermediate table addresses and page table addresses. The virtual memory is the memory space as seen from a process; this space is often split into pages of a fixed size (in paged memory), or less commonly into segments of variable sizes (in segmented memory). The page table, generally stored in main memory, keeps track of where the virtual pages are stored in the physical memory. The TLB is a cache of the page table, representing only a subset of the page table contents.

Referencing the physical memory addresses, a TLB may reside between the CPU and the CPU cache, between the CPU cache and primary storage memory, or between levels of a multi-level cache. The placement determines whether the cache uses physical or virtual addressing. If the cache is virtually addressed, requests are sent directly from the CPU to the cache, and the TLB is accessed only on a cache miss. If the cache is physically addressed, the CPU does a TLB lookup on every memory operation and the resulting physical address is sent to the cache.

In a Harvard architecture or hybrid thereof, a separate virtual address space or memory access hardware may exist for instructions and data. This can lead to distinct TLBs for each access type, an Instruction Translation Lookaside Buffer (ITLB) and a Data Translation Lookaside Buffer (DTLB). Various benefits have been demonstrated with separate data and instruction TLBs.

A common optimization for physically addressed caches is to perform the TLB lookup in parallel with the cache access. The low-order bits of any virtual address (e.g., in a virtual memory system having 4 KB pages, the lower 12 bits of the virtual address) represent the offset of the desired address within the page, and thus they do not change in the virtual-to-physical translation. During a cache access, two steps are performed: an index is used to find an entry in the cache's data store, and then the tags for the cache line found are compared. If the cache is structured in such a way that it can be indexed using only the bits that do not change in translation, the cache can perform its "index" operation while the TLB translates the upper bits of the address. Then, the translated address from the TLB is passed to the cache. The cache performs a tag comparison to determine if this access was a hit or miss. It is possible to perform the TLB lookup in parallel with the cache access even if the cache must be indexed using some bits that may change upon address translation; see the address translation section in the cache article for more details about virtual addressing as it pertains to caches and TLBs.

For processors managing many (possibly hundreds or more) threads TLBs become very expensive. If for each thread a TLB cache or memory is provided by the processor, the respective memories become very large, expensive and energy inefficient. Providing small TLB structures (caches and/or fast memories) inside the processor will require the loading (and possibly even off-loading) of the TLB for each thread switch. This is slow and inefficient. Particularly because for the given application a high thread switch frequency has to be expected.

On the other hand memory access latencies are high. Thus some amount of latency for the table lookup would be tolerable as the overall system performance is only minimally impacted. This is particularly true for the Array based Out-of-Order capabilities of Hyperion processors (see e.g. [15]). Based on this consideration, the inventive processor preferably comprises none or only a small cache structure for the address translation table. The major part of the address translation table resides in memory, preferably in a higher level cache, such as level-2 or level-3. Only frequent and/or recent translation might be cached either inside the level-1 cache or a small dedicated (TLB like) address translation table cache.

Branching and Branch History

A branch predictor tries to guess which way a branch (e.g. an if-then-else structure) will go before this is known for sure. The purpose of the branch predictor is to improve the flow in the instruction pipeline. Branch predictors play a critical role in achieving high effective performance in many modern pipelined microprocessor architectures such as x86. Two-way branching is usually implemented with a conditional jump instruction. A conditional jump can either be "not taken" and continue execution with the first branch of code which follows immediately after the conditional jump, or it can be "taken" and jump to a different place in program memory where the second branch of code is stored. It is not known for certain whether a conditional jump will be taken or not taken until the condition has been calculated and the conditional jump has passed the execution stage in the instruction pipeline.

Without branch prediction, the processor would have to wait until the conditional jump instruction has passed the execute stage before the next instruction can enter the fetch stage in the pipeline. The branch predictor attempts to avoid this waste of time by trying to guess whether the conditional jump is most likely to be taken or not taken. The branch that is guessed to be the most likely is then fetched and speculatively executed. If it is later detected that the guess was wrong then the speculatively executed or partially executed instructions are discarded and the pipeline starts over with the correct branch, incurring a delay.

The time that is wasted in case of a branch misprediction is equal to the number of stages in the pipeline from the fetch stage to the execute stage. Modern microprocessors tend to have quite long pipelines so that the misprediction delay is between 10 and 20 clock cycles. As a result, making a pipeline longer increases the need for a more advanced branch predictor.

The first time a conditional jump instruction is encountered, there is not much information to base a prediction on. But the branch predictor keeps records of whether branches are taken or not taken. When it encounters a conditional jump that has been seen several times before then it can base the prediction on the history. The branch predictor may, for example, recognize that the conditional jump is taken more often than not, or that it is taken every second time.

Branch prediction is not the same as branch target prediction. Branch prediction attempts to guess whether a conditional jump will be taken or not. Branch target prediction attempts to guess the target of a taken conditional or unconditional jump before it is computed by decoding and executing the instruction itself. Branch prediction and branch target prediction are often combined into the same circuitry.

Dynamic branch prediction requires the history for each conditional jump to determine the likelihood of the branch target address. Storing the history requires a memory location which can become very large if the processor handles hundreds or thousands of threads simultaneously. Again the nature of the application has to be considered: Most performance is lost due to memory latency. Thus it appears to be the best solution to abandon branch prediction. This is particularly true for Hyperion architecture based processors which have the capability to process loop (which contain the most performance critical conditional jumps) in a dedicated mode eliminating the conditional jump. In addition Hyperion based processors support branch predication allows each instruction to conditionally either perform an operation or do nothing. This is highly efficient for small branches and mostly eliminates the problem.

In some embodiments static prediction might be implemented which it does not rely on information about the dynamic history of code executing. Instead it predicts the outcome of a branch based solely on the branch instruction. Preferably branch prediction hints might be inserted into the code to tell whether the static prediction should be taken or not taken. The hint might be determined by the compiler, assembler or linker, for example based on a heuristic, test data sets during debugging and/or realistic data sets at runtime.

Branch prediction details on ZZYX processors are described in [15] and are fully incorporated by reference herein.

Divide and Conquer Branching

The large amount of execution resources within the Array allows for a novel branching technique.

A multi issue front end is capable of issuing multiple instructions per clock cycle. Typical as of today are 4 instruction issues per clock cycle. ZZYX processors capable of simultaneous multithreading comprise multiple instruction or program pointers, typically one for each thread.

The novel divide and conquer branching method splits the execution of the program at the position of the conditional jump. A first program pointer follows the program sequence without performing the jump, a second program pointer performs the jump and respectively follows the code at the jump target position.

Code is alternately fetched from each of the two program pointers and issued to the array. For each program pointer a specific, dedicated RAT is used. Usually the RAT in already in use before the conditional jump is used for one program pointer and, at the time of the split, a copy of that RAT is generated for being used by the second program pointer.

When it is ultimately determined whether the branch is taken or not, one of the two program pointers, its related RAT and all its used resources and generated data are dismissed. In other words, program execution follows both jump branches until it is determined which branch is actually taken.

The described method is useful for all types of ZZYX processors, particularly to the ones described in [1] to [7], [10] and [15]; its usability is not limited to the processor described in this patent.

Processing Element Memory

Modern algorithms, particularly for Artificial Intelligence applications, such as convolutional neural network (CNN) and deep neural network (DNN) require fast access to data, for example parameters and/or constants.

Accessing such data via the typical memory hierarchy through e.g. L1 and L2 caches is inefficient and causes high latencies. Furthermore many algorithms benefit from parallel access to a vast amount of such data (e.g. parameters and/or constants) which creates severe memory bandwidth issues.

One aspect of the described features is a local memory tightly connected to a Processing Element (e.g. an ALU) within an Execution Unit (e.g. the ALU Block). The aspect per se is regarded novel and inventive. Further combinations with any other aspect or any combinations of other aspects of the features described in this document are further regarded novel and inventive. In some embodiments, the Execution Unit is an arrangement of n×m Processing Elements in an array. However, other embodiments might use a single row (i.e. 1×m) of Processing Elements or even a single Processing Element. Particularly in view of 3-dimensional chip technologies such as chip stacks, other embodiments might comprise 3-dimensional (or even more-dimensional) arrangements of Processing Elements (PEs).

The described local memory is highly beneficial for accessing local data of an algorithm in multi-core processors, array processors, FPGA and the like. Bandwidth requirements of the memory hierarchy are significantly reduced. Also the cache miss rate is significantly lower and the cache eviction and/or load/reload rate is reduced. Those effects lead to a significant reduction of the power consumption.

The PE has direct access to its associated tightly coupled local memory. Direct access means that the access is low latency high bandwidth and in some embodiments without any disturbance by other PEs or elements. Consequently, in some embodiments, no other PE or element has any access to a specific PE's dedicated local memory. It shall be noted that in some embodiments however other elements and/or PEs may have access to a specific PE's dedicated local memory but, for example, only at a very low priority and/or bandwidth to cause only minimum impact on the communication between the specific PE and its dedicated local memory.

Thus the dedicated local memories are called PEMs (PE Memories).

In some embodiments, all PEs within an array of PEs (e.g. an Execution Unit) comprise PEMs, which in other embodiments only some of the PEs comprise PEMs.

In yet other embodiments, at least some PEs might comprise more than one PEM e.g. for supporting parallel high bandwidth access or hiding latency for (pre-)loading or offloading at least one of PEMs.

A PE Memory can operate in a variety of modes. The modes might be predetermined by chip design or architecture. In other embodiments the modes might be selectable at runtime. Particularly each of the PE Memories (PEMs) within an array might operate in a different mode.

In some embodiments and/or modes the PEM might contain solely read-only data. This allows for simple and highly efficient management of the content by the memory system and hierarchy. Once loaded no further consideration such as for example write-back, write-through and/or coherence is required. Read-only content can be simply erased or overwritten if no longer required.

In some embodiments and/or modes the PEM might contain scratch data which is only temporary required by the associated PE. The PE might read and write local scratch data. However the overall system has no view and/or access to this data and consequently similar to the above described read-only data no further consideration such as for example write-back, write-through and/or coherence is required. Read-only content can be simply erased or overwritten if no longer required.

In some embodiments and/or modes the PEM might contain data visible at the system level. Such data might be read/write data of the associated PE or data produced and solely written by the PE. In this case the content and/or address range of the PEM must be visible at a system level and further consideration for write-back, write-through and/or coherence is required. Depending on the system architecture the PEM and its content must be visible and/or addressed and/or monitored by the cache hierarchy and its controllers and/or the Memory Management Unit.

In some embodiments and/or modes the PEM might contain code for specifying a function or operation of the associated PE. Details are described hereafter.

Figure 18:
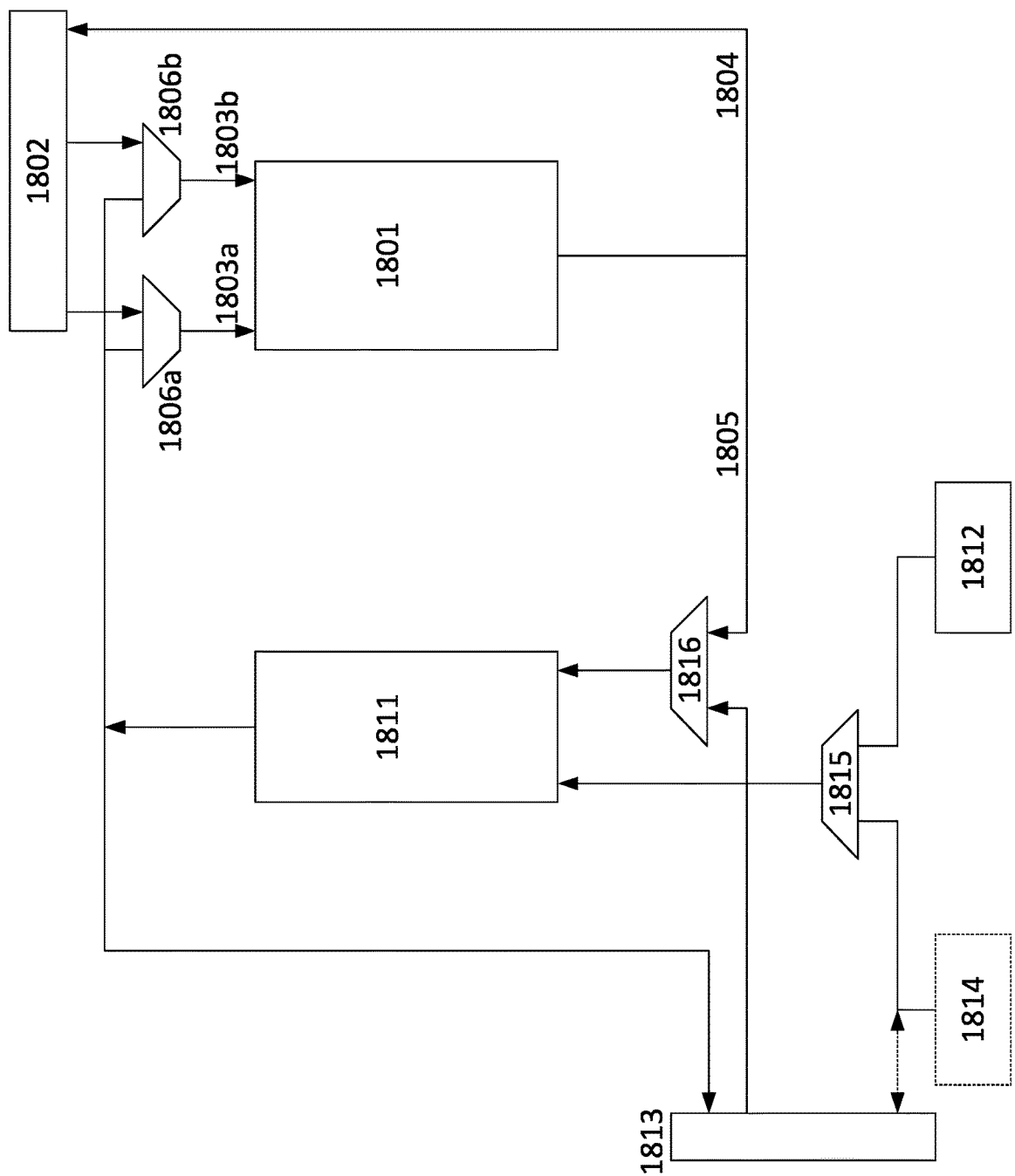
FIG. 18 is a diagrammatic illustration of an example coupling between processing elements (PEs) and processing element memory (PEM)

An example PEM to PE coupling is shown in FIG. 18. The datapath (1801) of a PE receives operand data from the register file (1802). Shown are 2 operands 1803*a* and 1803*b*. The results produced by executing instructions processing the operand data in the datapath is written back (1804) to the register file.

A PEM (1811) is located in parallel to the datapath (1801). Result data can be stored (1805) in the PE memory (PEM) (1811) in addition or alternatively to writing it back to the register file (1802).

Data can be loaded as operands for data processing from the PE memory (PEM, 1811). Via the multiplexers 1806*a* and 1806*b* either data from the register file is selected as one or both of the operands 1803*a* and/or 1803*b*.

A first address generator (1812) generates addresses for the PE access to the PEM (1811).

The PEM comprises an interface (1813) to the higher level memory hierarchy (such as for example L1 and/or L2 and/or L3 and/or the main memory) for loading and/or storing data in the global memory system. The higher level memory hierarchy is typically the global memory system of the processor.

For exchanging data with the higher level memory hierarchy addresses to access the higher level memory hierarchy and/or the PEM can be generated by the higher level memory hierarchy (e.g. a cache controller) and be received via the interface 1813. In addition or alternatively one or more address generators (1814) in the PEM may generate the addresses for the higher level memory hierarchy and/or the PEM and transmitted via the interface 1813.

A first state machine controls the memory access from the PE. A second state machine controls the PE memory access from the higher level memory. The state machines might be separate or merged into a single one. Typically the state machines are synchronized.

In some embodiments PE memory might be a single port memory in which case access from the higher level memory system and the PE is selected by multiplexers, e.g. for addresses 1815 and for data 1816. Naturally multiplexers exist for control signals but are not shown.

In some embodiments the PE memory might be multi-ported (e.g. dual-ported) allowing for simultaneous access from both, the PE and the higher level memory hierarchy.

Accessing the PEM

In some embodiments the PE can access the PE memory via load and store commands. Load/store commands as known in the prior art provide an address for addressing content in the PE memory and either the data source register (store instruction) or target register (load instruction) in the register file (1802). The respective content address can be then calculated by the address generator 1812.

In addition or alternatively (in some embodiments), the PE can access the PE memory like a register. The instruction contains a reference to the PE memory, but no specific address is provided by the instruction. In this case the address of the PE memory content starts at a specific location in the memory and with each instruction reference (i.e. memory access) the address is modified by a specific pattern. The modification of the address is performed by the address generator 1812.

The address modification pattern is programmable: For example it might be linear, strided, multi-dimensional (e.g. 2 or 3 dimensional) or simply constant for always addressing the same value.

Auto-Reload/Double Buffer

In some embodiments the PE memory has double buffer capabilities. In this case the PEM is spit into multiple memory banks (multi-banked), at least 2 memory banks. While the PE operates on a first memory bank, the PE memory system might off-load and/or preload the second memory bank. Some embodiments might for example comprise at least three memory banks, one for offloading, one for preloading and another one for current access from and operation with the PE.

The PE might operate for example in a first memory bank. During that time the second memory bank is (if necessary offloaded to the higher level memory system and) preloaded from the higher level memory system. Once the PE leaves the first memory bank and starts addressing the second memory bank the first memory bank is either offloaded (to the higher level memory system) and then preloaded (from the higher level memory system) with new data or directly preloaded with new data. For example read-only or scratch data does not require offloading, while globally visible read-write or result data which is used by other elements in the system and/or other code, sections in the code or algorithms requires off-loading.

The automatic offload/preload capabilities are particularly interesting when the PE operates on linear address ranges, for example linear one dimensional addressing. But the method is also well applicable for 2-, 3- or more-dimensional addressing. The automatic offloading and/or preloading is triggered once the address range leaves or enters an n-dimensional address window.

The automatic double buffering capabilities are supplied by a state machine controlling and monitoring the preload and/or offload and the address ranges in connection with the already described address generators.

Example PEM Usage

Figure 19:
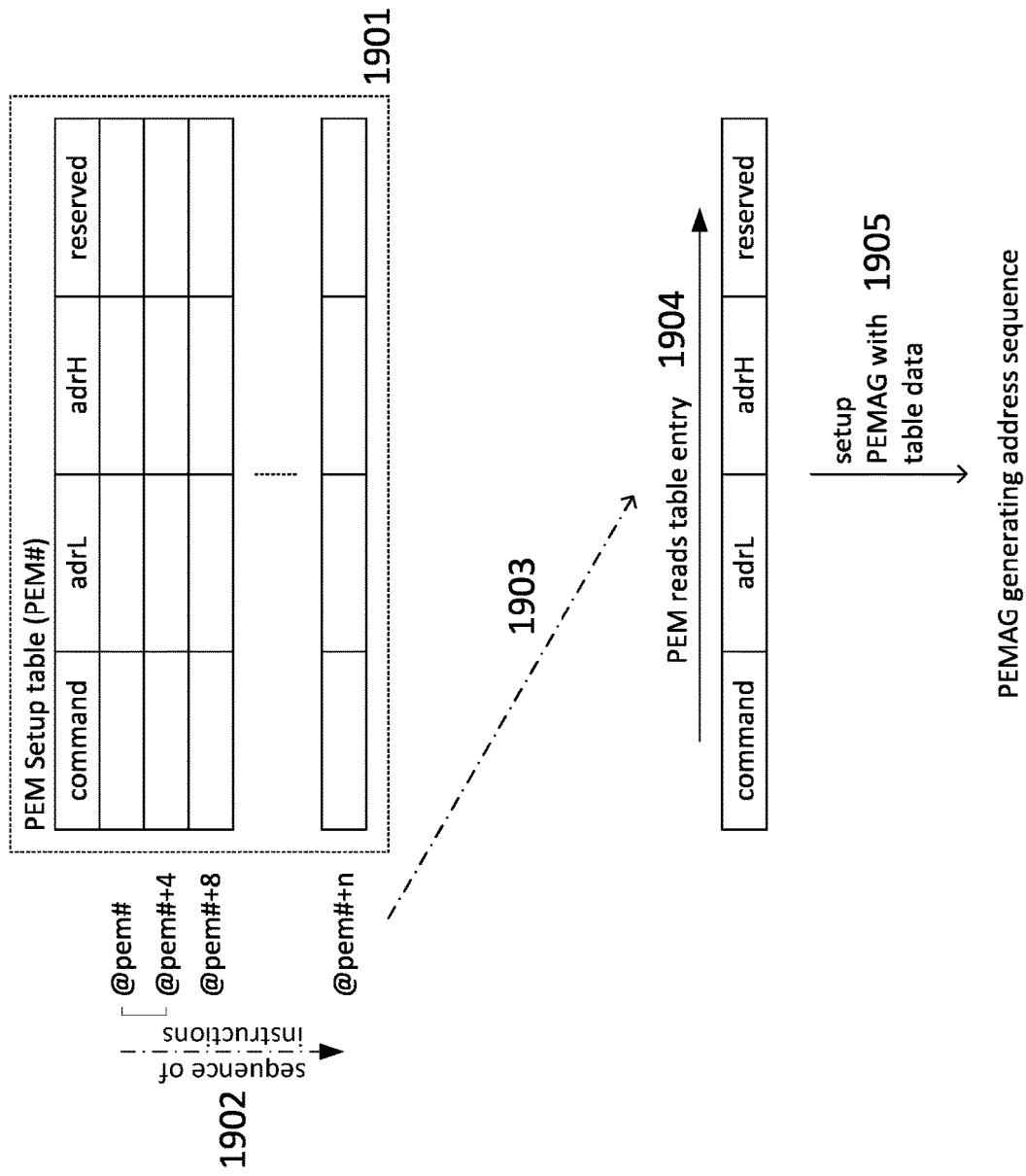
FIG. 19 is a diagrammatic illustration of use of processing element memory table.

FIG. 19 shows an example how to use a PEM. In this example usage model a PEM-table (PEMT, 1901) in the code refers to PE memory locations in the program code or data memory.

The code might comprise multiple PEM tables. Usually a table is valid and used by and within a section of the code, e.g. a subroutine or function.

PEM tables are very efficient for code section with a fixed predetermined issue sequence (1902) of instructions, such as loops, loop acceleration code for ZZYX processors or other code which instruction sequence and/or scheduling is precisely predetermined.

The PEM table (PEMT, 1901) might be embedded in the code or data segment. Each table entry (i.e. each line in the table) defines the address location, function, configuration and setup of a specific PEM. In this example each table entry is 4 32-bit words wide. The first word constitutes a command which defines the function, configuration and address generation of the PE memory within the specific PE. The words adrL and adrH form a 64-bit address pointing to the PEM data location in the main memory. The reserved field is currently unused.

For example the instruction decoder comprises a pointer to the PEM-table (PEMT, 1901) which is set by a respective instruction. With each instruction within the fixed predetermined issue sequence of instructions using (i.e. addressing) the PEM, the pointer moves to the next entry in the PEM table. Thus for each instruction using PEM data a respective PEM table entry defines the address range (adrL to adrH) and addressing of the PEM data.

The example code below is used for discussing the PEM functionality. It shall be noted that the code does not have any useful function but is solely for the sake of explanation. The shown code example configures the PEM pointer using a pemst instruction. Then it contains a loop embraced by the 'loop:'-label and the 'jne r5, #0, loop' jump instruction. The PE Memories are addressed, newly read and/or written within each loop iteration.

```
example: pemst _pem_table
loop:
    . . .
    add r0, r1, rpm
    mul r2, r0, rpm
    . . .
    sub r2, rpm, r2
    add rpm, r2, r4
    . . .
    jne r5, #0, loop
_pem_table: 0+2, parameter_list_0
    255-1, parameter_list_1
    0+0, constant
    0+1, result_list
```

The pemst instruction writes the address of the _pem_table into the pointer in the instruction decoder. The following add r0, r1, rpm instruction adds the value of register r1 and a value retrieved from PE Memory and writes the result to register r0. rpm addresses the PE memory and by such is a PEM-reference. It is the first reference in the code section and thus the first entry of the _pem_table configures (1905) the respective PE Memory. 0+2 defines the addressing function. Addressing starts at the local PE Memory address 0. With each iteration of the code (e.g. within a loop and/or issue of said add instruction, the address in the PE memory is incremented by 2. The data to be loaded into the PE Memory is located at parameter_list_0.

Accordingly the next instruction, mul r2, r1, rpm refers to the second entry in the _pem_table. Here the local addressing starts at address 255 and is decremented by 1 with each iteration (and/or execution and/or issue) of the respective mul instruction.

The fifth instruction of the example routine, sub r2, rpm, r2, subtracts r2 from a PE Memory value and stores the result back to r2. It is the third instruction referring (by rpm) to a PE Memory and thus the third entry in the _pem_table defines its function and data. In this case a constant value is supplied at address 0. Since the value is constant no address movement occurs (+0).

Finally, add rpm, r2, r4, adds r2 and r4 and write the result to PE Memory. It is the forth reference and thus the forth entry in the PEM-table defines the PEM function. Here the result is written to the memory location result list. The local address in the PE Memory starts at 0 and increments with each iteration (and/or execution and/or issue) by 1.

In other words the _pem_table referenced by pemst defines the function of the PE Memories for each of the instructions within the loop body of the function 'example'.

The PE Memories start with code loaded from addresses provided by the address reference in the PEMT. Result data written to PEM, in this example by the instruction add rpm, r2, r4, is written back from the respective PEM to the main memory after termination of the loop.

With each loop iteration, each address of the PE Memories is modified according to the modifier (e.g. 255-1) provided by the command in the PEMT.

FIG. 19 shows one example embodiment of a PEM table. The pointer points to the first entry (@pem #) of the table (1901). Each PEM table entry comprises a command defining the operation of the respective PEM, such as for example addressing scheme and/or sequence for address generation, read and/or write access, coherence and/or locality of the data. Further the address of the data to be mapped into the PEM is provided. In the given example a 64-bit address can be set, defined be a lower 32-bit address (adrL) and its high address part (adrH).

The PEM is typically located in the code segment. In some embodiments it might be located additionally or alternatively in the data segment. In some embodiments PEM data is located in the data segment.

With each instruction referring to a PEM, the pointer moves to the next entry in the PEM table and transmits the entry address to the respective PE at instruction issue (1903). PEM Control reads the respective table entry from the memory (1904) and configures the PEM operation accordingly (1905), for example the PEM address generator (PEMAG).

PEM and Cache

In some embodiments, PE Memories are implemented in addition to the cache structure of the memory hierarchy. Yet, such a structure might be inefficient: Applications using the PEM require fewer resources within the caches because the PEM serve as low level memories instead of the L1 caches. Ideally the PEM are merged with or integrated in the cache hierarchy.

Thus, in some advanced embodiments the PEM are merged with or integrated in at least one of the cache levels, Level-1 (L1), Level-2 (L2) and/or Level-3 (L3).

In some embodiments, each PEM or in case of multi-banked PEMs, each PEM bank, is integrated (or associated with) a cache slice or segment or bank in one of the cache levels. If a PEM operating as local memory is requested by the program code (e.g. application, thread, task and/or operating system), the PEM switches from cache operation to local memory operation and the respective cache part (e.g. segment and/or slice and/or bank) is evicted (if it was in use). In the cache-TAG for the respective cache part a PEM flag is set. Based on the set PEM-flag the cache controller excludes the respective cache part from further use. The cache controller no longer controls the cache part and will neither flush and/or evict the cache part, neither it will load or store any data into it. Yet, in some embodiments, the PEM might instruct the cache controller to preload or off-load PEM data. In these embodiments the cache controller still does not control the cache part as in the state of the art but it is under control of the PEM and merely manages data transmission. This is particularly useful, because the cache controller has all means (e.g. address generators and/or control units and/or coherence measures) to move data within the memory hierarchy.

Thus a memory bank of the PE Memory is, in these embodiments, part of a data cache (e.g. L1, L2, and/or L3), e.g., a cache slice and/or cache segment and/or cache bank, called the PEMcache-area (PEMCA). When the PE Memory is in use, the PEMCA is excluded from normal cache operation and dedicated to the PEM functionality. When the PE Memory is not in use, the PEMCA is a fully functional part of the cache. Switching between the modes (i.e. PEMCA used as cache vs. PEMCA used as PEM) typically involves flushing (i.e. write back of the PEMCA data) the current data in the PEMCA if necessary and preloading or loading of the new set of data into the PEMCA.

Depending on the embodiment PEMCA can reside in one of the system's data caches, for example in the Level-1 (L1), Level-2 (L2) and/or Level-3 (L3) data cache.

In some embodiments the Level-1 cache contains the PEMCA. This allows for fast access.

On the other hand the total amount to PE Memory might be quite large. Also the polymorphous memory architecture sharing the PEMCA between the PE and the cache requires additional logic, such as e.g. multiplexers and buses and control. Furthermore the PE Memories are ideally located physically close to the PEs on the silicon chip. This leads to a distributed memory spread across the silicon chip. These points define the access time and bandwidth of the memory system. The parameters might not ideally match the requirements for a Level-1 Data Cache. Thus, in some embodiments, the PEMCA is part of the Level-2 or even Level-3 cache and thus jointly controlled by each respective PE and the respective Level-2 and/or Level-3 cache controller.

Additional Example PEM Operation Modes

PEM may support additional operation modes. Some embodiments can implement Lookup Table functions in which a lookup in the PEM memory at the address provided by an input operand is loaded and the respective data, located at the address, is set as result data of the operation. Details of Lookup Tables are well known and not described in closer detail.

Some embodiments might implement FIFO functionality. An operand provided to the function is consecutively written into the PEM memory. The result of the function is consecutively read from the PEM memory. Writing of the operand and reading of the result is organized in a FIFO manner. Read and write pointers are provided. The memory is arranged in a ring. Details of FIFO operation are well known and not described in closer detail.

System Architecture

Figure 20:
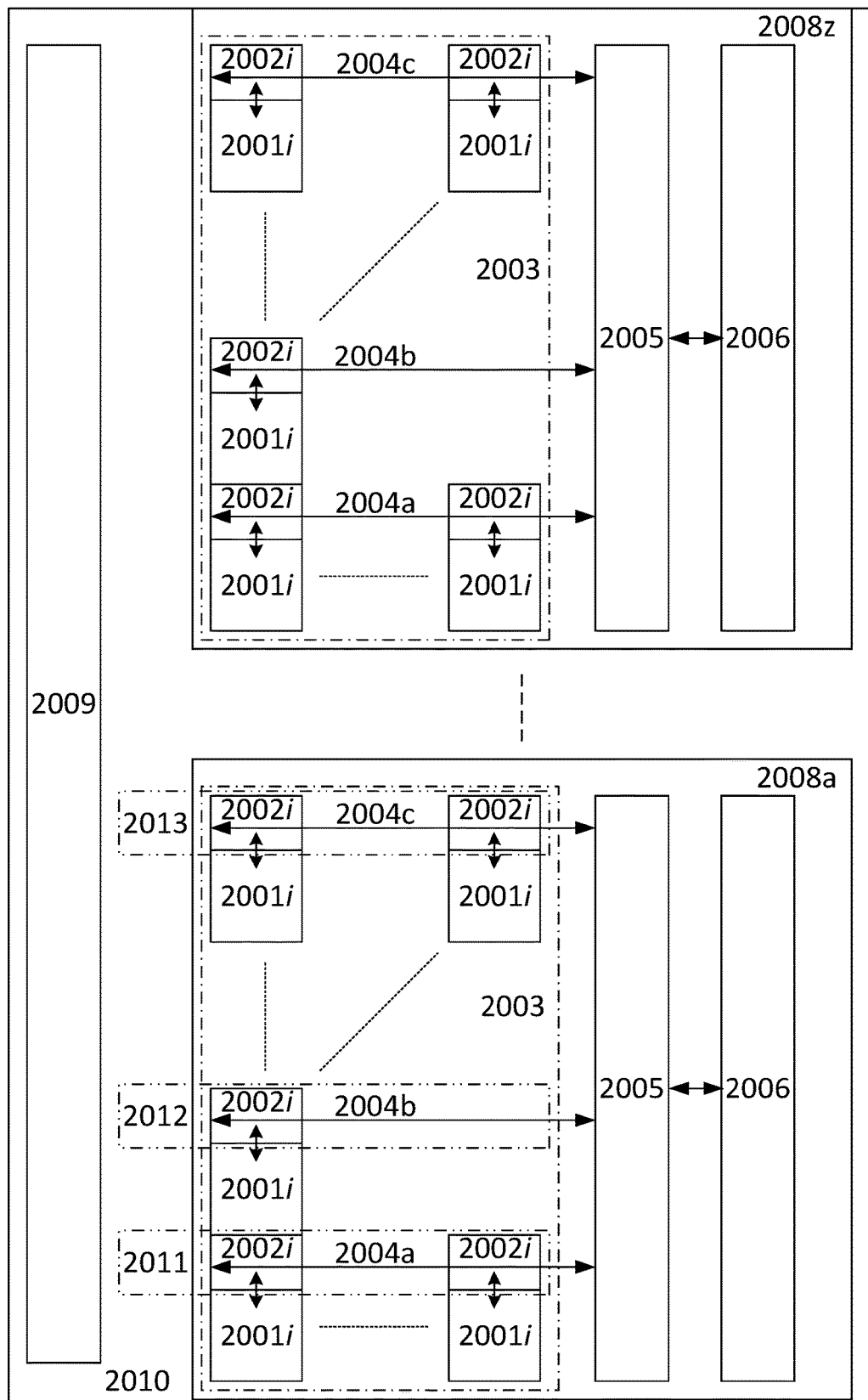
FIG. 20 is a diagrammatic illustration of an example physical implementation of a core in which PEM cache areas are located within a Level-2 cache.

FIG. 20 shows an example physical implementation of a core (e.g. 2008*a*) in which the PEMCA are located within the Level-2 cache. Each or at least some PE Elements (2001*i*) have associated dedicated PE Memories (2002*i*) as indicated by the arrows between the PE Elements (2001*i*) and their associated PE Memories (2002*i*). i is the index if the respective $PE_i$ in the array (2003). In some embodiments the columns of PEM form the Level-2 cache. In some embodiments the columns of PEM are at least part of the Level-2 cache. The columns are connected (2004*a*, 2004*b*, 2004*c*) to the Level-2 cache management (2005) for transferring data, address, control and/or tag information. The Level-2 cache management (2005) includes a cache controller.

The Level-2 cache structure is connected to the Level-1 cache.

It shall be noted that the Level-2 cache is either a dedicated data cache or a joint data and instruction cache.

2008*a* and 2008*z* are two example cores within a greater multi-core system or processor chip (2010) comprising those 2 and possibly further additional cores. Each core is completed with e.g. instruction fetcher, instruction decoder, one or more instruction caches and further components. The cores are combined via data transmission and interaction means to transmit data, control and synchronization information. For example a bus system interconnects the cores and/or a shared higher level cache (e.g. Level-3 cache). In some embodiments, a shared Level-3 cache (2009) interfaces between the Level-2 cache instances of the cores and an external memory. The cache hierarchy and external memory can be used for storing shared data and control information such as semaphores and/or locks. Particularly the data bus and/or caches are coherent and support and/or comprise coherence protocols.

Figure 21:
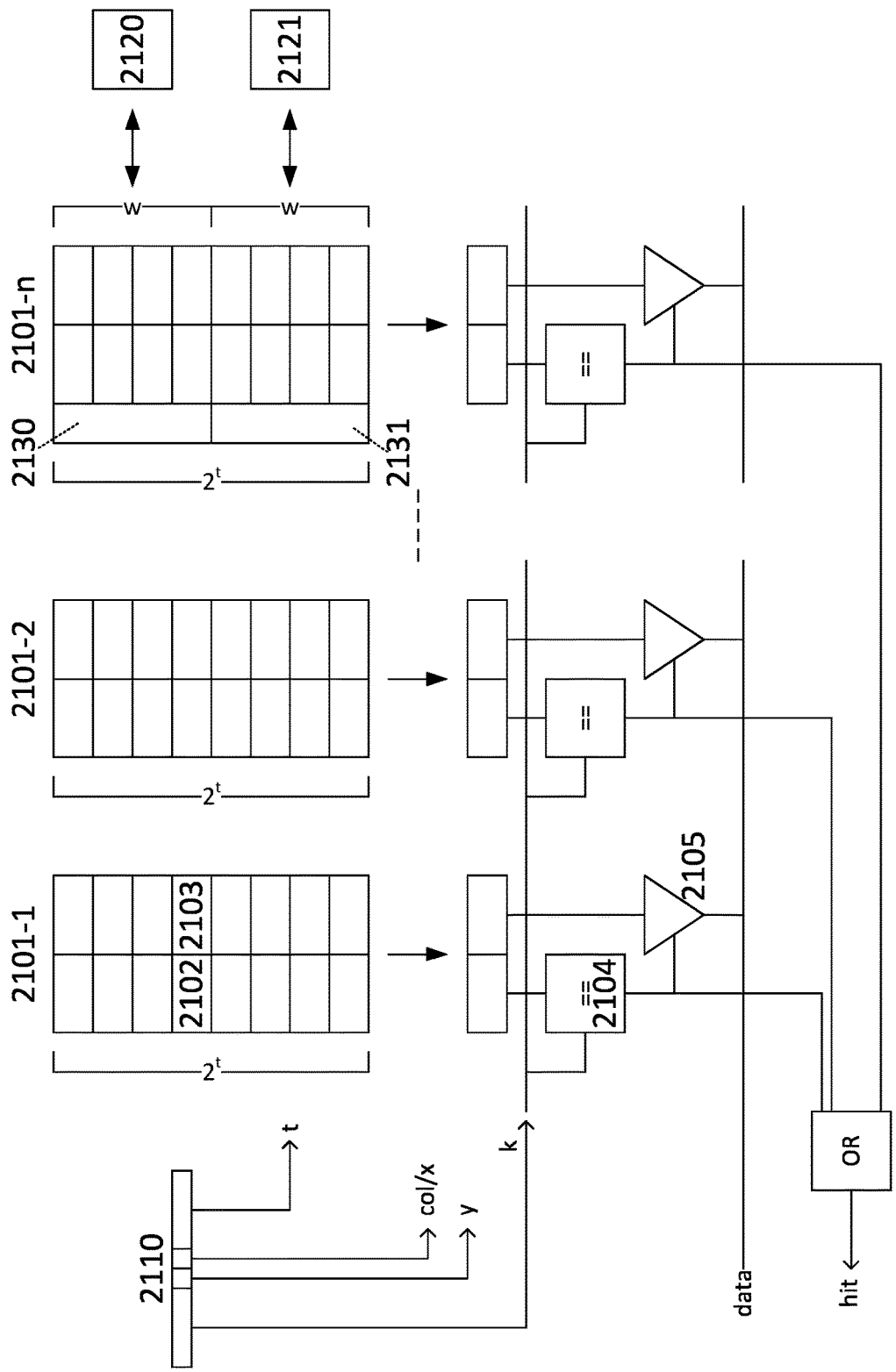
FIG. 21 is a diagrammatic illustration of an example implementation of a cache structure including cache banks and PEM cache areas.

FIG. 21 shows an example implementation of a cache structure comprising cache banks and PEMCA. The example cache is n-way associative comprising n direct-mapped cache banks (2101-1, 2101-2, . . . , 2101-$n$) each having $2^t$ entries. Each entry consists of a tag (e.g. 2102) and data part (e.g. 2103).

The lower part of the address (2110) addressing the cache data is used to address (t) the entries in the cache banks. The higher address part (k) is compared (e.g. 2104) with the tags associated with each entry. If the values match, the respective cache bank and entry is selected (e.g. 2105) for reading and/or writing.

Further descriptions of associative caches are omitted because they are well known in the prior art and by one skilled in the art.

The inventive part starts with cache bank 2101-$n$. The cache bank is, in addition to the interconnection and interaction according to cache banks of the prior art, connected to one or a plurality of Processing Elements (PEs) (e.g. 2120 and 2121). The connection to the PEs is such that the PEs have direct read and/or write access to the cache banks memory, without access control by the respective cache controller. Particularly the cache bank might be directly accessed like a tightly coupled memory.

The function of the cache controller might be limited to loading and offloading the respective cache bank's memory. Access from the PE to its dedicated cache bank's memory is dedicated and/or exclusive and/or private. In some example embodiments, no other PE can access a PE's dedicated PEM and a PE cannot access other PE's PEMs. Thus in the example embodiments the association between the cache bank's memory and the PE is private and exclusive.

Parts of the cache bank are associated with their respective PEs. In the shown example a part is $2^w$ entries large. Depending on the embodiment, the size of t and the amount of PEs in the system w might equal t (w=t) or have a ratio r (w=t/r). In some embodiments, 2101-$n$ might comprise multiple banks.

For the tag of each entry or groups of entries (of the size $2^w$) related to specific PEs (as defined by w) flags are added, indicating the usage of the respective entries. If the flags are set, the specific entry or group of entries of the size $2^w$ is excluded from the associative cache sets and dedicated to its directly related PE. If the flag is not set the entry or entries are under control of the cache controller and used as another associative cache bank. Two flags are shown in the example: 2130 for the entries associated with the PE 2120 and 2131 for the cache entries associated with 2121.

Respectively 2101-$n$ is shared between the cache and the PEs as local memory and can software selectable either operate as associative cache bank or PE Memory. 2101-$n$ is split into multiple sections, each section dedicated to one of the PEs. The respective dedicated PE has direct access to its associated section which operates selectable as the associated PE's PE Memory. In some embodiments the whole 2101-$n$ cache bank switches between PEM and Cache mode. In some embodiments the respective sections of 2101-$n$ individually switch between the modes such that some sections might operate as associative cache memory and other sections operates as PE Memories.

In some embodiments the address (2110) is split into an x (or column col) address part (i.e. col/x) selecting the physical memory column (for example 2011, 2012, 2013) of the cache memory system.

In some embodiments the address (2110) is alternatively or additionally split into a y address part selecting the row in which the respective memory block is located within the cache memory system.

Example PEM

Below an example PEM is described:

All PE Memory (PEM) for a following LAM is set up by a single instruction (PMS) and a table structure.

The PEM # is referenced by the PeM Setup instruction PMS:

| PMS | 00 | 01101 | 00000 | 000 | 01000 | 000000000 | mode |
|---|---|---|---|---|---|---|---|

PMS defines the PEM Setup Table settings for the following LAM. PMS is a pseudo instruction. The assembler generates a leading SIC_32 (or 64) instruction for transmitting the PEM Setup Table.start address. A pointer within the Instruction Decode Unit is set with the start address. With each reference to a PEM the pointer increments by 4 entries and thus points to the next line in the table.

The pointer is transmitted to each respective PE setting up the local address generator. The address generator automatically retrieves the type and size information, constant (if applicable) and address pointer (if applicable) from the table and autonomously sets up its address pattern generation.

PEMs are referenced using register rpm, rct or by an instruction implicit immediate (see SII_).

The operation mode is set by the mode field as follows:

| Assembly | mode | Operation |
|---|---|---|
| pem | 000 | Load data from PEM memory. Includes pointer operation as defined in pms_tbl. The values are accessible via rpm. |
| imm | 001 | pms_tbl is only one entry wide and one row deep. The entry contains the instruction's immediate value |
| rct | 010 | pms_tbl is only one entry wide and one row deep. The entry contains the instruction's constant value accessible via rct. |
| imm&rct | 011 | pms_tbl is only two entry wide and one row deep. The entries contain the instruction's immediate and constant value accessible via ret. |
| off | 111 | PEM operation issue is canceled and the pointer register inside the Instruction Decode Unit is disabled. |

The structure of the PEM table differs depending on the mode:

PEM Mode

In PEM mode (pem) a pms table (pms_tbl) has to be set up in dat code data section. Each PEM entry contains 4 32-bit words:

| Word | Usage |
|---|---|
| 1 | Command (type and addressing) |
| 2 | Lower address value |
| 2 | Higher address value |
| 4 | Reserved |

The structure setting up all PEMs for a LAM is consequently a PEM Setup Table is used having as many rows as PEMs used, each row containing the 4 word entry. For details see FIG. 19.

PEM Setup Table (pms_tbl)

The PEM Setup Table must be located in the data section of the code (.data[code]).

The format of the PMS table in assembly is:
pms_tbl command, pointer
pointer is a label pointing to a list of data.
The command has the following structure:
from+stride<to@cycle
whereas
from is the base address of the table walk
stride is the stride value
to is the upper limit of the walk
cycle is the number of operation cycles between the address pointer update Multi-Threading Details on thread management on ZZYX processors have already been described in [1], [3] and [4]. Reference is made to the respective patent literature, particularly to the instruction issue and overlay description as well as the instruction ordering and partitioning in [1]; to the thread concepts applied on Catenae in [3]; and the reordering, grouping and partitioning of code in [4]. These details of these respective references are incorporated by reference herein, and the entireties of these references are incorporated by reference herein for detailed disclosure.

One aspect of the described features is a Multi-Threading concept for a multi-core and/or multi-processing-element and/or array processor. The aspect per se is regarded novel and inventive. Further combinations with any other aspect or any combinations of other aspects of the features described are regarded novel and inventive.

Figure 22:
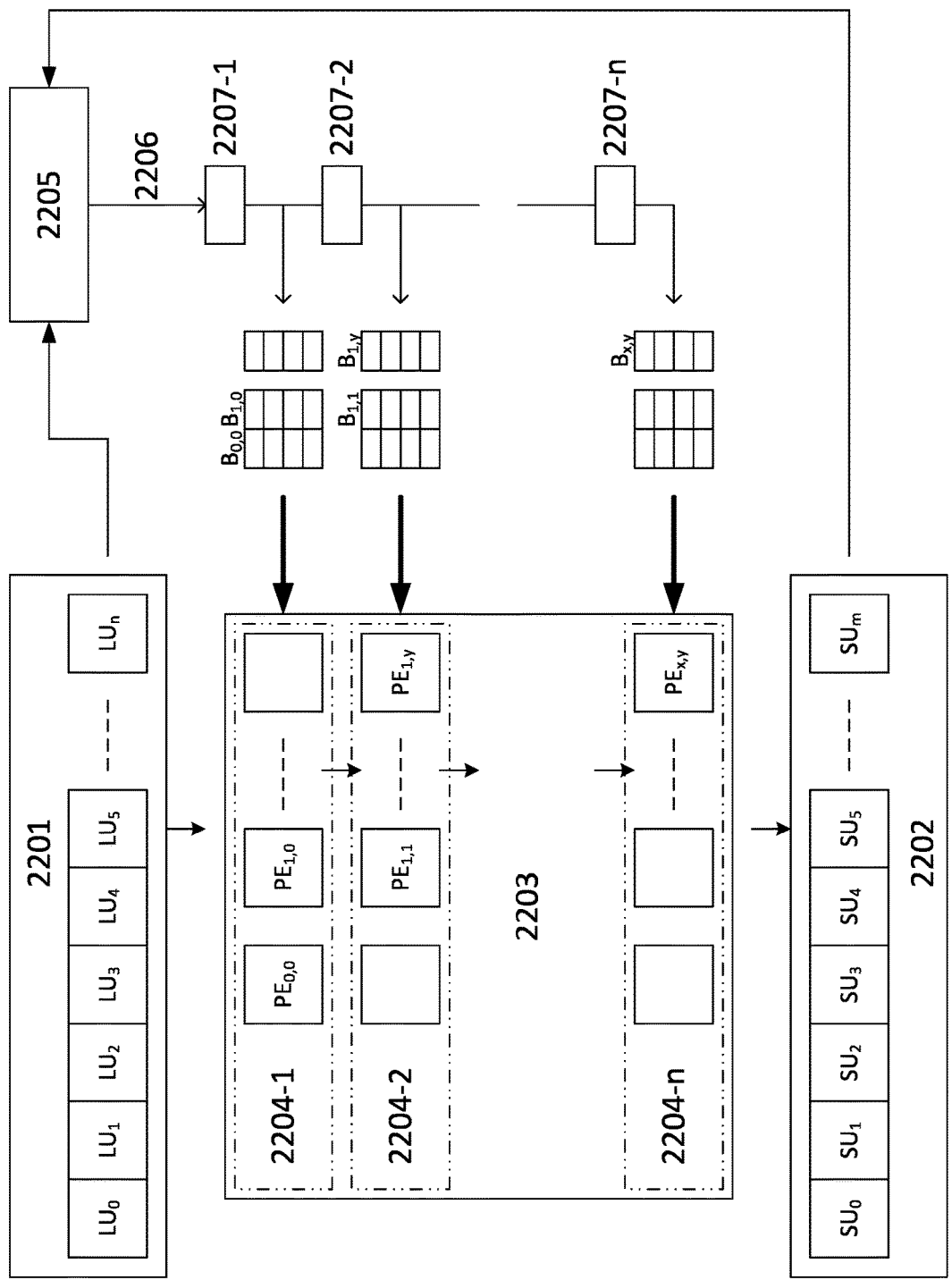
FIG. 22 is a diagrammatic illustration of an example operation model for processor cores for multi-threading.

FIG. 22 shows an example operation model for ZZYX processor cores for multi-threading. As already described, ZZYX processors may process out-of-order a vast amount of threads in parallel on the array. To complete the discussion the equivalent processing mode is described for loop-acceleration-mode. As known from e.g. [1] and [4] code (e.g. for loop-acceleration-mode) might be split such, that load and store operations are separated from (e.g.) ALU instructions in order to evade latency issues and the resulting loss in performance. Instructions with a predictable and small latency and/or execution time (e.g. ALU instructions) are merged into blocks. Those blocks are mapped onto the array, while instructions with high and/or unpredictable latencies (e.g. load/store instructions) are kept separate.

Applying this processing mode on FIG. 22, load instructions are mapped onto a quantity of load units (2201: Load Units $LU_0$ to $LU_n$). It is regarded as novel an inventive that the amount of load units is large and a plurality of load instructions from a plurality of threads are issued and executed in parallel on the number of load units. In some embodiments, each load unit processes up to one load instruction of one thread at a time.

Respectively the store instructions are executed by a large amount of store units (2202: Store Units $SU_0$ to $SU_m$). It is regarded as novel an inventive that the amount of store units is large and a plurality of store instructions from a plurality of threads are issued and executed in parallel on the number of store units. In some embodiments, each store unit processes up to one store instruction of one thread at a time. The total amount of store and load units might differ (n< >m). For example in some embodiments the amount of store units is less than the amount of load units.

Data delivered from the load units is sent to the array of Processing Elements (PE), i.e. the Execution Unit (2203). Each row (e.g. 2204-1, 2204-2, 2204-n) of execution units comprises at least one pipeline stage. Example embodiments of execution units are described in [1] and are incorporated by reference herein.

Multiple threads and/or tasks use the resources e.g. 2201, 2202, 2203 simultaneously. Particularly multiple threads may compete for getting resources assigned.

The plurality of threads issue instructions to the Load Units and Store Units (2201 and 2202) and the Execution Unit (2203). While in some embodiments a thread may occupy or possess a Load Unit or Store Unit by issuing an instruction for the duration of its execution, each PE comprises in some embodiments a small stack or buffer into which the instruction is stored. The entries in the stack or buffer are temporarily, for the execution of a number of threads, fixedly associated with or assigned to a set of threads. For example entry 1 might be associated with thread number 128853 and entry 3 might be associated with thread number 87123. Each PE has its respective dedicated stack or buffer, for example stack or buffer $B_{0,0}$ is dedicated to $PE_{0,0}$, $B_{1,1}$ is dedicated to $PE_{1,1}$ and stack/buffer $B_{x,y}$ is dedicated to $PE_{x,y}$. In other words, each PE is connected to a stack or buffer which contains a plurality of instructions of a plurality of currently active threads. Each instruction in a buffer is related with one of the currently active threads.

A thread manager (or scheduler) (2205) monitors the availability of required data and/or resources for each of the currently active threads. For example when for a specific thread all load data is available by the related load units (2201) and all related store units are ready to accept new data, the thread manager (2205) triggers data transfer and execution by sending a thread select and enable signal (2206) to the Execution Unit. For each row the thread select and enable signal selects the instructions related to the respective thread in the stacks or buffers ($B_{n,m}$) for execution in the associated PEs ($P_{n,m}$).

The thread select and enable signal is pipelined along the rows of PEs (e.g. 2204-1, 2204-2, 2204-n), particularly the thread select and enable signal path comprises as many pipeline stages (e.g. 2207-1, 2207-2, 2207-n) as the data path through the rows of PEs in the Execution Unit, such that data processing in the Execution Unit and the instruction selection by the thread select and enable signal is exactly synchronized.

Data processing and instruction selection is synchronized and overlaid, as described in [1] and is incorporated by reference herein. For details of splitting the load/store instructions and grouping data processing instructions reference is made to [4], which are incorporated by reference herein. Applying the Catena model on threads is described in [3] and is incorporated by reference herein.

However it is regarded novel and inventive having a large pool of Load Units and Store Units (LSUS, 2201 and 2202) to which instructions of a rather large plurality (e.g. 4, 16, 32) of currently active Catenae (i.e. e.g. threads or thread parts) are issued. These Load Units and Store Units (LSUS) compete for memory bandwidth and/or cache resources. Once all LSUS related to a specific Catenae are ready (i.e. the respective Load Units can deliver data and the respective Store Units can accept data) the respective Catenae is triggered for execution by the thread manger (2205) via the thread select and enable signal (2206). Typically this lasts for one or a plurality of clock cycles. In the next clock cycle or plurality of clock cycles another Catenae might be executed, given its LSUS are ready. The triggering of the thread select and enable signal is driven in some embodiments by directly monitoring the LSUS (2201 and 2202) by the thread management unit (2205).

While out-of-order execution in ZZYX processors has been described in [10], this method is particularly efficient and powerful for loop acceleration, SIMD, MMX, SSE and/or vector code. Also it can be applied on streaming data and/or large blocks of data such as databases, and CNN and/or DNN and other e.g. artificial intelligence algorithms.

Processing Element Microkernel

One aspect of the described features are processing elements with micro-programmable functions. The aspect per se is regarded novel and inventive. Further combinations with any other aspect or any combinations of other aspects of the features described in this document are further regarded novel and inventive.

Processor architecture is typically divided into reduced instruction set computer (RISC) and complex instruction set computer (CISC). RISC architectures are kept simple and efficient and their instruction set is minimal, avoiding any complex instructions. Thus RISC processors usually do not support microprogramming for defining complex instruction behavior by microcode. CISC processors on the other hand provide very complex instruction; so complex that the behavior of the instructions are not hardcoded but programmable by microcode. The microcode defines the function, use of hardware units and their interconnection for each specific opcode of the processors instruction set architecture (ISA). The microcode not only defines an opcode's behavior for a single clock cycle but might, for complex opcodes, define a sequence of actions over multiple clock cycles.

Processor architectures having many cores and/or many processing elements within a core are facing a dilemma: Either they are based on an inefficient CISC architecture supporting complex instructions by microprogramming or they are based on RISC not supporting complex instruction, so that dedicated hardware units are required. Both solutions are inefficient: CISC architectures are large and dedicated hardware units are expensive to add for each element of a RISC architecture.

Ideally a simple microprogramming model would allow small and efficient elements, e.g. of a RISC architecture, to support complex functions and opcodes. Ideally the simple microprogramming model would be implemented without requiring significant overhead in a way so that existing hardware features are reused and flexibly used without requiring a significant amount of addition hardware. Further little hardware overhead should exist so that there is only little penalty for elements not using the microprogramming capabilities.

Various described implementations are based on a small memory (microprogram memory (MPM) added to at least some of the elements, e.g. processing elements, of a processor. The small memory contains microprogramming instructions for the associated element or group of elements defining more complex operations than the instructions of the instruction set architecture provide. Ideally said memory can be reused for other functions than storing microprogramming instructions. For example it might be usable as data memory and/or cache. In some embodiments the previously described PEM memories are used which, depending on the implementation might be reusable as e.g. local data and/or data and/or parameter and/or constant memory and/or cache and/or cache bank and/or cache set.

One or in typical cases a plurality of code words are written into and/or stored in the microprogram memory (MPM). The element (which might be a processing element) or group of elements (which might be a group of processing elements) is receives the code word(s) from the MPM defining the operation.

The code words might be normal opcodes of the instruction set architecture just defining a more complex routine or subroutine. In some embodiments the code words might be alternatively or additionally special microprogramming codes being more complex and particularly greater in size than the opcodes of the instruction set architecture. In some embodiments the code words might be alternatively or additionally special microprogramming codes being less complex and particularly smaller in size than the opcodes of the instruction set architecture (ISA).

The execution in the element (which might be a processing element) or group of elements (which might be a group of processing elements) can be triggered by getting a specific opcode of the ISA issued, and/or a (sub)routine call and/or an interrupt and/or by the availability of operand data.

In the following, the inventive microprogramming method and architecture is an example described using the previously described PEM memories. Once more it shall be expressively noted that other memory architectures and/or systems and/or implementations can be used and the description based on PEMs are only examples.

The microprogram is loaded into the PEM memory. Depending on the embodiment, a variety of methods are possible. In some embodiments, the microcode is located is a separated memory which might be under control of the operating system and under protection of the operating system (e.g. its protection level). Also it might be located in a read-only memory (ROM), e.g. a Flash-ROM. The ROM might be protected. The BIOS ROM might be used for storing the microprogram. The microprogram might be loaded at startup time (e.g. boot time) of the system. In those embodiments the application programmer has typically no access to the microprogram and cannot alter or amend it.

In other embodiments the microprogram can be located in the applications code or data memory. The programmer might have access to the microprogram and can alter or amend it. Particularly he or she may be able to write specific microprograms which can be dedicated to his application.

Other embodiments are feasible for one skilled in the art. For example, in other embodiments, microcode might be located in a protected memory as described above (e.g. operating system and/or ROM memory). Additionally the programmer might be able to provide additional microprograms in/with his code. So both variants are mixed and protected and unprotected microprograms are supported and supplied.

The element or elements (element(s)) execute the microprogram from the assigned PEM. When the execution is triggered, it starts at a start address and terminates with a termination code word. The microprogram might comprise jumps continuing the execution at a specific address. It might comprise conditional jumps supporting conditional execution. Particularly microprograms might comprise code loops.

A microprogram might have its own execution state, such as e.g. carry flag and/or negative flag and/or overflow flag and/or zero flag. The execution state might differ from the processor's main execution state.

Different element(s) might execute different microprograms, even at the same time. Each element(s) has its/their specific execution state.

Various methods to instantiation microprograms are possible:

In some embodiments (e.g. TME), a pointer to the memory address at which the microprogram is located is provided in the application program. When the respective instruction address in the application program is reached the instruction decoder detects the pointer and instead of issuing an opcode it instruction the respective element(s) to load the microcode from the memory address at which the microprogram is located based on the provided pointer.

In some embodiments (e.g. LME), a set of instructions are reserved in the instruction set architecture for linking to microprograms, microprogram link instructions (MPI). When an MPI shall be used, it is first initiated with the pointer to the memory address at which the microprogram is located. The instantiation can be done for example by the application program at a local level or by the operating system or even boot loader on a global level. Local level means that the MPI is visible and referenced only for the application program, while the MPI is visible and referenced for all programs on a global level.

Specific element(s) are reserved for the MPI and access to the respective microprogram is provided to them (e.g. via the PEM). Whenever a MPI is decoded by the instruction decoder the respectively reserved element(s) are triggered by the instruction decoder for executing the MPI.

Other embodiments or variants of the example described embodiments are possible. It is particularly beneficial to implement both embodiments (TME and LME) for supporting temporary microprograms for microprograms used only once or very infrequently and MPI instructions for frequently used microprograms.

Microprograms enable programmers to introduce specific and/or complex instructions. Usually a processor has a fixed predetermined instruction set based on an analysis of the target products and markets. The instruction set is always bound to various limitations such as silicon size, cost and power dissipation. For example, in the past did many processors not support division. While it was of course possible to write subroutines or libraries the code was naturally larger and slower. On stream processors and/or array processors such as FPGA, GPU, many-cores and the like it can be very expensive to emulate missing instructions. Stream- and/or Array-processors may require a vast amount of element(s) to emulate such instruction, wasting a large amount of silicon and performance.

Microprogramming enables the programmer to amend the processor and instruction set architecture with specific instructions in an efficient and cost optimized way. Expensive (in terms of power and silicon area) instruction must not be implemented at prior but can be added when necessary. For example still most application use division rarely. So division might be added by microprograms in contrast to wasting silicon area for implementing a divider in each element. Other examples are logarithmic (e.g. log, ln) and/or exponential (e.g. exp) and/or trigonometric (e.g. sin, cos, tan, arcsin, arccos, etc) functions and/or root (e.g. sqrt).

In some embodiments a microprogram can use parts of the PEM (or any other memory associated with the respective element(s) as said above) for storing data. For example a PEM area might be used for storing scratch data to which the element(s) have read and write access during execution of the microprogram. Local and/or scratch data of the microprogram can be stored in the PEM area. Further constants and/or parameters might be stored in the PEM area. Those might be constant and the element(s) have read-only access.

In some embodiments the PEM area only stores read-only or local/scratch data, so that no coherence issues arise from a global system and/or data view. Respectively no coherence measures are necessary (like coherence protocols) and/or no write-back of said data to the higher level memory hierarchy is required.

Yet, in other embodiments, the PEM area might alternatively or additionally comprise global data having global relevance. Here the PEM area has to be written back to the global memory hierarchy, so that data modifications done by the element(s) become globally visible and accessible. Write-through or write-back protocols and/or methods might be used to ensure data consistency. Further coherence measures should be applied. Various implementations are feasible, for example coherence protocols and/or locks and/or semaphores. One skilled in the art knows those implementations because they are well known in the prior art. Thus no further description is necessary. Further one skilled in the art will appreciate that alternative or additional measures can be applied.

In some embodiments multiple PEM areas might exist, which might allow simultaneous access. For example at the same time a microcode opcode can be fetched from one area and a data word can loaded from another area. Or multiple data words can be loaded from or stored to different areas. For example the above described PEM banks can be used to allow simultaneous and/or independent access. In some embodiments an element or a group of elements (the element(s)) might have access to a plurality of PEM memories. Thus per se allows a plurality of simultaneous and independent accesses.

The microprogram in the element(s) appears to the outside program (or the respective program flow) like a single complex and possibly CISC like instruction.

The use of microprogramming shall be described in more detail based on an example divide implementation using an example instruction set and assembly code:

```
        .code
_start:
        movi r0, #21
        movi r1, #3
        .micro 1
        rdow m0, i0          ;Dividend N
          rdow m1, i1        ;Divisor D
        ;; m4 is R
        ;; m5 is Q
        nop
          for c0, #31
            slli m5, #1      ; Q << 1
            slli m0, #1      ;X := N(i)
```

```
        rlx m4, #1         ;R := R << 1 + X
        sub m4, m1         ;R := R–D
        cj.nng cont        ;Continue if > 0
            addi m5, #1    ;Q(0) := 1
        subi m5, #1        ; Q(0) := 0
            add m4, m1     ; R := R+D
cont:
        next c0
```

The code starts at label _start. First registers r0 and r1 are loaded with constants using ordinary assembly instructions.

The microprogram sections starts with the identifier .micro and ends with the identifier .end.

The first microprogram instructions rdow m0, i0 and rdow m1, i1 read the input values of the respective element's input register i0 and i1 and store them in the element's internal register file registers m0 and m1. The rdow instruction checks the availability of data in the input register and either reads the data or waits until data becomes available. Microprogramming might support loops, e.g. the for c0, #31 instruction with the next c0 encapsulates the divider core dividing the input value in 32 iterations. A standard division algorithm is used well known in the art, thus no detailed explanation is provided. Yet, it shall be mentioned that the microprogramming supports conditional jumps. The cj.nng cont instruction continues the program flow at label cont: when the negative flag has not been set by the preceding sub m4, m1 instruction.

After the for-loop has terminated, the value or the microprogram register m5 is written to the element's output register o0 by the wrow o0, m5 opcode. In some embodiments the opcode might wait for the output register to become available for new data, e.g. output register is empty. The done opcode terminates the microprogram.

The mcr r2, r0, r1 instruction references the microcode in the higher level assembly program and links the data accordingly. The element's i0 register is loaded with data of register r0 of the assembly code and i1 is loaded with data of register r1.

r2 is, according to the link defined by the mcr instruction, the result register of the microprogram. Consequently the result in register m5 is returned to register r2 of the register file of the higher level assembly program via the link established in the mcr instruction.

The example microprogram is an example of a TME embodiment. The microcode is provided within the assembly program flow and the mcr opcode links the microprogram with the assembly program. The scope of the mcr opcode is local.

A LME implementation would predefine the mpi opcode at an earlier point time, e.g. in the program flow. Within the program flow of the assembly program only the MPI opcode is issued, referencing to a previously done definition. In some embodiments, and preferably, multiple MPI opcodes are provided by the ISA, each can be initialized with a different microprogram. During execution of the (assembly) program the required MPI is issued referencing to the respective microprogram.

Example Microprogramming

Below an example Microprogramming implementation is described:

Microprogramming allows for writing microcode for specific PEs. The code is treated as a complex instruction executed by the PE.

Processing Element (PE) Micro-Register Set

General Purpose Registers:

General purpose registers have the same width as the normal data registers.

m0 m1 unused/reserved unused/reserved m4 m5 unused/reserved unused/reserved

Base Pointer Registers

Base registers are 7 bit wide. Data bits 6 to 0 of a 32 bit word are transferred to the base registers.

illegal illegal b2 b3 b4 (reserved)

b5 (reserved)

b6 (reserved)

b7 (reserved)

Instruction format

Microinstructions use a 2-address format allowing a dense 16-bit width with two instructions packed into a 32-bit word.

The maximum size of a microcode is 128 word or 256 instructions.

Jumps are limited to word boundaries.

A for instruction supports up to 2 for loops which can be nested. The values of the loop counters are available for address computation. The valid range of a loop is between 2 and 32 iterations.

Instruction Packing and Placement

Instructions are packed into a left and right instruction slot. The slots are arranged in a little endian format so that the left hand instruction (left slot), ranging from bit 16 to 31, is executed at even addresses and the right slot), ranging from bit 0 to 15, is executed at uneven addresses. See FIG. 32A.

Jump instructions must be placed into the left instruction slot. The following right slot in the same word is executed in the delay slot of the jump. The jump target must always be located on a word boundary, i.e. in a left instruction slot.' See FIG. 32B.

The instructions are executed in the sequence shown in FIG. 32C.

FOR instructions must be placed into the right instruction slot. Failing to do so will result in an infinite loop because the loop will be newly initiated in each iteration. The next instruction must be placed into the left instruction slot, followed by a delay slot instruction. See FIG. 32D. The instructions are executed in the sequence shown in FIG. 32E.

If a delay slot or the instruction right before the FOR instruction (instruction$_{for-1}$) cannot be used, it must be filled with a NOP instruction.

Microcode Instructions

Most instructions are provided in a 2-address format:
target←target, source

Move instructions:

|       | 15 14 13 | 12 11 10 | 9 8 7 | 6 5 | 4 3 2 1 0 |
|-------|----------|----------|-------|-----|-----------|
| MOV   | 000      | rr       | ro0   | 00  | 00000     |
| NOP   | 000      | 000      | 000   | 00  | 00000     |
| NOT   | 000      | rr       | ro0   | 00  | 00001     |
| MOVB  | 000      | br       | ro0   | 00  | 00010     |
| MOVIS | 000      | rr       | 0  00 | 01  | s_imm     |
| MOVBI | 000      | br       | 1  00 | 01  | imm       |
| SETC  | 000      | 000      | 1  00 | 01  | 0000   1  |
| CLRC  | 000      | 000      | 1  00 | 01  | 0000   0  |
| RDOW  | 000      | rr       | ir    | 00  | 00011     |
| WROW  | 000      | or       | ro0   | 00  | 00100     |

The MOV instruction moves the value of ro0 to rr.

NOP is No Operation and might be used to fill unused slots (e.g. delay slots).

NOT moves the logically negated value of ro0 to rr.

MOVB moves the value of register ro0 to the memory load base register br.

MOVIS moves the 5-bit signed immediate to register rr. The immediate is sign extended to 32-bit.

MOVBI moves the 5-bit unsigned immediate to the memory load base register br.

SETC sets the carry flag to 1.

CLRC clears the carry flag to 0.

RDOW reads a value from a PE input register from the bus system. If no value is available execution stalls.

WROW write a value from a PE output register to the bus system. If the output register is not empty (has not been read) execution stalls.

Note: If an output value has been read once a subsequent WROW will succeed. In case multiple targets intend reading the output value, a MOV instruction must be placed between the output register and the plurality of receiving instructions.

Arithmetic and Logic Instruction

|       | 15 14 13 | 12 11 10 | 9 | 8 | 7 6 5 4 3 | 2 1 0 |
|-------|----------|----------|---|---|-----------|-------|
| ADD   | 010      | rr       | f | 0 | 00000     | rol   |
| SUB   | 010      | rr       | f | 0 | 00001     | rol   |
| ADDC  | 010      | rr       | f | 0 | 00010     | rol   |
| SUBC  | 010      | rr       | f | 0 | 00011     | rol   |
| XOR   | 010      | rr       | f | 0 | 00100     | rol   |
| OR    | 010      | rr       | f | 0 | 00101     | rol   |
| AND   | 010      | rr       | f | 0 | 00110     | rol   |

In difference to higher level assembler instructions all arithmetic and logic microcodes set the overflow, negative, carry and zero status flags. The flags are evaluated by the conditional jump instruction.

ADD adds rr and ro1 and writes the result to rr.

SUB subtracts ro1 from rr and writes the result to rr.

ADDC adds the carry flag, rr and ro1 and writes the result to rr.

SUBC subtracts ro1 and the carry flag from rr and writes the result to rr.

XOR performs a logic exclusive OR operation of ro1 and rr and writes the result to rr.

OR performs a logic OR operation of ro1 and rr and writes the result to rr.

AND performs a logic AND operation of ro1 and rr and writes the result to rr.

Arithmetic Operations with Immediates

|      | 15 14 13 | 12 11 10 | 9 | 8 | 7 6 5 | 4 3 2 1 0 |
|------|----------|----------|---|---|-------|-----------|
| ADDI | 010      | rr       | f | 1 | 101   | imm       |
| SUBI | 010      | rr       | f | 1 | 110   | imm       |
| ADCF | 010      | rr       | f | 1 | 101   | 00000     |
| SBCF | 010      | rr       | f | 1 | 110   | 00000     |

ADDI adds the unsigned immediate imm to rr and stores the result in rr.

SUBI subtracts the unsigned immediate imm from rr and stores the result in rr.

ADCF adds the carry flag to rr and stores the result in rr.

SBCF subtracts the carry flag from rr and stores the result in rr.

Shift Instruction

|     | 15 14 13 | 12 11 10 | 9 | 8 | 7 6 5 4 3 | 2 1 0 |
|-----|----------|----------|---|---|-----------|-------|
| SLL | 010      | rr       | f | 0 | 00111     | rol   |
| SLR | 010      | rr       | f | 0 | 01000     | rol   |
| SAR | 010      | rr       | f | 0 | 01001     | rol   |

The operand to be shifted is in rr, the shift amount is provided by ro1 and the result is written to rr. In difference to the higher level assembler instructions all shifts go to the carry flag, while the inputs are filled with 0 or the sign bit respectively.

Figure 33A:
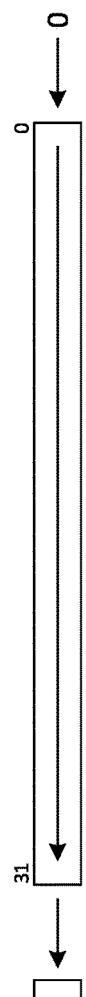
FIGS. 33A-33G are diagrammatic illustrations of example shift instructions for processing elements.

SLL is a logical left shift (zeros are shifted into the lower bits). See FIG. 33A.

Figure 33B:
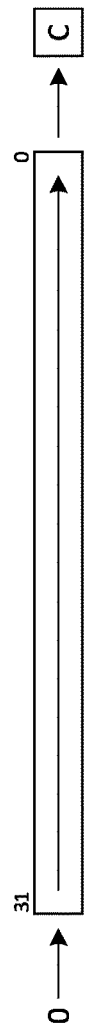

SLR is a logical right shift (zeros are shifted into the upper bits). See FIG. 33B.

Figure 33C:
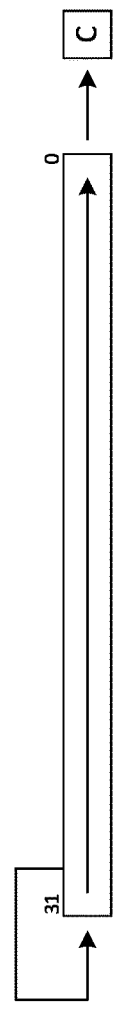

SAR is an arithmetic right shift (the original sign bit is copied into the vacated upper bits). See FIG. 33C.

|      | 15 14 13 | 12 11 10 | 9 | 8 | 7 6 5 | 4 3 2 1 0 |
|------|----------|----------|---|---|-------|-----------|
| SLLI | 010      | rr       | f | 1 | 000   | imm       |
| SLRI | 010      | rr       | f | 1 | 001   | imm       |
| SARI | 010      | rr       | f | 1 | 010   | imm       |
| RLX  | 010      | rr       | f | 1 | 011   | imm       |
| RRX  | 010      | rr       | f | 1 | 100   | imm       |

The operand to be shifted is in rr, the shift amount is provided by imm and the result is written to rr. In difference to the higher level assembler instructions all shifts go to the carry flag, while the inputs are filled with 0 or the sign bit respectively.

Figure 33D:
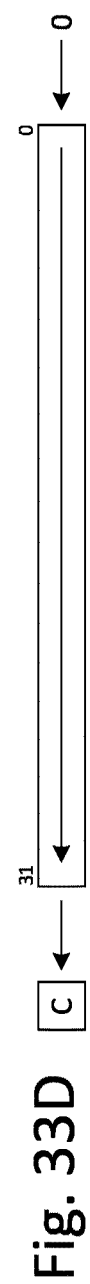

SLLI is a logical left shift (zeros are shifted into the lower bits). See FIG. 33D.

Figure 33E:

SLRI is a logical right shift (zeros are shifted into the upper bits). See FIG. 33E.

SARI is an arithmetic right shift (the original sign bit is copied into the vacated upper bits).

Rotate operations fill the carry flag from the data word and simultaneously feed the carry back into the word.

Figure 33F:
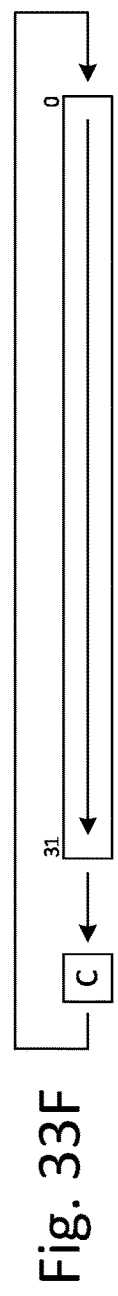

RLX is a logical left rotate through the carry flag. See FIG. 33F.

Figure 33G:
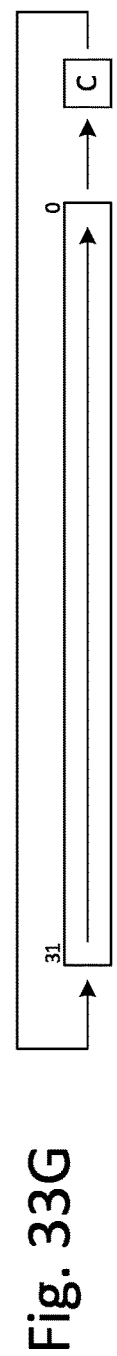

RRX is a logical right rotate through the carry flag. See FIG. 33G.

Multiplication Instruction

|     | 15 14 13 | 12 11 10 | 9 | 8   | 7 6 5 4 3 | 2 1 0 |
|-----|----------|----------|---|-----|-----------|-------|
| MUL | 010      | rr       | f | 0   | 01010     | ro1   |
| MAC | 001      | rr       |   | ro0 | ro1       | 1100  |

MUL multiplies rr and ro1 and stores the result in rr. MAC performs a multiply-accumulate operations by multiplying ro0 and ro1, adding the result to rr and storing the sum back into rr.

Jump and Loop Instructions

|      | 15 14 13 | 12 | 11 10 9 8 | 7 6 5 4 3 2 1 0 |
|------|----------|----|-----------|-----------------|
| JMPS | 100      | 0  | 0000      | s_imm           |
| JMPR | 100      | 0  | 0001      | 0    ro1   0000 |
| FOR  | 100      | 0  | 0001      | 1    0  c  imm  |
| NEXT | 100      | 0  | 0001      | 1    0  c  00000|
| CJ.  | 100      | 1  | cond      | s_imm           |

JMPS performs a relative jump by the signed immediate. The target address is obtained by adding the 8-bit signed immediate to the local micro program pointer.

JMPR performs a relative jump by the signed value provided in register ro1. The target address is obtained by adding the lower 8-bit of rot to the local micro program pointer.

FOR . . . NEXT set up a for loop counting from the immediate value imm to 0. Two for loops can be used simultaneously, with the loop counters c0 and c1. The value of the loop counters are accessible for PEM address generation.

CJ.cond perform a conditional jump. The target address generation is according to JMPS.

| eq  | The operands of the last instruction were equal |
| ne  | The operands of the last instruction were unequal |
| zo  | The zero flag is set |
| nzo | The zero flag is not set |
| cy  | The carry flag is set |
| ncy | The carry flag is not set |
| ng  | The negative flag is set |
| nng | The negative flag is not set |
| ov  | The overflow flag is set |
| nov | The overflow flag is not set |
| uge | The unsigned value ro0 of the last instruction was greater or equal ro1 |
| ult | The unsigned value ro0 of the last instruction was less then ro1 |
| ugt | The unsigned value ro0 of the last instruction was greater then ro1 |
| ule | The unsigned value ro0 of the last instruction was less or equal ro1 |
| sge | The signed value ro0 of the last instruction was greater or equal ro1 |
| slt | The signed value ro0 of the last instruction was less then ro1 |
| sgt | The signed value ro0 of the last instruction was greater then ro1 |
| sle | The signed value ro0 of the last instruction was less or equal ro1 |

Load from PEM Memory

|    | 15 14 13 | 12 11 10 | 9 8 7 | 6 5 4 3 | 2 1 0 |
|----|----------|----------|-------|---------|-------|
| LW | 101      | rr       | br    | mode    | imm   |

LW loads a word from the PEM into register rr. The memory address is computed based on the base register br depending on the mode field:

| +c0   | The PEM address is br + c0 |
| -c0   | The PEM address is br - c0 |
| +c1   | The PEM address is br + c1 |
| -c1   | The PEM address is br - c1 |
| +i    | The PEM address is br + imm |
| -i    | The PEM address is br - imm |
| +=i   | The PEM address is br + imm, the address is written back to br |
| -=i   | The PEM address is br - imm, the address is written back to br |
| +c0+i | The PEM address is br + c0 + imm |
| -c0+i | The PEM address is br - c0 + imm |
| +c1+i | The PEM address is br + c1 + imm |
| -c1+i | The PEM address is br - c1 + imm |
| +c0-i | The PEM address is br + c0 - imm |
| -c0-i | The PEM address is br - c0 - imm |
| +c1-i | The PEM address is br + c1 - imm |
| -c1i  | The PEM address is br - c1 - imm |

Writing Microcode in Assembler

Microcode can be placed anywhere in the assembly code as follows:

|         | .micro 1   |
| @NIL    |            |
| @NIL    |            |
| @NIL    |            |
| @NIL    |            |
|         | .end       |
| mcr rr, | ro0, ro1   | micro specifies the microcode section for a single or double PE element. The section ends with the .end token.

The section starts with 4 address pointers. The first one must always be @NIL and is reserved for future use. The second pointer points to the second PEM data bank in the right PE of a double PE and the third pointer to the respective first PEM data bank.

The fourth pointer points to the PEM data bank of the left or single PE

The PEM data bank addresses must be located in the .data[code] section.

The pointers are followed by microcode instructions defining the microoperation of the PE.

Finally the MCR instruction inserts the microcode into the assembler program and defines the operand and result registers.

PEM Control and Data Transfer

A block diagram of an example PE Memory (PEM), for storing application (and operating system) data and/or application (and operating system) code, is shown in FIG. 23A.

In some embodiments, a PE Memory (PEM) is directly coupled to a PE (data processing element) and, in one programmable mode, operates as local access data storage (local memory mode) for the PE, or, in another programmable mode, operates as cache bank or cache line (cache mode) of the over-all cache structure. Switching between local memory operation (local memory mode) and cache operation (cache mode) is controlled by the application software and/or the operation system and can be performed during operation at runtime. The switch can be made, for example, during context and/or task and/or thread switches. In some embodiments, switching between the modes contains off-loading (saving) of an existing memory content to the higher level memory, which can be a higher level cache or main memory, and loading (restoring) the memory content for the next context and/or task and/or thread from the higher level memory. In some embodiments, saving and restoring of the memory content is controlled by the respective level's cache controller.

In some embodiments, the coupling between PE and PEM can be a tight coupling, e.g., the PEM can be physically closely located to the associated PE, such that the PE (processing element) and PEM (processing element memory) are located either next to each other (e.g., adjacent) or at least in a close vicinity to each other in the physical implementation. For example, the close vicinity can mean that the elements are located horizontally close together (e.g., adjacent or within close proximity) on a single piece of silicon (e.g. a silicon die or chip die), or located vertical close within a silicon die stack, e.g., located on different (e.g., adjacent) silicon dies that are stacked on each other.

The tight coupling between PE and PEM can provide several advantages. For example, a tight coupling can provide higher bandwidth, e.g., because the memory is not monolithic (like a cache) but distributed among the PEs. For example, each PE has access to its PEM in parallel to access to PEMs by other PEs. Other advantages include lower power dissipation (e.g., the tight coupling provides less capacitance), higher signal frequency allowed, and/or less signal latency than couplings having greater distance between components.

The PE memory (2399) contains two memory banks (2301 and 2302) which might be used for double-buffering. In typical implementations the memory is $2^{10}$ to $2^{12}$ bytes large to be in line with ALU Block (Execution Unit) sizes and cache memory sized typical for today. The memories are randomly addressable via address lines (2303) by the PE core, the data bus (2304) to the PE core is 32-bit wide.

A controller (PEMC) (2305) monitors the addresses received from the PE core and triggers preloading or unloading of data via a request signal (2307) to the cache controller. In case an address requested by the PE core is not available in the memory (i.e. 2301 and 2302) the controller (2305) instructs the PE core to wait until the requested data range becomes available in the memory via control signals (2306).

The controller (2305) also stores the higher address part (2308) of the memory range in the global memory which might be, depending on the organization of the cache hierarchy either the virtual or physical address.

A variety of architectures exists to implement the communication between the PE memory and the respective cache controller. One particularly efficient implementation is described in detail.

The cache controller requires access to the PE memory controller's PEMC (2305) internal state and data, for example to read the required address range for a transfer and/or to receive the required type of transfer, i.e. preloading of a bank or unloading of a bank and/or which bank requires a transfer.

In some embodiments additional bus system and communication structures might be used. Yet, they increase hardware effort and complexity. In some embodiments, the PE memory controller's (PEMC, 2305) internal status, address and/or information registers are accessible as SRAM. For example they can be implemented as dual-ported SRAM cells allowing access to both the PEMC (2305) and the cache controller via a separate port. The cache controller can access those dual-ported memory cells using the RAM cell Wordlines. Reference is made to the implementation of SRAM cells, as one skilled in the art is aware of. Though access to the PEMC controller is gained through ordinary differential Wordlines (WL, 2309) we call them Controllines (CL, 2310) just for clarification. Data between the memory cells of the memory banks (2301 and 2302) and the PEMC internal memory cells are transmitted via Bitlines. Reference is again made to the implementation of SRAM cells, as one skilled in the art is aware of. The typical bit width is 512 bit, each bit having a pair of differential wordlines. The 512 Wordline pairs are bundled in FIG. 23A into the data bus (2311).

FIG. 23B shows the arrangement of a plurality of PE memories (2399) in a column. The memories are arranged similarly to an ordinary SRAM, with the addition dual port cells and CL lines. As in ordinary SRAM the Bitlines (dta, 2311) and Wordlines (WL, 2309) go through the entire memory arrangement. So do the Controllines (CL, 2310) to address the PE memory controller's (PEMC) internal registers. The system is simply to implement, fits ordinary SRAM implementations, efficient and fast.

An additional requirement is the connection of the request signals (2307) to the cache controller for requesting data transfers.

The request signals are combined and arbitrated. Depending on the architecture and the physical requirements of chip implementation they might be either combined within areas, rows or columns or combinations thereof of the entire memory system. Arbitration and combination might be hierarchical and pipelined to meet size and timing requirements of both the memory system and the cache controller. In FIG. 23B the request signals are vertically combined and arbitrated by a combination and arbitration logic (2320). The logic might comprise pipelining registers. Multiple combination and arbitration logics (2320) from multiple columns will feed their arbitrated request signals (2321) to higher level combination and arbitration logics which in turn combine, arbitrate and pipeline the request signals until the signals reach the cache controller.

The method adds latency to the request signals. Yet, a well-balanced system can accept latency at this level, particularly as it is in line with Level-2 (L2) cache typical latencies.

Code Boxes

Many algorithms can be parallelized by instantiating, issuing to the Execution Unit (e.g. the ALU Block) and executing multiple instances of a code kernel (e.g. an inner loop).

The memory bandwidth may become a severe bottleneck when a plurality of kernels transfer data to and/or from memory. The above described PE memory (PEM) is an ideal technology to independently manage data exchange with memory in parallel. Prefetching and unloading of PE memory to and from the higher memory hierarchies is managed by the L2 cache controller in the background, independently of data processing and transparent to the programmer. Ideally each PE memory is managed separately and independently so that no timing interaction between the resources limits the performance by any kind of interrelation. The joint loop control in the prior art (reference is for example made to the loop control and the respective hardware described in [1], [4] and particularly [10]) quickly becomes a limitation. For example each of 8 kernels use two PE memories to read data and one PE memory to write result data, in total 24 memories are used. If all memories have to be preloaded from (or after completion unloaded to) memory the memory transactions limit the processor because all kernels have to wait until all memory transfers have been completed and only then the joint loop control can proceed. This is particularly critical during execution, if some PE memories require updating because they are leaving the local address range stored in the respective PE memory. Consequently it is preferred if under such conditions each kernel can operate autonomously with an own, dedicated loop control. To provide flexibility this type of loop control should not be implemented in hardware but is preferably written in software (e.g. like a for- or while-loop) and executed by PEs (e.g. ALUs) in the kernel. Each kernel is autonomously self-controlled.

To implement this feature, so called Boxes are introduced, encapsulating self-controlled code blocks being largely independent of each other. Hardware support is required to isolate the control structures for each Box within the Execution Unit (e.g. ALU Block).

Data is transmitted within a ZZYX processor preferably top down within an Execution Unit (e.g. an ALU Block), i.e. from PEs (e.g. ALUs) of higher rows to PEs of lower rows. Reference is made to [1], in particular to FIGS. 4, 11, 13, 27, where details of an example Execution Unit (e.g. ALU Block) are provided and are incorporated by reference herein. Data transfer between the rows is preferably pipelined by pipeline registers. In the prior art those registers were jointly controlled, e.g. enabled and clocked.

FIG. 25A shows an Execution Unit comprising an array of Processing Elements (PE). In the prior art the array was controlled, as described above, by a global loop control unit which was capable to control the iteration of both single and nested loops. Only one loop body could be controlled, i.e. the whole array was in lock step with that global loop controller.

For algorithms relying on many PE memories, for example, one global loop controller is insufficient. The PE memories might require data transmission with the higher level memory. This could require a significant amount of time if all are in lockstep. The memory controller, controlling the data transfer between the higher level memory and the PE memories could handle only one or a limited amount of PE memories at the same time. Thus processing would stall in the entire array until all data transfers have been completed.

For example many neural networks for AI processing use residual blocks where an older feature map is added (or multiplied) to the latest feature map. Examples are ResNet and YOLOv3. Processing the feature maps can be greatly parallelized on ZZYX processors by reading, processing and writing a vast plurality of feature maps in parallel. Preloading, processing and unloading all the PE memories simultaneously will require a lot of time because processing stalls until all PE memories have been processed. It would be far more efficient if each kernel would comprise its own loop control and timing. After a startup time, each residual block kernel will request PE memory prefetching and unloading at a different time. So some kernels can process data, while others are performing memory transfers. With the double-buffering capability of PE memories the data transfers for preloading and unloading could be even performed in the background with little or no influence on data processing. In other words separated loop control provides the ability to process PE memory preload and unload independently from each other and some kernels can keep processing while others perform higher level memory transfers. Because those higher level memory transfers are now both overlapped with data processing and timewise staggered performance is greatly improved.

Example code for an example residual block kernel is shown below:

```
box 1, 7
_trg 0, term
    for 0, +1, 16          ;y
    _trg 1, term
    _on 0
    for 0, +1, 16          ;x
    mcar r0, lc0, lc1, 16  ;multiply constant add register
adr=y*16+x                 ;read map A
    _base [adr]
    peml r1, [r0]
    _base [adr]            ;read map B
    peml r2, [r0]
    add r1, r1, r2         ; or mul
    _base [adr]            ;write result layer
    pems [r0] , r1
``` box spans a 2×5 box anywhere in the ZZYX PE array.

for defines a loop.

trg is a so called pre-instruction, indicated by the underscore. Pre-instructions are fused with the following instruction. trg n, term defines that trigger signal n is set upon termination of the loop.

ZZYX supports up to 4 trigger signals within the scope of a box. Trigger signals can be used to signal the termination of loops or conditionally execute instructions based on comparisons.

_on n is another pre-instruction declaring that the following instruction is executed when trigger signal n is set.

mcar stands for multiply-constant add-register. It is the sibling instruction to mrac which stands for multiply-register add-constant.

_base is yet another pre-instruction. It is only valid in conjunction with a following PEM access and defines the base address of the PEM location in the virtual memory.

peml loads data from the PEM. Similarly, pems stores data to the PEM.

FIG. 25B shows a mapping of the above code to 7 PEs. Dataflow is strictly top down. The two peml instructions load two different feature maps through their respective local PE memories. The PE memories are updated with a new range of the feature maps as the address, calculated by the mcar instruction progresses. As above described, the PE memories (PEM) can double buffer. As soon as the address range leaves a first buffer, containing data of a first address range, and gets into the second buffer, containing data of a second address range, the first buffer can be preloaded with a data of the third address range according to the addresses generated by the two for counters and the mcar instruction.

The data loaded by the two peml instructions is added (in this example) and finally stored to a third PE memory by the pems instruction. As described for the PE memory load, PE memory store is also double buffered, yet the buffer operates obviously slightly different: As soon as the address range leaves a first buffer, now containing data stored to a first address range, and starts storing into the second buffer, which will contain data of a second, subsequent address range, the first buffer can be unloaded to PE memory, so that it is available for writing new data once the address range leaves the second buffer and double buffering restarts with the first buffer.

The code forms an algorithm kernel. It operates autonomously until the loop terminates and the termination is reported to the processor front end, indicating the used PE resources on the PE array (i.e. in the Execution Unit) are available for new instruction issue. Thus the kernel can be placed in a box, as it is done by the box instruction in the above code.

The box as shown in FIG. 25B would require a 2×5 arrangement, 2 PEs wide and 5 PEs deep. The shape is not ideal as the PEs in the box are obviously unused.

Figure 25D:
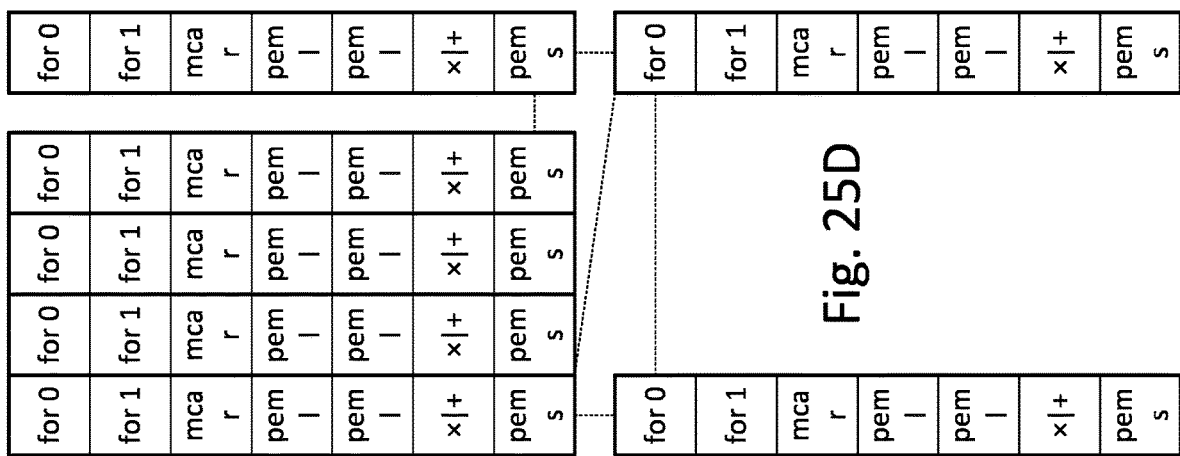
FIG. 25D is a diagrammatic illustration of an execution unit that includes an array of processing elements based on the mapping of FIG. 25C.

Accordingly FIG. 25C shows a denser arrangement of the code, mapped into a single column of 7 PEs. Many instances of this column could be issued and placed on the PE array, as shown in FIG. 25D, each operating on different feature sets and providing a high degree of parallelism.

One inventive step is to control the pipeline registers separately in each box, allowing each box to process data autonomously and independently of other boxes.

Each, or at least some of the PEs, might possibly stall processing within a box because they are executing for example multi-cycle instructions, and/or microprograms requiring multiple cycles to produce a result and/or memory operations such as load and/or store access to PE memory and/or said PE memory must be preloaded or unloaded to higher level memory, requiring the respective PE to wait unit the respective data transfer is performed.

A protocol is used to synchronize the box internal timing and data transfer. In the most simplistic implementation a busy signal indicates that a PE in busy and neither produces a result in clock cycle t, nor it will able to accept new operand data in clock cycle t+1.

In the preferred case a valid/busy protocol is used. Valid indicates valid operand data to downstream PEs. Busy indicates to upstream PEs that the PE is not capable of receiving new operands and processing must be ceased.

In this case the upstream PE receiving the busy signal will store its current result in clock cycle t in an intermediate register for later replay, abandon data processing itself and send the busy signal further upwards.

Downstream PEs will receive no valid signal for the incoming operand data and processing will automatically stall.

In one possible implementation the busy/valid protocol might be transmitted together with each data stream, similarly to the ready/acknowledge protocol used by the PACT XPP Technology reconfigurable processors in the prior art. Some examples are described in US patents U.S. Pat. Nos. 6,728,871, 7,581,076 and 8,312,200, all incorporated by reference. It shall be noted that in fact PACT's old ready/acknowledge protocol itself is a valid option for use according to described features. Yet, transmitting handshake information together with each data stream may increase hardware complexity drastically and thus a box-wide, global within a box variant is beneficial.

Ideally all PEs of a line within a box would produce a joint busy (or acknowledge) signal, but the signal may not cross box borders so that it has no impact on other possibly surrounding boxes.

Figure 24A:
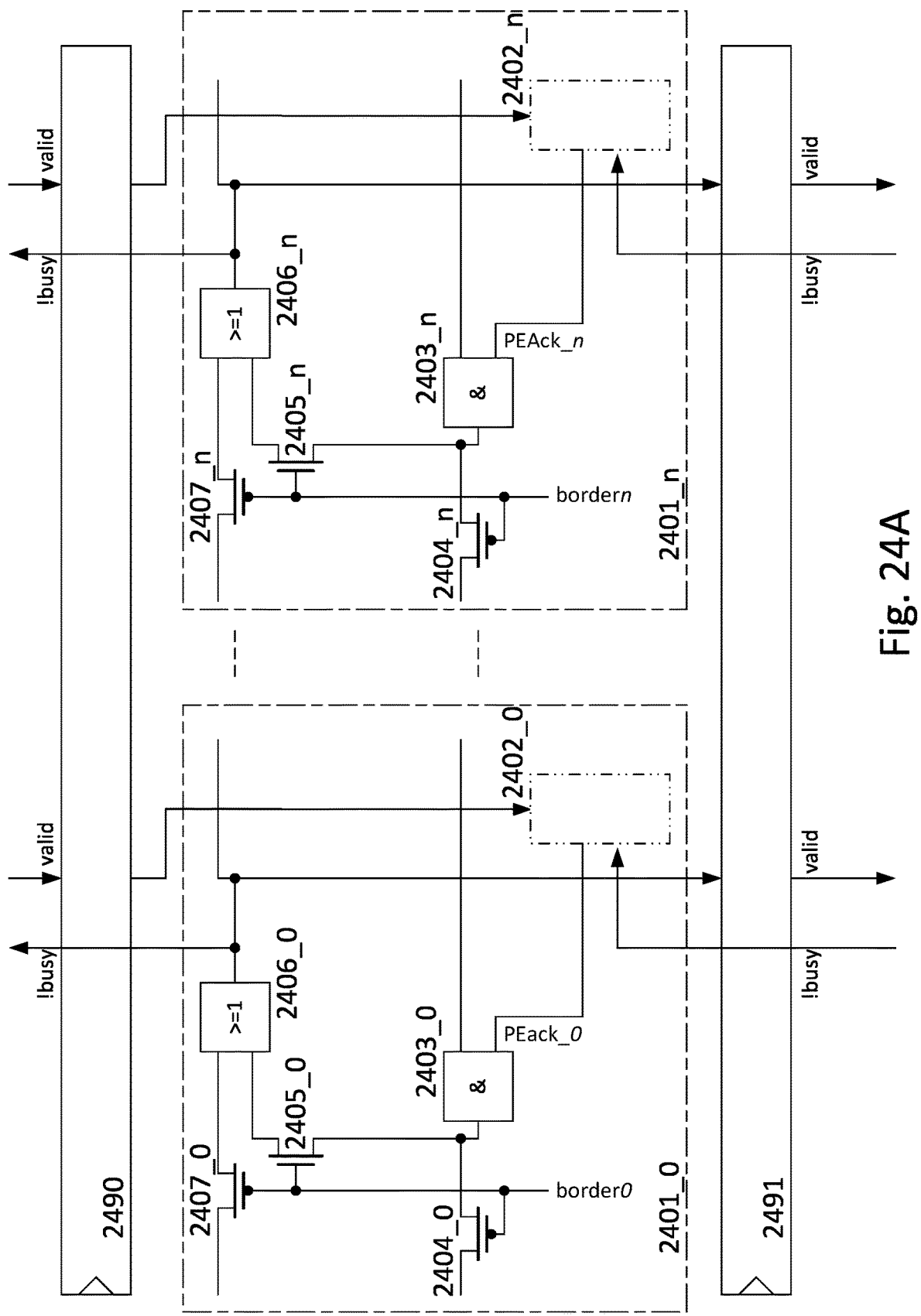
FIG. 24A is a diagrammatic illustration of example processing elements and pipeline registers and generation of box wide handshake signals for an example busy/valid protocol.

FIG. 24A shows the generation of box wide handshake signals for the example busy/valid protocol. Shown is a section of PEs (2401_0 and 2401_n) within a line of PEs in an Execution Unit, with pipeline registers above (2490) and below (2491) the line. The pipeline registers pipeline transmitted data and at least some control signals, in this example embodiment valid but not busy, from upstream PE lines (via 2490) and to downstream PE lines (via 2491). The busy logic of two PEs (2401_0 and 2401_n) is shown. A state machine (2402_0 and 2402_n) in each PE monitors incoming valid and busy signals and possibly other control signals, such as memory transfer protocols for PE memory data preloading from or unloading to higher level memory and/or control signals for multi-cycle operations such as division, and/or microprograms. In case data can be processed and data processing can be completed according to the instruction issued to the specific PE the state machine generates a PE internal local acknowledge signal (PEack_0, . . . PEack_n).

The acknowledge signals of all PEs in a line are AND-combined in a chain (2403_0 and 2403_n). Let us assume now that 2401_0 is the leftmost and 2401_n the rightmost PE within a software defined box. The signal border0 would be set together with instruction issue to indicate the last PE of a box at the left border. The signal bordern and all (not shown) border signals in between would not be set. Consequently the pass-transistor 2404_n would transmit the output of 2403_n to the left (and all further 2404 pass transistors in between but not shown would do the same for the respective AND-gates 2403). Finally 2404_n would block the further transmission of the AND-combined PEack chain. The output (jointPEack) of AND-gate 2403_0 is logic 1 when all PEs within said box in this chains have their respective PEack signals set. Because border0 is set, transmission gate 2405_0 will transmit the jointPEack signal to the OR-gate 2406_0. All other 2405 to the right of PE 2401_0 up to 2405_n will not transmit the output of the respective 2403. Driven by the border0 to bordern signals the leftmost transmission gate 2407_0 will block the signals from left of the box (because border0 is set) but transmit the signals through the OR-gate chain (2406_0 to 2406_n) to the right of PE 2401_0, because the border signals border1 to bordern are not set. Consequently each PE in between 2401_0 and 2401_n transmits a joint !busy signal (the logic inverse of jointPEack to the upstream PE stages and respectively a joint valid signal to downstream PE stages. PEack can be generated very early within an execution cycle. Typically the main state machine determines in the previous cycle if the next processing cycle will cause a stall. Thus PEack can be directly derived from a register output and enough time for crossing said chain of considerable length is available.

If no boxes are used (or only a single large box) and timing is controlled by the main loop controller the chain is obsolete and this all border signals can be set to avoid potential timing issues. Similarly in out-of-order mode, which is described in greater detail in [4], [7], [10], all incorporated by reference, all border signals (border0 to bordern) are set, isolating signal transmission in the chains.

Figure 24C:
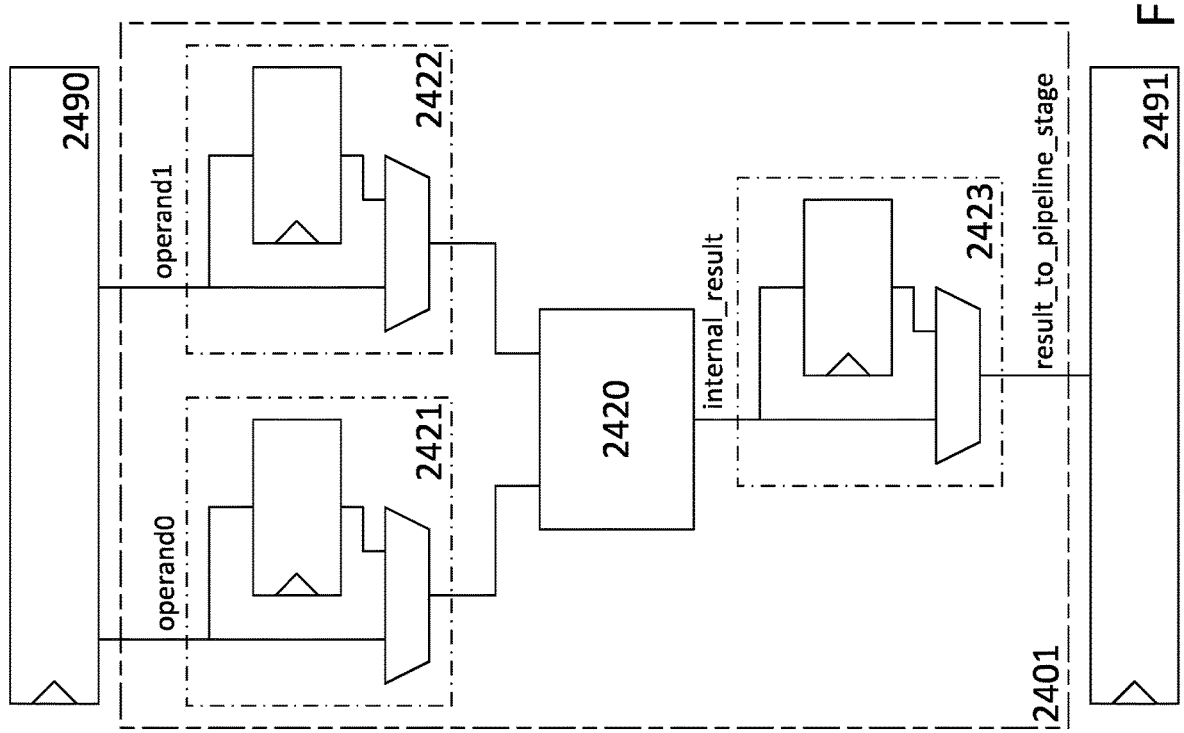
FIG. 24C is a diagrammatic illustration of an example datapath within a processing element.
Figure 24B:
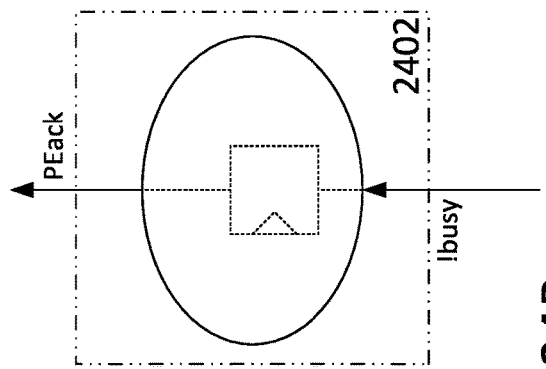
FIG. 24B is a diagrammatic illustration of propagation of a !busy signal through state machines.

FIG. 24B shows the propagation of the !busy signal through the state machines 2402 (i.e. 2402_0 to 2402_n). Of course the state machine is far more complex. To avoid the impression that the !busy signal goes asynchronously through the entire box, which would cause severe timing issues, the figure indicates that the signal is registered within the state machine logic before producing, jointly with other relevant signals and states, PEack.

FIG. 24C shows an example datapath within a PE. The PE core 2420 performs the actual data processing. It can be an arithmetic and/or logic unit, and/or a memory, and/or an interface, and/or a controller, and/or a processor. Operands (in this example embodiment 2) are received from the upstream pipeline stage 2490, result(s) (in this example embodiment 1) are sent to the downstream pipeline stage 2491.

In each operand path an additional register stage (2421 and 2422) might be located which, depending on the exact handshake protocol, can be used to selectively store operand data in case of a pipeline stall. Similarly in an additional register stage (2423) might be located in the result path to selectively store, depending on the exact handshake protocol, the result in case of pipeline stall.

In some embodiments, the handshake protocols do not control and/or affect the pipeline registers (e.g. by enabling or disabling the registers) as this may cause significant design issues and additional hardware overhead.

FIG. 26A shows the trigger logic for a PE. The trigger signals are arranged similar to the acknowledge generation in FIG. 24A, crossing complete lines of PEs. Yet in this example embodiment they solely go from left to right. Shown is one of the PEs (PE n, i.e. 2401_n).

Trigger signals can be used to signal the termination of a loop, progress of a loop, start and/or restart of a loop. Trigger signals can also be used to determine conditional execution, a comparison for example could set a trigger. Triggers could be flags such as a zero, negative, carry, overflow flag as known from processors (e.g. status registers). The execution of issued instruction can depend on the existence of a trigger signal, for example for conditional execution. Multiple trigger signals can be implemented. FIG. 26A shows trigger signal m. Other trigger signals, ZZYX processors support at present time 4 trigger signals per box, are implemented likewise.

The PE can generate a trigger signal by trigger logic 2601, for example by the result of a compare instruction, the carry of an adder or subtractor instruction, the zero, overflow, underflow, negative flag of any arithmetic instruction. The generated trigger is inserted by an OR-get (2602) to a feed through trigger line (fromLeftm_n−1 to toRightm_n+1) traveling from left to right through a row of PEs of the Execution Unit.

If the respective PE is located at the left border of a box (leftbordern is set), or PE is generating a trigger (mastern is set) the incoming trigger from the left (fromLeftm_n−1) is blocked by a disabled transmission gate (1303), so that it does not interfere with the box and/or the newly generated trigger value.

Trigger signal fromTopm_n is received from upstream through the pipeline register 2490. This incoming trigger signal might also be blocked, in that case by transmission gate 2604, if either the PE is located at the upper border of a box (topbordern is set) or PE is generating a trigger (mastern is set).

The two incoming trigger signals (fromLeftm_n−1 and fromTopm_n) are OR-combined by OR-gate 2605 and fed to the PE's enable logic 2606 and to 2602.

The trigger system of FIG. 26A allows for forwarding incoming triggers from top and left and newly generated triggers by the PE to travel right and down, until the transmission is blocked by receiving PEs in other boxes via their transmission gates 2604 and 2603 respectively.

FIG. 26B shows an example implementation of the enable logic 2606. A multiplexer selects the trigger signal on which the execution of the respective PE depends on and feeds the trigger signal to the PE's state machine 2402 for enabling or disabling execution. If the PE processes an unconditional state, enable is always set. In a slightly more complex implementation the multiplexer (2620) can be replaced by logic allowing a logic combination of the incoming triggers, so that processing is enabled if, for example, triggerIn0 AND triggerIn1 is set, or triggerIn0 OR triggerIn1, or triggerIn0 AND NOT triggerIn1.

A dedicated trigger might be used to control loops and conditional execution. Some algorithms entirely or in part do not stream. As an example Cholesky Decomposition is shown pseudocode:

```
for i = 0 to length(A) do /* next */
    for j = 0 to i do
        /* STREAM */
        s = 0
        for k = 0 to j − 1 do
            s += L [i, k] * L [j , k]
        end for
        /* SEQUENTIAL */
        if i == j /* on term k */
            L[i, j] = sqrt(A[i, i] − s)
            L' [j] = 1/L[i, j]
        else
            L[i, j ] = (A[i, j] − s) * L' [j]
        end if
    end for /* <<< NEXT TRIGGER */
end for
```

The first section /*STREAM*/ with the accumulation s+=L[i, k]*L[j, k] streams well and produces one accumulation per clock cycle. Yet the following section /*SEQUENTIAL*/ does not stream and disturbs the timing for at least two reasons:

1. It can process only after the accumulation of s has been completed.

2. The computation of Square Root (sqrt) and the Division are multi cycle operation which are not pipelined but require multiple clock cycles to produce a result.

This the middle loop for j (and ultimately outer loop for i) cannot continue iterating right after the terminate of loop k. Likewise loop k cannot restart iterating after terminating. First the completion of the sequential part has to be awaited.

The synchronization and/or timing in this code can be controlled using two kinds of trigger signals.

First, the if-condition is controlled by a trigger as described above. When loop k terminates it generates a termination trigger on which event the if-clause is enabled for execution, and based on the handshake signals all code below.

Second, upon completion of the if-clause, another trigger is generated enabling the iteration of the for i loop, iteration or restart of the for j loop and the restart of the for k loop.

This trigger has a slightly different semantics. While the above described trigger can be described with 'on', i.e. on the event of the trigger an action is triggered, this second trigger type is best described with 'next'. The event of this trigger signals triggers the next loop and/or code clause execution. In other words, the code is executed for one time after startup, i.e. issue of the loop and/or code clause, but the next (i.e. following) execution run stalls until the next-trigger signal arrives.

Theoretically the next-trigger signal can be produced and transmitted according to the trigger described above and in FIG. 26A and FIG. 26B, however in the opposite directions. But the trigger crosses usually a vast plurality of vertical PE lines. Each pipeline stage causes a clock cycle delay which largely unnecessarily increases the execution time without producing any data.

Figure 26C:
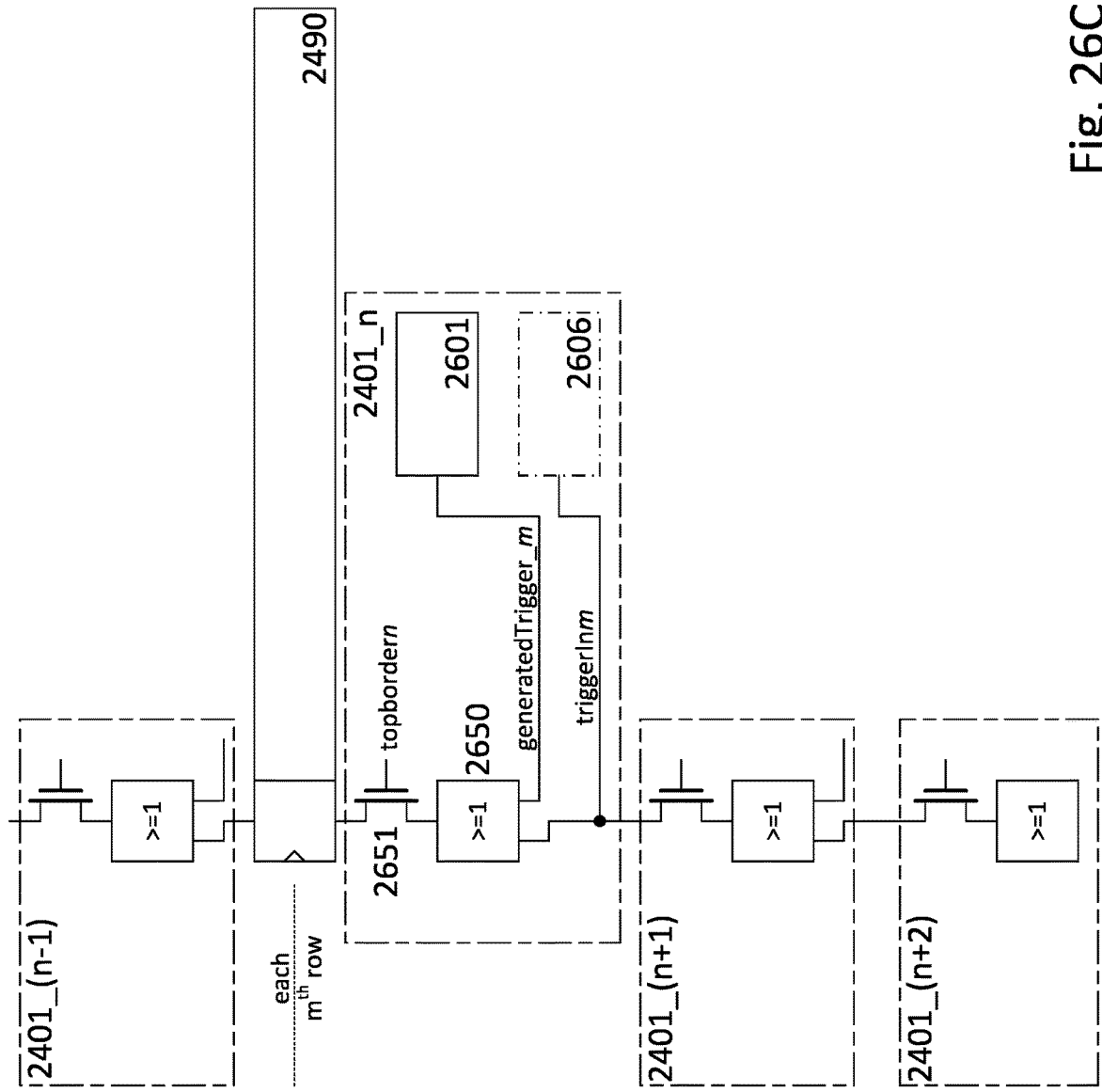
FIG. 26C is a diagrammatic illustration of an example fast trigger path for processing elements and pipeline registers.

Therefore an additional fast trigger path might be implemented according to FIG. 26C.

As described above the signal traverses in the opposite direction, i.e. bottom up. The trigger is generated by PE's 2401_n trigger logic 2601. It is logically OR-combined by an OR-gate (2650). A pass transistor 2651 isolates the vertical transmission at the box borders as described in FIG. 26A. The incoming trigger signal from below is fed to the PE's enable logic 2606. Only at each $m^{th}$ row a pipeline stage (for example 2490) is inserted in the trigger path to allow for low trigger transmission latency. m is defined by the used silicon technology and chip's target frequency. As shown there is not pipeline register in the trigger path coming from PE's below, i.e. 2401 (n+1) and 2401 (n+2).

Usually the next trigger is used in the leftmost column of a box to trigger the initial for loop counter. Yet each column has implemented and can use its own dedicated next trigger path. Multiple sources within a column can set the trigger signal through a logical 'wired' OR-combination established by the OR-gates 2605 in each PE.

In alternative embodiments, the trigger can also be generated by other columns and supplied by a horizontal logic similar to 2603, 2605, and 2602. Yet, in difference to FIG. 26A the signal transmission would preferably be in the opposite direction, from right to left. The horizontal signal could be logically AND- or OR- combined with the vertical signal. Its logic combination could further be programmable.

Multiboxes

In the prior art processor (CPU) technology and in particular graphic processor (GPU) technology and other array technologies such as Field Programmable Gate Arrays (FPGA) each of multiple program instances has to be issued or respectively configured. It is not possible in the prior art to issue or configure a single program instance and duplicate and span it on the processor execution resources (e.g. FPGA array or ZZYX ALU Block/Execution Unit) while issuing or configuring it. Naturally it is very time consuming to issue or configure a single kernel multiple times and consequently decreases both, performance and power efficiency. Ideally a kernel would be issued or configured only one and while issuing or configuring it, it is at the same time and step duplicated and repeatedly spanned over the execution resources.

One feature of the present disclosure is the introduction of a span instruction spanning a single code instance over an area of execution resources:

span ax, ay repeats and spans a following box containing a code kernel ax times in x direction and ay times in y direction.

Figure 27B:
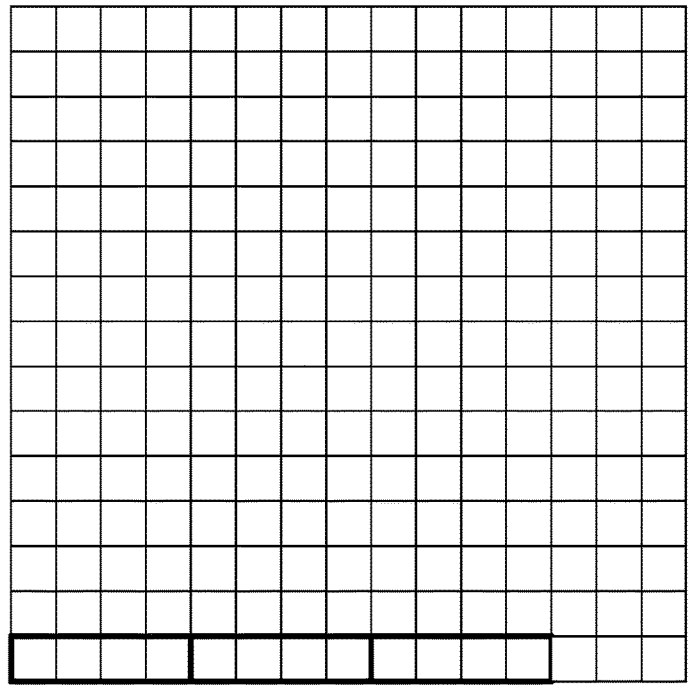
FIGS. 27A to 27C are diagrammatic illustrations of example arrangements of execution resources.
Figure 27A:
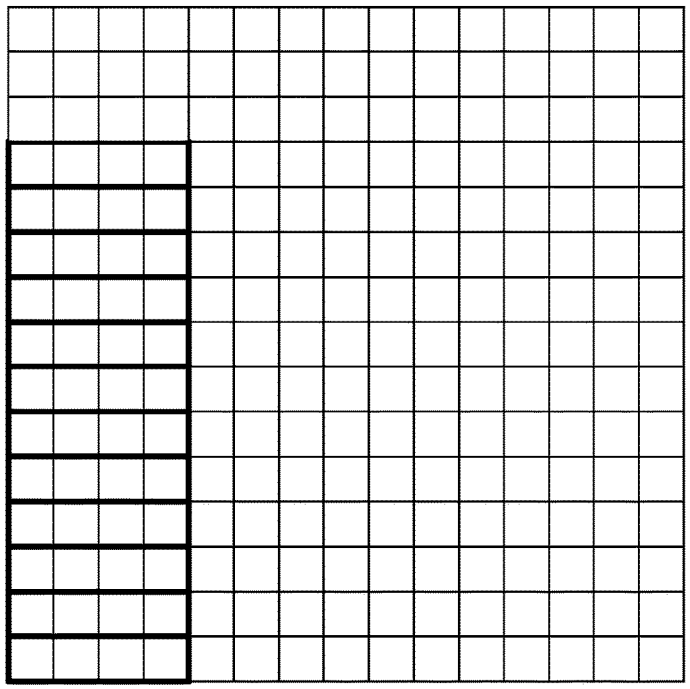
Figure 27C:
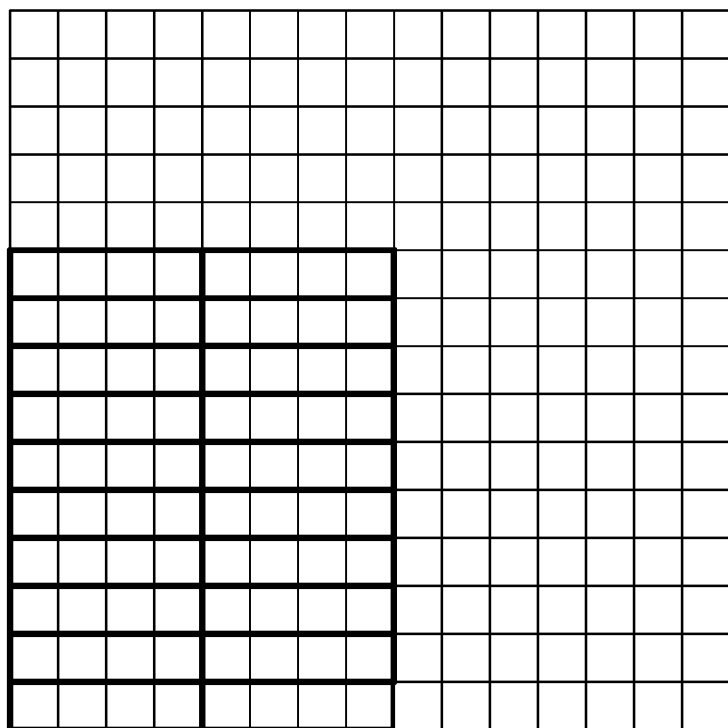

FIG. 27A to 27C show an example 15×15 execution resource. The execution resource might be an arrangement of CPUs, and arrangement of CPU execution units, an arrangement of GPUs, an arrangement of GPU execution units, an FPGA field, or a ZZYX ALU Block/Execution Unit; or any combination thereof. One skilled in the art will of course understand that the definition is not limited to the mentioned examples.

FIG. 27A shows a
span 12, 1
box 1, 4
combination.

Twelve boxes, each a size of 1×4 processing elements, are replicated horizontally on the execution resource with a single issue or configuration of the kernel contained in the box.

Within the scope of spanning the definition of a processing element might be extended according to the basic environment these features are applied to; a processing element can be, for example, a CPU, or GPU, or CPU execution unit or GPU execution unit, an FPGA, a FPGA logic cell (e.g. CLB,) or a FPGA processing cell (e.g. DSP unit), or a processor on an FPGA; and of course it can be a PE on ZZYX processors. One skilled in the art will of course understand that the definition is not limited to the mentioned examples.

FIG. 27B respectively shows the vertical spanning and replication of
span 1, 3
box 1, 4

Three boxes, each 1×4 processing elements large, are replicated vertically on the execution resource with a single issue or configuration of the kernel contained in the box.

FIG. 27C respectively shows the 2-dimensional spanning and replication of
span 10, 2
box 1, 4

Twenty boxes, each 1×4 processing elements large, are replicated 2-dimensionally on the execution resource with a single issue or configuration of the kernel contained in the box.

Naturally this method can be extended to multiple, more than 2-dimensions, for example 3-dimensions.

Spanning requires modified processing element addressing. Each issued instruction or configuration must address multiple processing elements.

In some embodiments, this is achieved by enhanced address decoders. FIG. 28 shows the X address decoder (2801) and Y address decoder (2802) of a PE. The decoders receive the PE X address (2803) and respectively Y address (2804). Further the decoders receive the box X size (2805) and respectively box Y size (2806) and X span (2807) and respectively Y span (2808).

The decoders produce a unique BX (2809) and BY (2810) box number, identifying the position address of a box (box address). For example the box in the upper left corner has the identification BX=1 and BY=1, the next box to the right has the identification BX=2 and BY=1, while the box below has the identification BX=1 and BY=2. The identification is accessible by each box by some predefined registers. For example within boxes registers r14 and r15 could be reserved, at least in the first PE line of the box for transmitting BX and BY, i.e. r14 represents BX and r15 represent BY. This allows for example address generation within the boxes, so that each box can uniquely compute memory addresses such as feature maps or matrices or even sections within feature maps or matrices.

Each decoder (2801) and (2802) produces a match signal to indicate that the X and respectively Y address are in range and match. The two signals are AND-combined to generate the enable signal (2811) for enabling a PE to accept the transmitted instruction or configuration.

Figure 29:
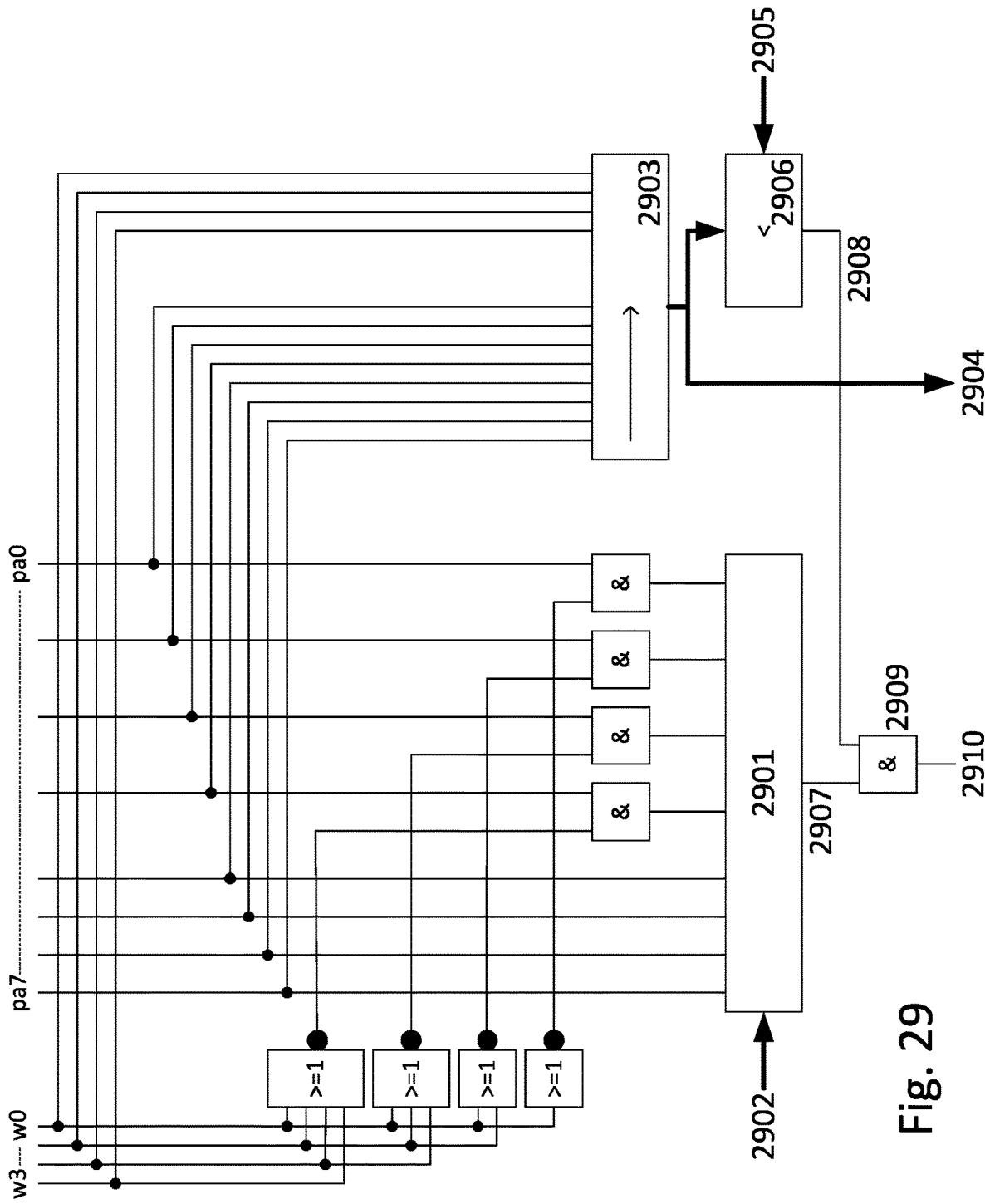
FIG. 29 is a diagrammatic illustration of an example implementation of a decoder.

FIG. 29 shows an example implementation of a decoder (2801 or 2802). The decoder accepts box size of 1, 2, 4, or 8 PE wide (in case of 2801) or tall (in case of 2802) and can easily be extended to a $2^n$ box size. One skilled in the art will understand that not $2^n$ aligned box sizes are also possible but require more complex decode logic. The box size is provided by bit w0 . . . w3 and encoded as such:

| w3 | w2 | w1 | w0 | Box size | Mask address bits | Shift box address |
|----|----|----|----|----------|-------------------|-------------------|
| 0  | 0  | 0  | 1  | 1        | pa3...0           | 0                 |
| 0  | 0  | 1  | 0  | 2        | pa3...1           | 1                 |
| 0  | 1  | 0  | 0  | 4        | pa3...2           | 2                 |
| 1  | 0  | 0  | 0  | 8        | pa3               | 3                 |

In an example array of 256×256 PEs the row and column addresses are 8 bit wide. pa7 . . . 0 are the constant addresses of the physical row and respectively column location of a PE. A mask logic comprising OR-gates to determine the width pattern provided by w3 ... 0 sets the masked physical addresses to logic 0 using AND-gates. The masked physical address is transmitted to a comparator logic (2901) comparing it with the PE address (2902) sent with the issued instruction to select the instruction's target PE. The comparator produces a match signal (2907) if the addresses match.

Depending on the box width a barrel shifter (2903) shifts the physical address to the right to produce the box address (2904) according to the table above. For example if the row/column width of a box is 1, no shifting is done: the box row/column address is equal to the physical row/column address of the PE; if the row/column width of a box is 4, the physical address is shifted by 2: the box row/column address is equal to the physical row/column address bits pan ... pa2.

The box address (2904) is further compared with the span width (2905) by a less-then comparator (2906). If the box address is smaller than the number of boxes which should be spanned, the PE is in range for receiving the instruction or configuration and a range signal (2908) is set to logic 1.

If the range signal (2908) is set AND (2909) the addresses match, the PE is enabled for receiving and executing the issued instruction or configuration and a respective enable signal (2910) is generated.

Clocking and Supply Voltage

The clock frequency of an ALU-Block or a ZZYX core might depend on a variety of parameters and can be flexibly set.

For example the clock frequency might be reduced if the number of pending operations, for example the number of scheduled operations of currently executed threads, tasks or applications in general, is low. For example if the system is idle or only low performance applications are executed. Applications limited by external data rate, e.g. from a wired or wireless WAN or LAN network such as the internet, can reduce the clock frequency to match the incoming or outgoing data rate.

When the number of pending operations is high the clock frequency can be increased. For example if many tasks or threads or applications are pending—or high processing performance is required. Games or AI processing, such as voice or image recognition are examples. ResNet and YOLO require high bandwidth and processing performance for recognizing objects in video streams.

The clock frequency might be temporarily increased while the temperature of the silicon chip and/or chip package is low. Once the temperature increases over a specific, in some embodiments flexible and settable, threshold, frequency is reduced to meet the chips and/or packages power budget.

The clock frequency can be set to a minimum for only retaining data values in memories or even to zero, for example when the memories are previously off-loaded to a higher level memory or clock independent or non-volatile memories are used.

In particular the clock frequency of only portions of a ZZYX core might adaptable. For example the processor front end (e.g. the instruction fetcher and/or instruction decoder and/or instruction scheduler and/or instruction issue unit) might have a selectable clock frequency, e.g. independently from the array of the ALU-Block. For example the clock frequency of the front end or parts of the front end might be reduced when the ALU-Block operates statically and/or FPGA like in loop acceleration mode. The clock frequency of the front end might be boosted to a maximum when a many instructions are simultaneously required and the processor internal buffers (e.g. fill level of reservation station or number of waiting elements in the ALU-Block are low).

Similarly the clock of unused or waiting elements in the ALU-Block array might be reduced.

Similarly the clock of unused PE Memories (PEM) or cache slices might be reduced.

In particular the processor might have a sleep mode, for example in which all cores or ALU-Blocks are entirely switched off with a minimum or zero clock frequency and only one core or ALU-Block is slowly clocked, ideally only partially with all other elements and/or units being switched off, for monitoring a request (e.g. by a user to power up) and subsequently in response, rising its clock frequency and immediately or in a subsequent step the clock frequency of other cores, allowing to power up the processor.

Specific units and/or elements, for example the front end or parts of the front end, such as the instruction fetcher and/or instruction decoder and/or instruction scheduler and/or instruction issue unit; and/or load/store units; and/or PE memories and/or cache slices; and/or ALU-Blocks and/or ALUs or elements of the ALU-Block, might have in addition to an individually selectable frequency an individually selectable power supply. This allows setting the supply voltage in accordance with the selected frequency for reducing power consumption. Lower frequencies (f) allow for lower voltage (V). Lower voltage significantly reduces the processor's dynamic power ($P_{dyn}$) dissipation according to $P_{dyn} = CV^2 f$.

Figure 30:
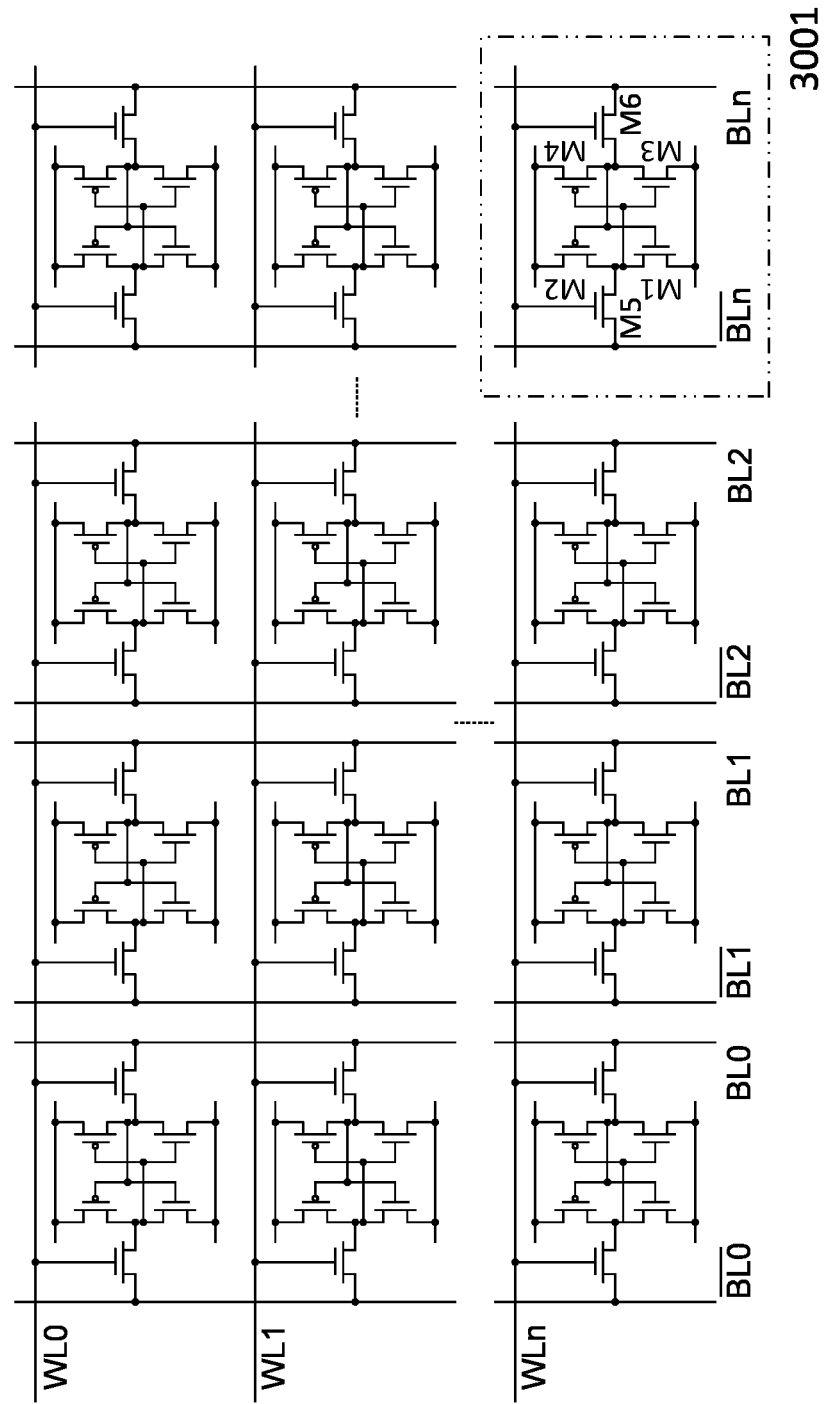
FIG. 30 is a diagrammatic illustration of a standard static memory cell arrangement.

FIG. 30 shows a typical SRAM memory block with a typical SRAM cell (3001) made up of six MOSFETs. Each bit in an SRAM is stored on four transistors (M1, M2, M3, M4) that form two cross-coupled inverters. This storage cell has two stable states which are used to denote 0 and 1. Two additional access transistors serve to control the access to a storage cell during read and write operations. In addition to such six-transistor (6T) SRAM, other kinds of SRAM chips use 4, 8, 10 (4T, 8T, 10T SRAM), or more transistors per bit. Four-transistor SRAM is quite common in stand-alone SRAM devices (as opposed to SRAM used for CPU caches), implemented in special processes with an extra layer of polysilicon, allowing for very high-resistance pull-up resistors. The principal drawback of using 4T SRAM is increased static power due to the constant current flow through one of the pull-down transistors.

Access to the cell is enabled by the word line (WLn) which controls the two access transistors M5 and M6 which, in turn, control whether the cell should be connected to the bit lines: $\overline{BLn}$ and BLn. They are used to transfer data for both read and write operations. Although it is not strictly necessary to have two bit lines, both the signal and its inverse are typically provided in order to improve noise margins. During read accesses, the bit lines are actively driven high and low by the inverters in the SRAM cell. This improves SRAM bandwidth compared to DRAMs—in a DRAM, the bit line is connected to storage capacitors and charge sharing causes the bit line to swing upwards or downwards. The symmetric structure of SRAMs also allows for differential signaling, which makes small voltage swings more easily detectable. Another difference with DRAM that contributes to making SRAM faster is that commercial chips accept all address bits at a time. By comparison, commodity DRAMs have the address multiplexed in two halves, i.e. higher bits followed by lower bits, over the same package pins in order to keep their size and cost down.

The size of an SRAM with m address lines and n data lines is 2m words, or 2m×n bits. The most common word size is 8 bits, meaning that a single byte can be read or written to each of 2m different words within the SRAM chip. Several common SRAM chips have 11 address lines (thus a capacity of 2m=2,048=3d words) and an 8-bit word, so they are referred to as "2k×8 SRAM".

An SRAM cell has three different states: standby (the circuit is idle), reading (the data has been requested) or writing (updating the contents). SRAM operating in read mode and write modes should have "readability" and "write stability", respectively. The three different states work as follows:

Standby

If the word line is not asserted, the access transistors M5 and M6 disconnect the cell from the bit lines. The two cross-coupled inverters formed by M1-M4 will continue to reinforce each other as long as they are connected to the supply.

Reading

In theory, reading only requires asserting the word line WLn and reading the SRAM cell state by a single access transistor and bit line, e.g. M6, BLn. However, bit lines are relatively long and have large parasitic capacitance. To speed up reading, a more complex process is used in practice: The read cycle is started by precharging both bit lines $\overline{BLn}$ and BLn, to high (logic 1) voltage. Then asserting the word line WLn enables both the access transistors M5 and M6, which causes one bit line BLn voltage to slightly drop. Then the BL and BL lines will have a small voltage difference between them. A sense amplifier will sense which line has the higher voltage and thus determine whether there was 1 or 0 stored. The higher the sensitivity of the sense amplifier, the faster the read operation. As the NMOS is more powerful, the pull-down is easier. Therefore, bit lines are traditionally precharged to high voltage. Many researchers are also trying to precharge at a slightly low voltage to reduce the power consumption.

Writing

The write cycle begins by applying the value to be written to the bit lines. If we wish to write a 0, we would apply a 0 to the bit lines, i.e. setting $\overline{BLn}$ to 1 and BLn to 0. This is similar to applying a reset pulse to an SR-latch, which causes the flip flop to change state. A 1 is written by inverting the values of the bit lines. WL is then asserted and the value that is to be stored is latched in. This works because the bit line input-drivers are designed to be much stronger than the relatively weak transistors in the cell itself so they can easily override the previous state of the cross-coupled inverters. In practice, access NMOS transistors M5 and M6 have to be stronger than either bottom NMOS (M1, M3) or top PMOS (M2, M4) transistors. This is easily obtained as PMOS transistors are much weaker than NMOS when same sized. Consequently, when one transistor pair (e.g. M3 and M4) is only slightly overridden by the write process, the opposite transistors pair (M1 and M2) gate voltage is also changed. This means that the M1 and M2 transistors can be easier overridden, and so on. Thus, cross-coupled inverters magnify the writing process.

Bus Behavior

RAM with an access time of 70 ns will output valid data within 70 ns from the time that the address lines are valid. But the data will remain for a hold time as well (5-10 ns). Rise and fall times also influence valid timeslots with approximately 5 ns. By reading the lower part of an address range, bits in sequence (page cycle) one can read with significantly shorter access time (30 ns).

Figure 31:
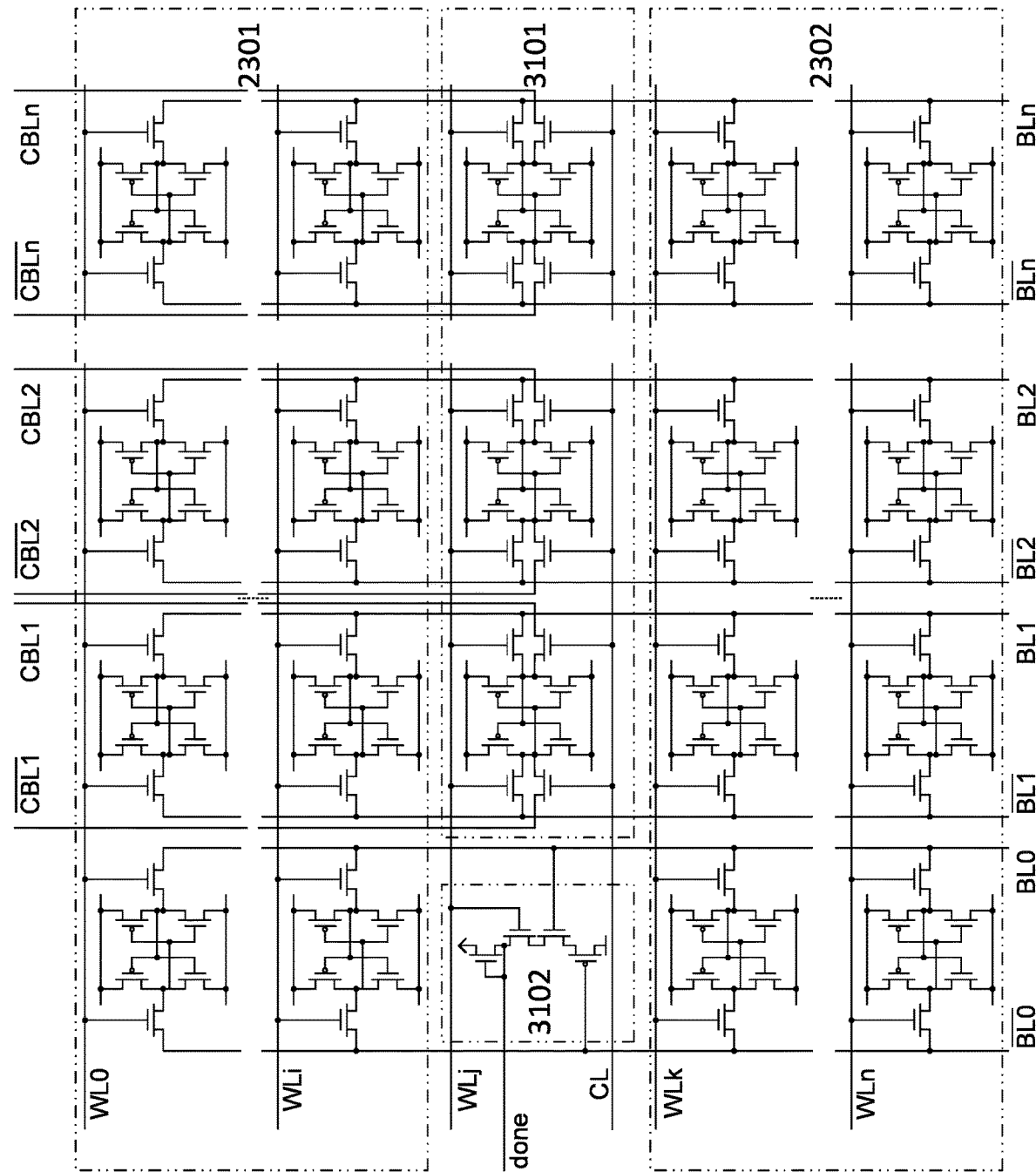
FIG. 31 is a diagrammatic illustration of a standard static memory cell arrangement including a dual memory and control signal line.

FIG. 31 shows an example enhanced SRAM memory block that implements features of 2399 of FIG. 23A. Memory bank 2301 is implemented from Word-Line WL0 to Word-Line WLi, memory bank 2302 is implemented from Word-Line WLk to Word-Line WLn. The Word-Lines WL0 to WLi, WLj, and WLk to WLn form Word-Line bundle 2309. BL0 to BLn form the data bundle dta (2311) with $\overline{BLn}$ and BLn being differential signal pairs.

The PEM controller 2305 requires interfacing and data exchange with the cache controller, e.g. to exchange address information such as 2308. Usually a dedicated port or register would be used for providing the respective information to the cache controller. Having such a port or interface for each of the PEM complicates system architecture and design, in particular because an additional bus structure is required, resulting in silicon area and timing issues. In FIG. 31 the data exchange between the controller 2305 and the cache controller is implemented using dual ported memory (3101) cells located in the PEM (i.e. cache bank) address space and being readable and writeable from both controllers. These dual ported memory cells might be implemented within a part of a memory line (as shown in FIG. 31), an entire memory line, or multiple memory lines. Accordingly separate (differential) data lines for data exchange with controller 2305 are implemented (CBL1 to CBLn). The dual ported memory cells are selected for data access by WLj from the cache controller and by CL form PEM controller 2305.

The request line (req, 2307) might be implemented such a dual ported memory cell according to 3101.

In some embodiments, status signals sent from the cache controller to the PEM controller 2305 might be implemented using a driver structure compatible with an SRAM cell, such that, according to the example 3102 shown in FIG. 31, WLj enables the driver and $\overline{BLn}$ and BLn generate the data signal. The driver according to 3102 can be used to transmit a done-signal (done) from the cache controller to PEM controller 2305, indicating that the loading or off-loading of data of a memory bank (e.g. 2301 or 2302) had been finished by the cache controller.

The described memory hierarchy and cache system is particularly efficient and performant when combined with a higher level memory architecture and/or system as described hereinafter:

Parallel processors and parallel computers are known in the state of the art. One of the major issues of parallel computing is managing the system memory. Several memory architectures have been implemented in the past, for example Unified and Non-Unified Memory Architectures (UMA, NUMA).

Recent multi-core processors use a cache hierarchy combining the memory channel of each of the processors into a single channel ultimately connecting to a monolithic main memory.

The requirements for data transfer rates, memory bandwidth and access time requirements are tightened by a plurality of processors accessing the system memory. This is addressed by wider parallel buses to the memory.

Another concern of this patent is to increase the amount of parallel memory accesses per clock cycle. In modern applications, e.g. such as video encoding and/or decoding, load/store operations accessing the memory hierarchy can amount to 30% or even more of the total number of instructions of an application. In addition to latency the limitation of sequentially accessing the memory hierarchy significantly reduces the processor performance and potentially prohibits other parallel executions.

This disclosure describes a novel system memory architecture for multi-core processors and parallel processor systems.

Parallel Access Memory System

In the patents [1-11] and [2-11] are memory architectures described, comprising a plurality of parallel accessibly memory systems, each defined by a base address. A plurality of address generators and/or load/store units, each dedicated to a specific base address are capable of accessing the memories in parallel.

However, analysis of software code has shown that often a plurality of addresses defined by a joint base address should be accessed in parallel to increase the processor performance.

Transferring a plurality of data words in a single transfer cycle is beneficial in a number of respects, e.g. reduced power dissipation and quicker availability of operand data. Particularly latencies for loading data can be avoided and/or limited. In the past high level language compilers (e.g. GNU GCC) and/or programmers limited the effects of load latency by placing the load instruction and the instructions requiring the loaded data as operand as far apart as possible and moving unrelated instructions in between. The unrelated instructions required ideally the same or more time for execution than the data to be loaded and available. However with increasing instruction level parallelism (ILP) the execution time for those unrelated instruction becomes significantly reduced, while the load latency remains. Parallel execution units, such as e.g. the ALU-Block of ZZYX processors (reference is made to [1-11]) and/or VLIW processors, can process many instructions in a single clock cycle, exposing the load latency. For example ZZYX ALU-Blocks can execute in some embodiments 16 instructions per clock cycle, in future embodiments even more; today's VLIW processors execute typically 4 to 8 instructions within a cycle; CISC processors such as Intel's x86 processors (e.g. Pentium, Core2, Sandybridge) provide similar instruction level parallelism.

Vector computers or processors having vector units such as Intel MMX, SEn and/or ARM Neon software can combine a plurality of data packets into a vector. As such a very wide data vector comprising a plurality of data words is simultaneously accessible in the prior art. However, the data vectors have to be predefined and the combination of data words has to be explicitly described and managed in software. It is not possible in the prior art to access random data words simultaneously.

However, often instructions operating on rather unrelated data words could be executed in parallel but no packing into a vector representation is described in the software and/or can be optimized by the compiler. Also often it is not worth to spend the effort packing data words into vectors, as the effort for packing reduces the performance benefits of vector processing.

This deficit is solved by described features, in which random words within a vicinity of a base address can be simultaneously accessed in parallel. In some embodiments the words are located above a base, e.g. in a range of 0 . . . 1023 addresses, in other embodiments the vicinity might stretch in the positive and negative direction and may for example range from −511 . . . +511 of the base. Typical ranges (offset sizes added to the base address) are today in the range of 26 to 210, but might extend to 216 or more in the future.

It is therefore proposed to combine multiple memory accesses based on the same base address and perform them in parallel. Most code will benefit already from two (2) simultaneous accesses per clock cycle, however depending on the implementation even more accesses may be performed in parallel, e.g. 16, 24, . . . . However, in some embodiments, four (4) accesses can be performed in parallel.

In some embodiments, load and store accesses can be mixed together, so that one single access comprises both, load and store request. The simplest implementation can perform one load and one store access in parallel.

Basically the hardware can sort opcodes, e.g. within a Trace-Cache, Reorder Buffer or Reservation Station and combine (fuse) a plurality of opcodes into a single instruction. Reference is made e.g. to [8-11] chapter 58. However, in some embodiments the high level language compiler (e.g. C, C++ compiler) and/or the respective tool chain (e.g. assembler) combines the respective memory operations together in one single opcode (if the respective processor implementation provides such a single-cycle multi-data memory access instruction) and/or arranges the sequence of instructions such, that the respective instruction are grouped together in close vicinity, preferably without any other unrelated instructions in between. This optimizes the execution in the processor hardware as either no fusion is necessary (if a respective opcode is provided) or fusion is greatly simplified.

In addition to the processor core, the memory hierarchy has to support the simultaneous plurality of memory accesses. In the prior art, large and power hungry multi-port memories are used. One aspect of described features is to provide an efficient multi access memory.

Figure 5:
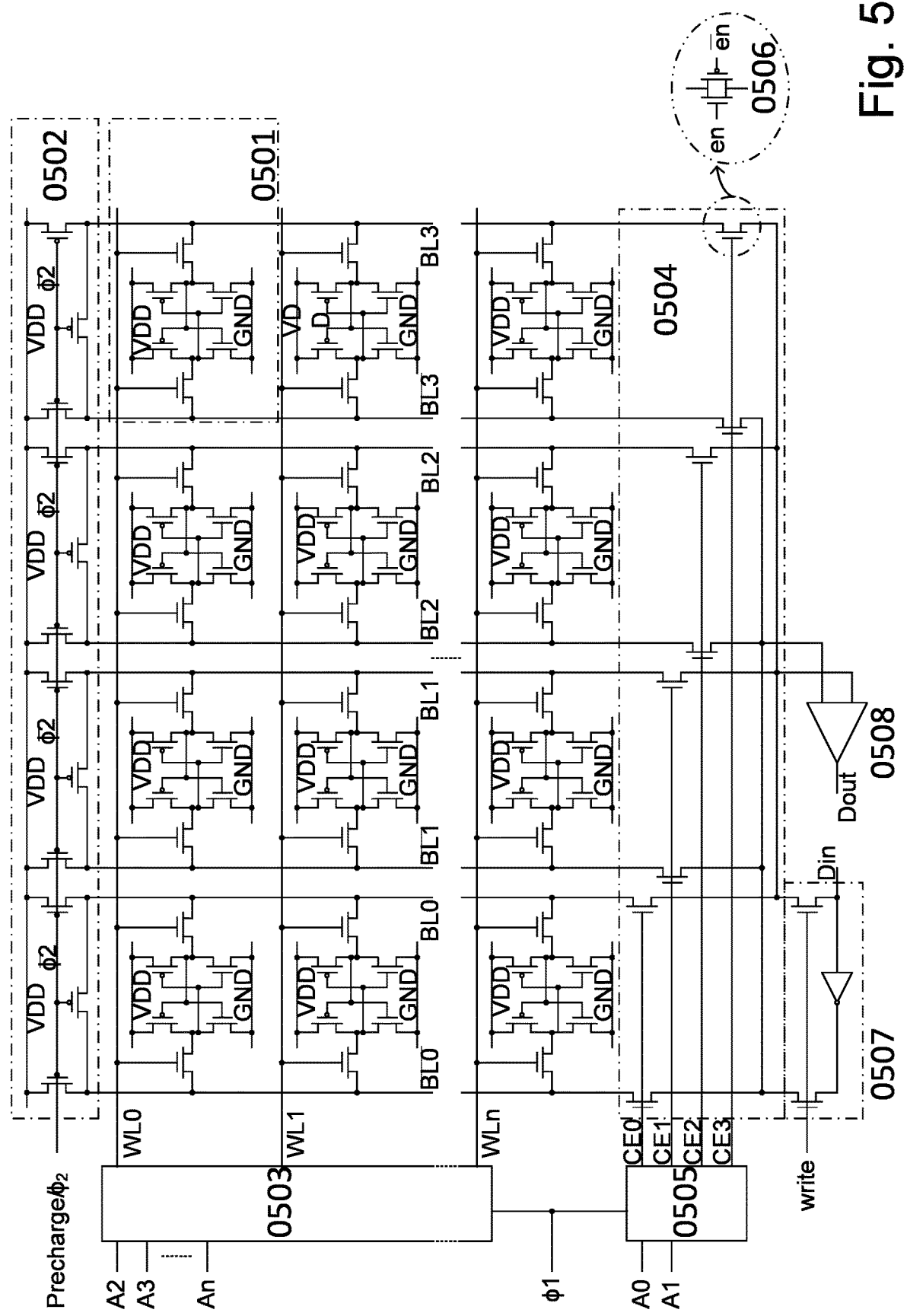
FIG. 5 is a diagrammatic illustration of an example implementation of a static random access memory (SRAM)

FIG. 5 shows an example implementation of a 1-bit SRAM. The example SRAM comprises an array of 4 columns by n rows (the first 2 rows and last row is shown) of SRAM cells (0501).

Precharge circuitry (0502) precharges the bitlines (BLn). A row decoder (0503) enables the wordlines (WLn) selecting the row to be accessed, depending on the address of the bit to be accessed (A2 . . . An).

The respective column is selected via pass transistors (0504), driven by a column decoder (0505) based on addresses A1 and A0. Alternatively, improving signal quality and speed transmission gates (0506) might be implemented instead of pass transistors, increasing transistor count. Another design choice might be the use of multiplexers in place of 0504, reducing transistor count but increasing delay.

A write logic (0507) drives the bitlines for writing data into the selected SRAM cell (0501). Read data is generated using a sense amplifier (0508).

SRAMs are well known and plenty of descriptions and design choices are available in literature. For example reference is made to [9-11].

Figure 5A:
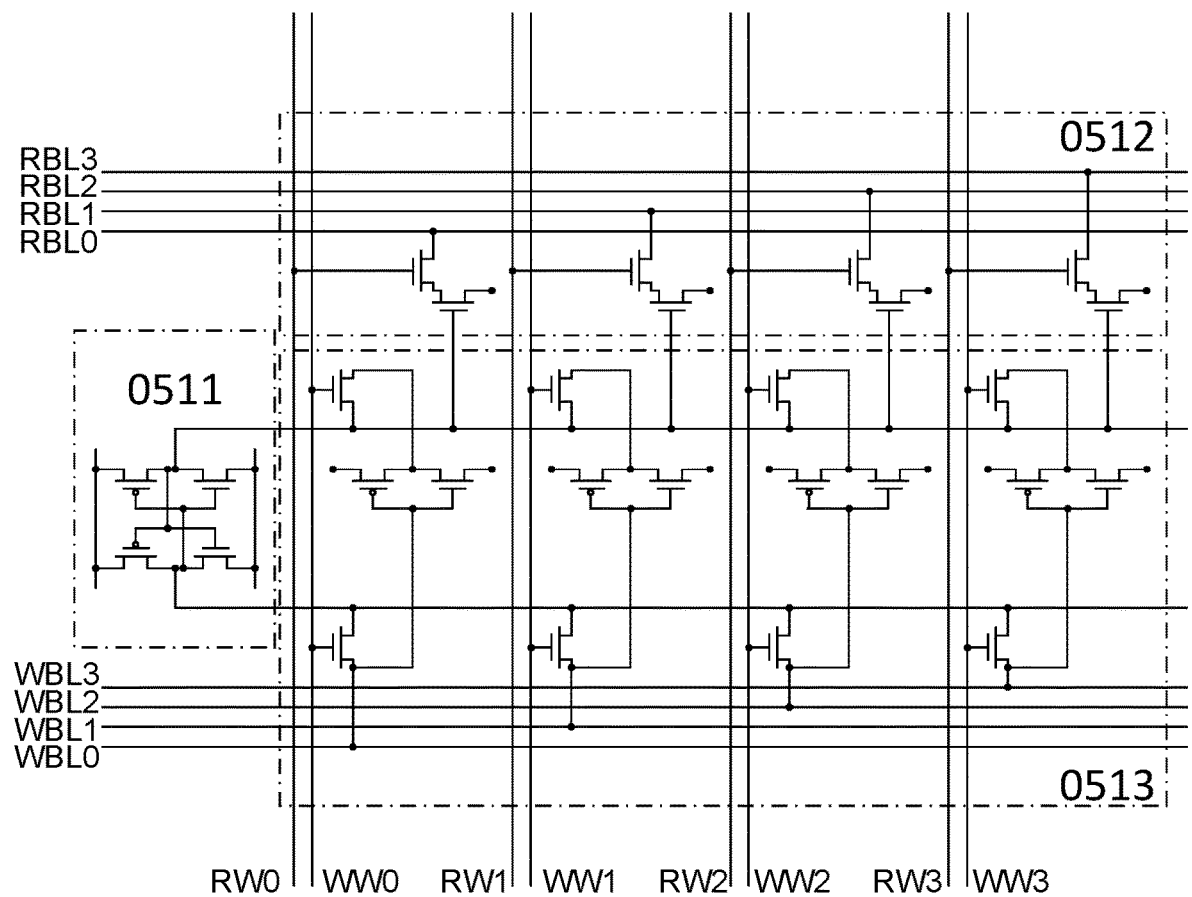
FIG. 5a is a diagrammatic illustration of an example multiport SRAM cell.

FIG. 5a shows an example 4-port SRAM cell of the state of the art as an example of a multiport SRAM cell. The cross coupled inverters (0511) are surrounded by additional read (0512) and write logic (0513) for the 4 ports. Write Bit Line 0 (WBL0) represents the write data bit of port 0, WBL1 for port 1 and so on. Respectively Read Bit Line 0 (RBL0) is the read data bit of port 0, and so on. Each port has its specific Read Word Line (RWn) enable the read drivers and Write Word Line (WWn) for triggering the respective write logic.

Multiport SRAMs are well known and plenty of descriptions and design choices are available in literature. For example reference is made to [9-11].

The port logic requires significantly more resources than the SRAM cell itself, driving area and power consumption. Further, the lack of differential bit lines negatively impacts the noise stability.

Assembly code analysis has shown that in many modern applications a great amount of consecutive memory accesses happen to a close vicinity of a few base addresses, e.g. a stack pointer and/or other pointers to data structures or constants. A great amount of parallelism is exploitable if at least within a range of 256 or 512 words of the base pointer parallel data accesses are possible, preferably independently for each base pointer. Consequently memory accesses based on a specific base pointer are preferably either grouped and/or fused into a block of accesses and/or managed by a dedicated multi-access instruction, so that a plurality of accesses within said example range of 256 or 512 words of the base pointer may be performed in parallel within the same cycle.

It is sufficient to support parallel access within said range by the memory, typically a cache which is usually SRAM based but might in some embodiments also be based on DRAM or other types of memories. This enables the optimization shown in FIG. 6. The example SRAM of FIG. 5 is shown, row 1 is hidden and the precharge circuitry is shown as a box for drawing reasons. The SRAM cells (0501) are in this example identical to those ordinary ones of FIG. 5.

The column circuitry has been duplicated into 2 different and independent column units 0512*a* and 0512*b*. The column unit may be designed differently as known in the prior art, e.g. using transmission gates and/or multiplexer structures as discussed in FIG. 5. Each column unit has its independent data in (0507*a* and 0507*b*) and data out (0508*a* and 0508*b*) interface and column decoder (0505*a* and 0505*b*).

The two column units form a two port memory in which two cells of the same row are parallel accessible. This certainly is a limitation compared to the random access multiport memories in the prior art. However, arranging the base address such that one row spans over the address range the limitation becomes minor. Several techniques managing base addresses are subsequently described.

Further column units (0512*a*, 0512*b*, . . . , 0512{n}) can be added to form 3-, 4- or any other kind of multiport interface. For example a 4-port memory would comprise 4 column units 0512*a*, 0512*b*, 0512*c*, and 0512*d*.

In this simple example embodiment, the base address is provided as row address using the address bits A2 to An. The offset to the base is provided independently for each port via the address bits P0A0 to P0A1 for port 0 and P1A0 to P1A1 for port 1.

Compared to FIG. 5*a* the overhead for simultaneously supplying a plurality of data accesses is greatly reduced.

Figure 6:
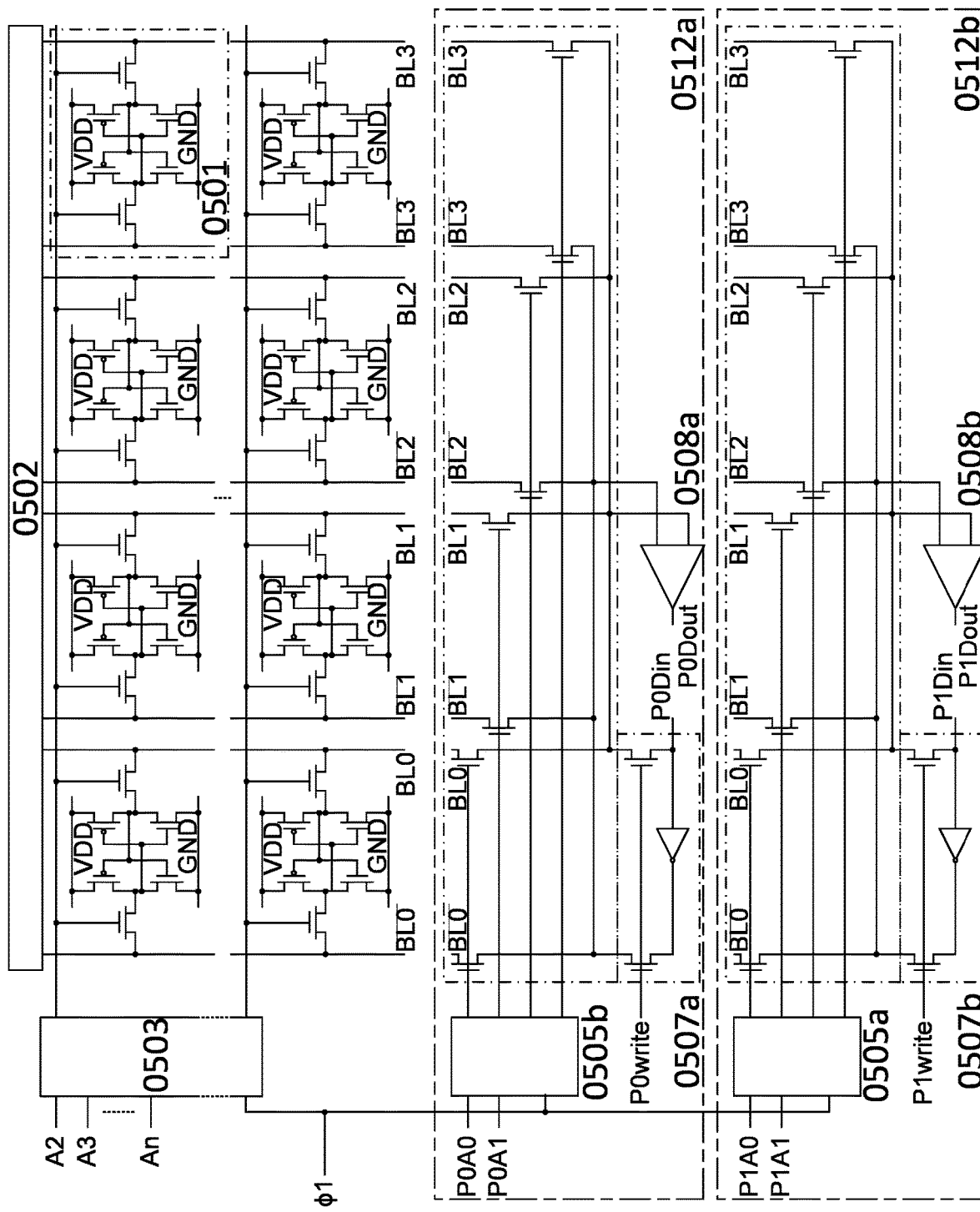
FIG. 6 is a diagrammatic illustration of another example implementation of an SRAM.

The example embodiment of FIG. 6 is limited in that sense, that only data within a single row is parallel accessible. If more data shall be access in parallel, certainly one approach would be making the rows wider by increasing the number of columns. However, in most environments limitations to the aspect ratio and/or the physical shape of an SRAM exist.

Figure 8:
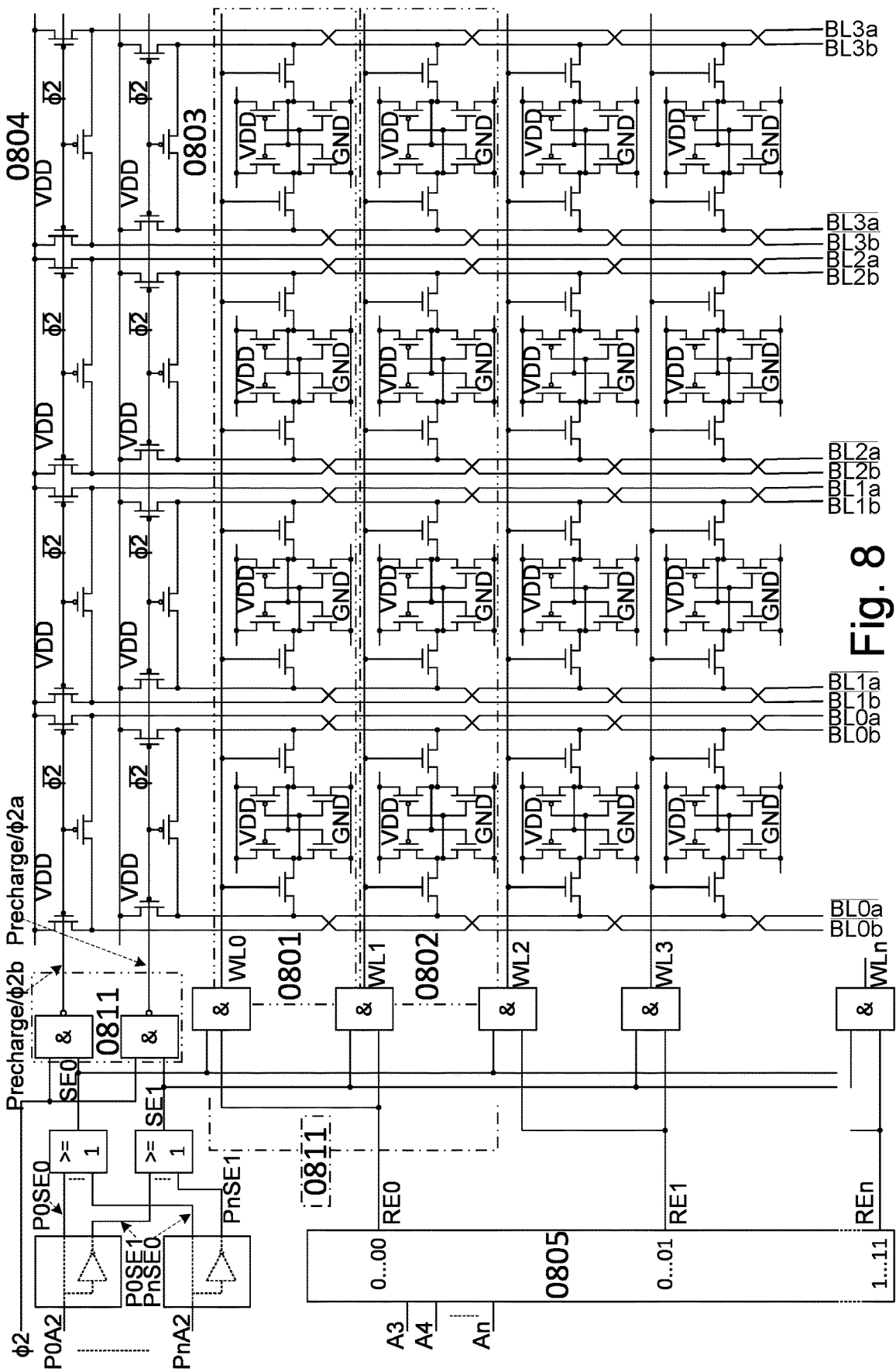
FIG. 8 is a diagrammatic illustration of another example implementation of SRAM.

FIG. 8 shows a modified SRAM core, in which 2 sets or bitlines (i.e. first set: BL0*a* and/BL0*a*, BL1*a* and/BL1*a*, . . . , BLna and/BLna; second set: BL0*b* and/BL0*b*, BL1*b* and/BL1*b*, . . . , BLnb and/BLnb) are implements, of which one is used in each alternating row. This allows for simultaneously accessing a group of rows so that data can be read from and/or written independently to a plurality of cells within a plurality of rows (two (2) rows in the example embodiment of FIG. 8). Other embodiments may have more sets of bitlines, e.g. 4 (or 8, or 16) which would allow independent and simultaneous access to 4 (or 8, or 16) rows of the SRAM. Independent access means that data can be independently be read from or written to different cells in the same column. In traditional SRAMs only having one set of bitlines (e.g. BL0 and /BL0) the accesses would conflict as the same bitlines are used by all the addressed cells.

Figure 8A:
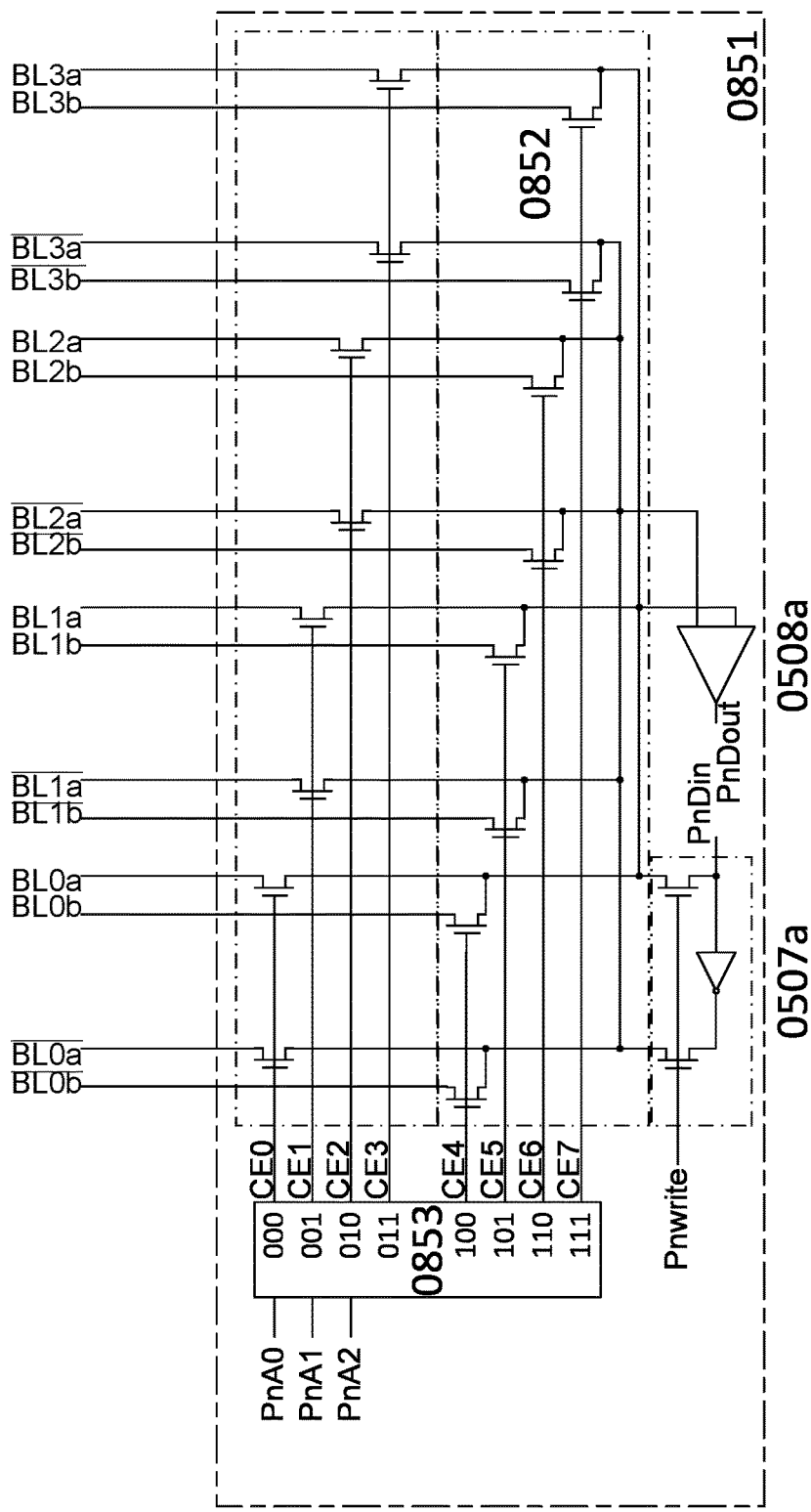
FIG. 8a is a diagrammatic illustration of an example implementation of a structure connecting bitlines to read and/or write logic.

As shown in FIG. 8*a* it is required to extend the column units (0851) such that the additional bitlines are correctly multiplexed to the read and/or write logic. This can be done by a respectively larger pass transistor, transmission gate, or multiplexer structure (0851) connecting the bitlines to the read (0508*a*) and/or write logic (0507*a*). In this example embodiment, a second set of pass transistors (0852) is used to connect the additional bitlines with the read and/or write logic. Respectively the column decoder (0853) is enhanced to decode additional address bits: 1 additional address bit in the example embodiment for supporting a total of 2 sets of bitlines; 2 additional bit lines for supporting a total of 4 sets of bitlines; 3 additional bit lines for supporting a total of 8 sets of bitlines; and so forth.

Referring back to FIG. 8 again, the effect of the additional bitlines is the same as having longer rows; only the rows are cut in the middle and physically 2-dimensionally folded. Thus rows are cut into parts (subrows) of equal length, which are stacked on top of each other. Assuming the original row would be 1024 columns wide, it is in the example embodiment of FIG. 8 cut into 2 subrows (e.g. 0801 and 0802) each being 512 columns wide. Bitline pair BL512*a* and/BL512*a* of the original 1024 columns wide roe becomes the bitline pair BL0*b* and/BL0*b* of the second subrow (0802).

Respectively the stretched out bit conditioning logic of the 1024 columns wide row is in this example embodiment cut in half, folded and stacked (0803 and 0804).

Other implementations than this example one may fold rows more than one time, so that instead of 2 4, 8 or more subrows are implemented. Consequently the number of bitline pairs (BLn, /BLn) increases from two (in the given example) to 4, 8 or more. Also the wordline conditioning (precharge) and the structure of the column logic according to FIG. 8*a* is amended respectively.

The row decode is enhance such, that it addresses correctly the folded rows comprising a plurality of subrows.

In this example embodiment a row decoder (0805) decodes the logical row addresses. Additional logic combines the Row Enable signals (RE0, . . . REn) with the higher column addresses such, that the correct subrows are addressed.

Therefore the higher columns address bits for each port—if a multiport memory is construed—are decoded to port specific Subrow Enables (PnSEn); in the example embodiment this is address A2 of each port (i.e. port 0: P0A2, . . . port n: PnA2). The respective port specific Subrow Enable signals of each port are logically combined (e.g. using OR-gates) to port comprehensive Subrow Enable signals (e.g. SE0, SE1). Those are then logically combined (e.g. using AND-gates) with the Row Enable signals (REn) to control the respective wordline (Wen). While the master row (the original row being formed by the folded subrows) is addressed by the row address, each port can dedicatedly control the column addresses and control therefore the selection of the respective subrows). For example the master row of subrows 0801 and 0802 is 0811 driven by RE0.

Figure 4:
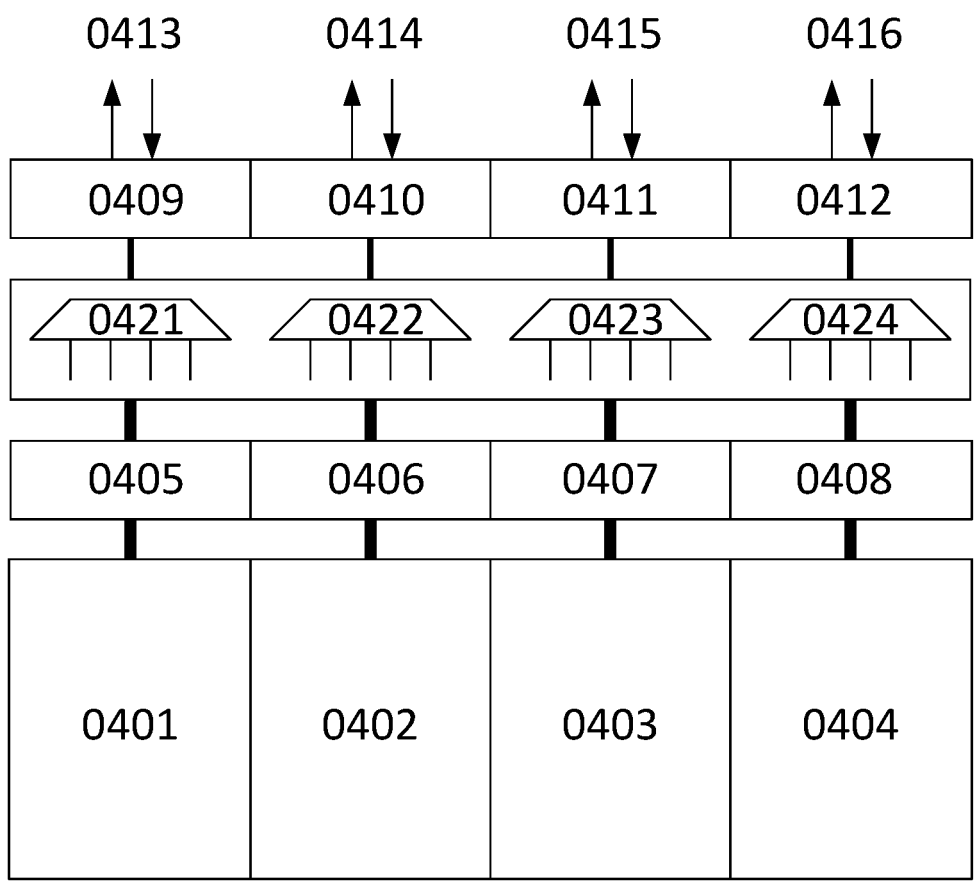
FIG. 4 is a diagrammatic illustration of an example memory having four banks.

The following table compares the use of the address bits in a standard flat SRAM implementation having 8 columns similar to FIG. 4 and the example embodiments of FIG. 6 to a folded SRAM implementation having only 4 columns but twice the amount of rows, as each master row (e.g. 0811) consists of 2 subrows similar to FIG. 8.

|   | flat SRAM (e.g. FIG 4/ FIG 6) | folded SRAM (e.g. FIG 8) |
|---|---|---|
| A0 | select column | select column |
| A1 |  |  |
| A2 |  | select subrow |
| A3 | select row | select masterrow |
| A4 |  |  |
| ... |  |  |
| An |  |  |

The physical width of the folded SRAM is about half (not exactly have as there is other logic as e.g. decoders, buffers and registers surrounding the SRAM array) of the flat SRAM. Yet, both SRAMs provide the same simultaneous accessibility in terms of wordlines accessible in parallel.

Folding SRAM rows is not only applicable on multiport memories but also on memories operating at large word sizes, e.g. instruction or microcode caches. For example VLIW processors and modern CISC cores (such as the Intel architectures) process many instructions in a single clock cycle and therefore need wide instruction caches. This applies in particular on trace-cache memories storing wide microcode. The large number of bits to be transferred per cycle may lead to a less than ideal aspect ratio in which the SRAMs are getting too wide.

Folding the rows might be an ideal solution to readjust the width and height of an SRAM without limiting the number of bits being transferable in a single cycle.

Accordingly the inventive SRAM provides simultaneous and/or parallel access to random addresses within a vicinity, e.g. of a base pointer or within a certain range.

It shall also be mentioned, that many memories of the state of the art require multiport (including dual-port or two-port access). Often the respective addresses are in such close vicinity that the described limitation of only accessing the content of one selected row in parallel is acceptable. In case two addresses reference different rows, a penalty access cycle might be inserted for executing the accesses sequentially one after another.

Such memories in the state of the art might be but not limited to caches, tag-memories, buffers, and even DRAM main memory etc. It shall be expressively mentioned that the described features are not only applicable on SRAM but also on all other kind of memories which cells are arranged in an array such as DRAMs, Flash and other memories as e.g. described in [2-11] for instance.

Memory Power Optimization

Several techniques to reduce the power dissipation of e.g. SRAM memories are known, reference is made to [9-11] chapter 12.2.6. Further significant potential for power savings is located in the precharge circuitry. Reference is made to [10-11] "Minimizing Test power in SRAM through Reduction of Precharge Activity" and [11-11] "Efficient March Test Procedure for Dynamic Read Destructive Fault Detection in SRAM Memories". [11-11] describes "that read or write operations on a cell involve a stress on the other cells of the same word line. This stress, called Read Equivalent Stress (RES), has the same effect than a read operation." [10-11] identifies "two main sources of power consumption in the unselected columns related to the pre-charge activity. Firstly, the cells in the unselected columns consume power due to the RES. Secondly, there is power dissipation in the pre-charge circuits of these columns because they are always ON." Further the paper states that "in the normal operation mode of a random access memory, this pre-charge activity is essential and the RES is tolerated, because at the end of each operation all the columns of the array, including the current selected column, need to be ready for the next operation, whose location is unpredictable."

Figure 7:
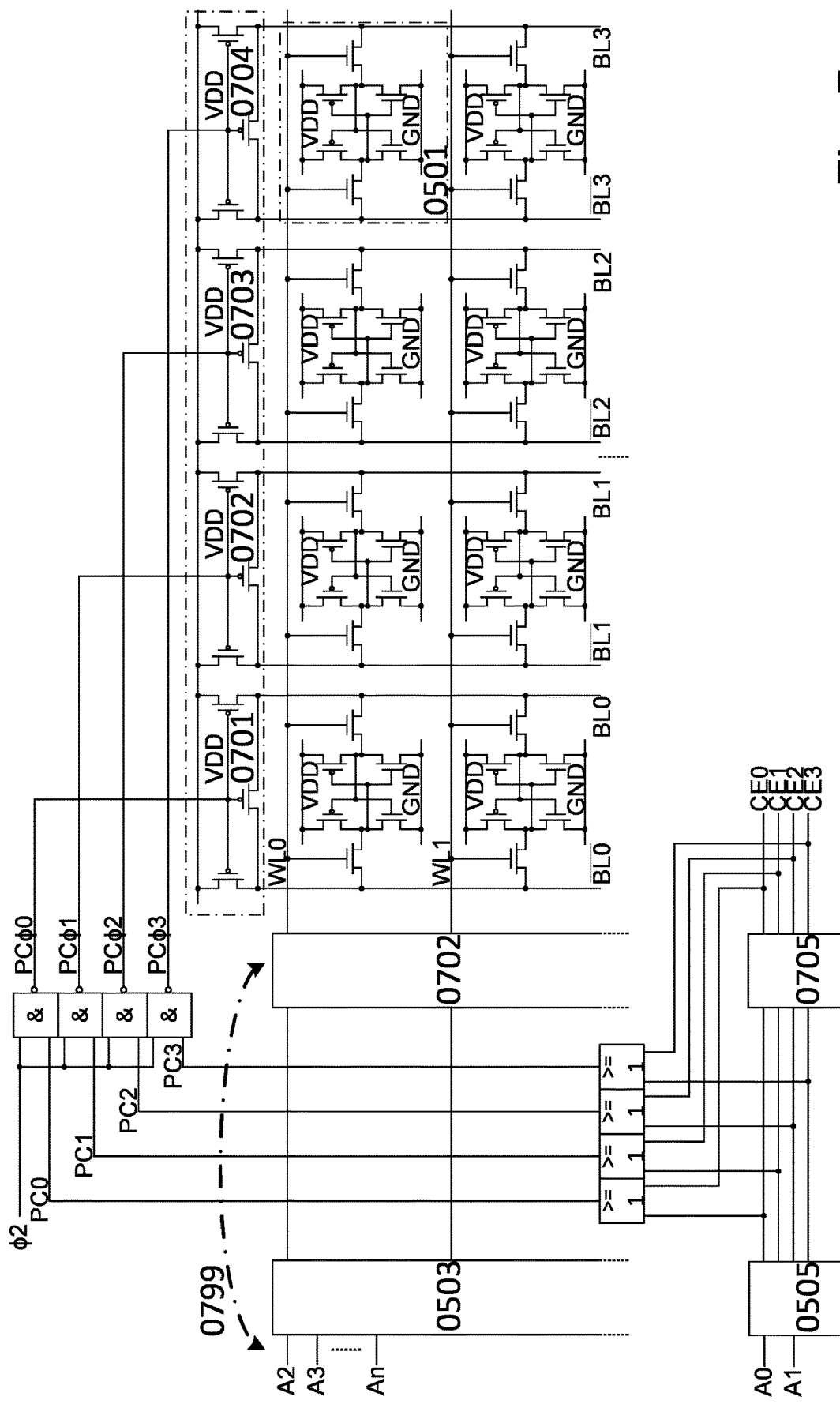
FIG. 7 is a diagrammatic illustration of an example section of an SRAM including switchable bitline conditioning units.

FIG. 7 shows example switchable bitline conditioning units which precharge operation can be selectively enabled for each row depending on the current and subsequent address. Only a relevant section of an example SRAM is shown. Based on the example SRAM memory of FIG. 5, the four precharge units (0701, 0702, 0703, 0704) are modified for being independently controllable by having independent enable signals (P40, P41, P42, P43).

The column addresses for cycle t+1 are decoded by the column decoder 0505 to column enable signals which are registered in the register 0705. The output of the register delivers the column enable signals CE0, CE1, CE2 and CE3 of the current cycle t. The column enable signals of the current cycle t and the subsequent cycle t+1 are therefore present at the output respectively input of register 0705. The column enable signals of the current and subsequent cycle are logically or—combined for each column resulting in dedicated precharge signals for each of the columns (PC0, PC1, PC2, PC3) covering the precharge enable for the current cycle t and the subsequent cycle t+1. Those are individually logically combined (e.g. nand-combined) with the clock generating the independent enable signals PCφ0, PCφ1, PCφ2, and PCφ3.

The row enable signals, i.e. the wordlines WLn have also to be registered to match the registered column enable signals CEn. Respectively a register 0702 is inserted for delaying the writelines WLn by one clock cycle. However, it is ultimately a design choice whether such register is located before or after the row decoder 0503, indicated by the arrow 0706.

In some d embodiments, the register (0702) is located in front of the decoder (0503) registering the row addresses (instead of the wordlines). This is indicated by arrow 0799. Obviously such a register is significantly smaller as it holds only n bits compared to 2n if located behind the decoder.

The optimized precharge circuitry is obviously applicable on the (multiport) memories discussed before. In FIG. 8 a slightly modified embodiment is shown, in which the two precharge blocks 0803 and 0804 are independently controlled by the respective Subarray Enable signals (SE0 and SE1) which are logically combined (0811) (e.g. by nand-gates) with the φ2 clock signal to drive the precharge circuits on a subarray granularity. Other embodiments may, as described, drive the precharge circuits independently for each column or in an advanced version independently for each column and subarray by logically combining the subarray and column enable signals.

Independent Memory Banks and/or Caches

The inventive concepts are applicable on the memory system described in [1-11], which is completely incorporated by reference into this patent for full disclosure. Particularly reference is made to FIG. 9 of [1-11] and the respective description. The memory system is described in more detail in [2-11], which is also completely incorporated by reference into this patent for full disclosure. Particularly reference is made to FIGS. 8, 9 and 10 of [2-11] and the respective description.

Those memories systems are based on Tightly Coupled or Locally Coupled Memories (TCM or LCM). Other TCM memory systems are known in the prior art, e.g. from [11-11] Chapter 5.

However, such kinds of memories require additional management. For example in software has to explicitly manage TCM memories according to [11-11] and move data between them and the higher memory hierarchies. Or for example in case of [2-11], at least the address space of the TCM/LCM has to be explicitly managed.

Source code analysis showed that ideally at least for some of the base pointers dedicated data caches are implemented, such that they are independently and parallel accessible.

Figure 9A:
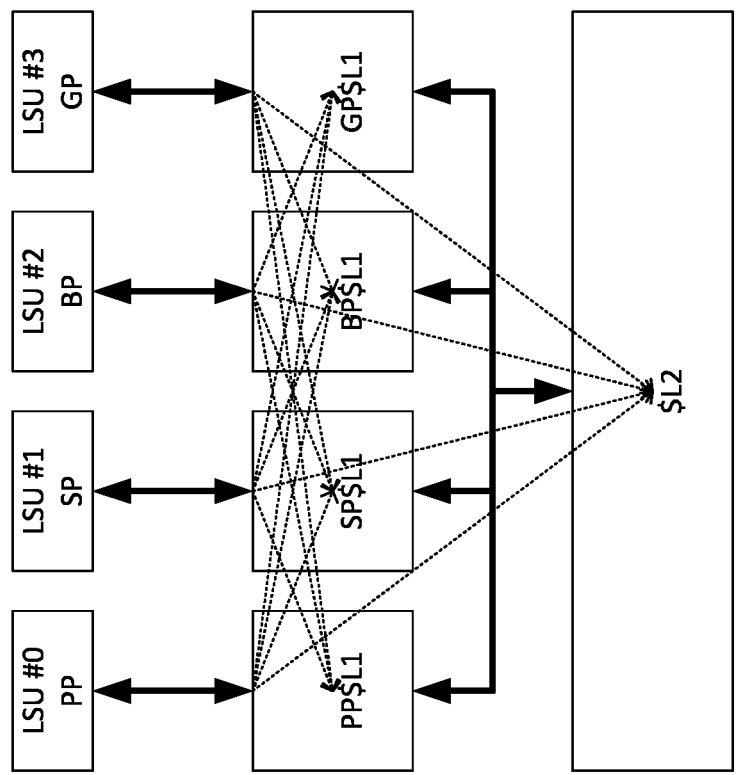
FIGS. 9a and 9b are diagrammatic illustrations of example implementations of a memory hierarchy.
Figure 9B:
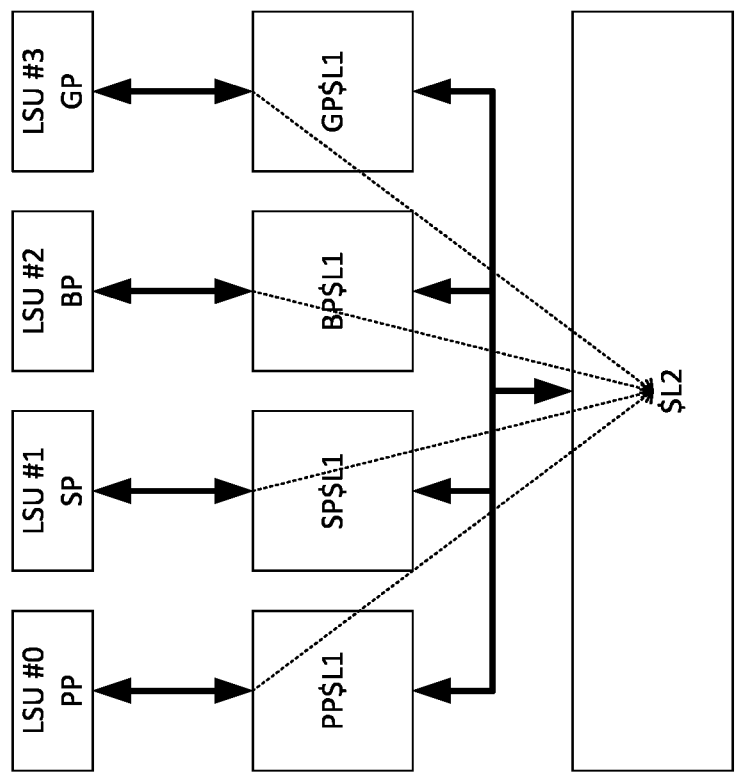

FIG. 9a and FIG. 9b show example embodiments of the inventive memory hierarchy. As described in [1-11] a plurality of independent Load/Store Units (LSU) are implemented, each covering a specific address range. Those LSU are preferably dedicated to specific base addresses. In this example embodiment 4 LSU are supported:

PP, the Program Pointer for accessing constants

SP, the Stack Pointer accessing the stack and local data

BP, a Base Pointer, e.g. to the heap

GP, a General Purpose LSU accessing a random address range

However, preferably more dedicated Base Pointers are supported, for example 3 (BP0, BP1, BP2) of which e.g. BP0 and BP1 might be used for addressing read data and BP2 for addressing write data. This arrangement supports the most common functions and algorithms.

Each of the LSU is connected to a dedicated Level 1 Cache ($L1, e.g. PP$L1, SP$L1, BP$L1, GP$L1), so that preferably all the LSU can simultaneously transfer data to or from their specific $L1.

Note, that within this patent $L1 is used for a Level 1 Cache, $L2 for a Level 2 Cache, etc. A prefix might be used to point to a specific cache, e.g. SP$L1 is the Level 1 cache dedicated to the Stack Pointer. Without a prefix any Level 1 cache is meant, sometimes even a plurality if Level 1 caches can be meant. However, typically a plurality of Level 1 caches is referenced as $L1s.

In some embodiments, cache memories comprising the SRAMs described in this patent are used, so that each LSU can access a plurality of addresses within a vicinity of the specific base pointer in parallel.

In an optimal case, the address ranges of the LSU do not overlap, so that each LSU is operating exclusively in the respective address range. In that case no coherence issues exist. However, typically this is not the case or at least cannot be taken for granted. Particularly the General Purpose address pointer in LSU #3 might point into any address range without limitations.

Preferably the high level language compiler (e.g. C, C++ compiler) optimizes the address pointers and address ranges to minimize overlapping address accesses.

However, as usually the LSU should operate exclusively within dedicated address ranges a full coherence protocol (e.g. such as MESI) is inadequate particularly in terms of silicon area and bandwidth requirements and energy consumption.

Based on the policy that each LSU should operate exclusively within its dedicated address range, the $L1 operated as exclusive caches. This means, that a data block within an address range is only covered by one single cache. No duplicate data blocks within the same address range may exist in different $L1.

Exclusive $L1s reduce coherence issues to cache misses. The access sequence is such:

Check respective $L1 cache for address.

Hit: Initiate data transfer and terminate.

Miss: Continue with searching other caches ($L1s and $L2).

Continue with 2, the respective $L1 cache is called requesting-$L1 as it request the data from the memory (cache) where it is currently located.

Search

Data is found in another $L1 (containing-L1), the containing-$L1 must be accessed for the data transfer. Still no coherence issues exist, particularly no locking mechanism are required, as the timely sequence of the memory accesses is driven by the instruction issue sequence of the processor core connected to the LSUs. In some embodiments, the TAG memory of the requesting-$L1 might be updated so that it points to the containing $L1. In this case, future accesses can avoid searching the caches, but directly access the data in the containing-$L1. This mechanism might serve access time and particularly energy. While typically data is only accessed in the containing-$L1, data might be moved from one $L1 (containing-$L1) to a second L1 (requesting-$L1) so that is exclusively resides in the second one (requesting-$L1), if the second $L1 (requesting-$L1) accesses the data more frequent than the first one (containing-$L1) in which the data currently resides. Reference is made to description of data move methods and systems described in [2-11] discussing this issue between multiple processor cores. The same mechanisms are (possibly with little modification and optimization) applicable to these described features. It shall be explicitly noted that for the purpose of disclosure [2-11] is embodied into this patent and claims may include features of the specification of [2-11].

If the data is not found in any other $L1, it will be loaded from the higher memory hierarchy into the requesting $L1 (e.g. $L2, $L3, main memory, disc, server, internet, etc).

The used mechanisms depend on the implementation of the cache hierarchy, e.g. on inclusive or exclusive caching within the hierarchy (not only in between the $L1s).

Multi-level caches introduce new design decisions. For instance, in some processors, all data in the $L1 must also be somewhere in the $L2. These caches are called strictly inclusive. Other processors (like the AMD Athlon) have exclusive caches—data is guaranteed to be in at most one of the $L1 and $L2 caches, never in both. Still other processors (like the Intel Pentium II, III, and 4), do not require that data in the $L1 also reside in the $L2, although it may often do so. There is no universally accepted name for this intermediate policy.

The advantage of exclusive caches is that they store more data. This advantage is larger when the exclusive $L1 is comparable to the $L2, and diminishes if the $L2 is many times larger than the $L1. When the L1 misses and the L2 hits on an access, the hitting cache line in the $L2 is exchanged with a line in the $L1. This exchange is quite a bit more work than just copying a line from $L2 to $L1, which is what an inclusive cache does.

One advantage of strictly inclusive caches is that when external devices or other processors in a multiprocessor system wish to remove a cache line from the processor, they need only have the processor check the $L2. In cache hierarchies which do not enforce inclusion, the L1 cache must be checked as well. As a drawback, there is a correlation between the associativity of $L1 and $L2 caches: if the $L2 does not have at least as many ways as all $L1s together, the effective associativity of the $L1s is restricted.

Another disadvantage of inclusive cache is that whenever there is an eviction in $L2, the (possibly) corresponding lines in $L1 also have to get evicted in order to maintain inclusiveness. This is quite a bit work, and would result in higher L1 miss rate.

Another advantage of inclusive caches is that the larger cache can use larger cache lines, which reduces the size of the secondary cache tags. (Exclusive caches require both caches to have the same size cache lines, so that cache lines can be swapped on a $L1 miss, $L2 hit). If the secondary cache is an order of magnitude larger than the primary, and the cache data is an order of magnitude larger than the cache tags, this tag area saved can be comparable to the incremental area needed to store the $L1 data in the $L2.

FIG. 9a shows the search mechanism in case of a cache miss in a $L1 ($L1miss) in either case, an exclusive or inclusive cache hierarchy.

In both cases the $L2 and all other $L1s have to be searched for the respective address range. The search is initiated after a cache miss and the TAG memory of all other $L1s and the $L2 is checked for the respective address.

If the address is found in an $L1, the $L1 is accessed for the data transfer and/or the cache line might be transferred from the $L1 into the $L1 ($L1miss) requiring but missing the data (see [2-11]).

If the address is found in $L2, the cache line is transferred into $L1miss.

If the address is not found in any $L1s or the $L2, it is transferred from the higher memory hierarchy.

FIG. 9b shows a modified inclusive cache hierarchy. All data stored in the $L1s must also be present in the $L2, at least (as will be discussed) in the TAG memory of the $L2. The TAG memory of the $L2 keeps track of the whereabouts of all addresses in the $L2 and lower level $L1s. The $L2 TAG memory is respectively enhanced not only to reference its own cache lines, but also to reference to cache lines of the lower $L1 caches. It is not necessary, that the $L2 actually has copies of data in the $L1(s) stored, but at least respective entries in the TAG memory are required to point to the location where the data is actually stored. If a respective address is available in a $L1, the $L2 TAG will point to the specific $L1.

The benefit of this embodiment is that in case of a $L1 cache miss only the TAG of the $L2 is checked (while in FIG. 9a all $L1s have also to be checked). This might be more power efficient than checking all caches in parallel.

If a TAG entry in the $L2 TAG memory is pointing to a $L1, the respective cache is accessed. As described before data might be transferred or the complete cache line (see [2-11]). In case the cache line is transferred, the TAG in the $L2 is accordingly updated.

If no TAG entry in the $L2 TAG memory is found, data is transferred from the higher memory hierarchy.

Also a modified exclusive policy might be implemented, in which data resides either in one of the $L1s or the $L2. Yet, the TAG memory of the $L2 serves as an address book for all addresses in the $L1s and $L2, so that it points to the cache (either one of the $L1s or the $L2) storing the data.

Effects on Code, Compilers and Tools

In the following, described features are discussed with some examples based on analysis of C/C++ code of a H.264 video encoder and decoder (namely X.264 [12-11]), which has been compiled to ARM assembly code using a GNU GCC compiler environment.

First reference is made to a section within the code of <x264_fdec_filter_row>:
  0000075a: ldr r0, [pc, #600]
  0000075c: movs r6, #0
  0000075e: ldr r7, [pc, #580]
  00000760: str r6, [sp, #36]
  00000762: mov r8, r0
  00000764: str r3, [sp, #68]
  00000766: ldr r0, [sp, #36]
  00000768: ldr r1, [sp, #56]
  0000076a: ldr r5, [sp, #52]
  0000076c: asrs r1, r0
  0000076e: asrs r5, r0
  00000770: mov fp, r1
  00000772: cmp r5, fp In lines 75a and 75e data is loaded (ldr) from a memory position relative to the program pointer (pc). The addresses are PP relative at pc+#600 and pc+#580 and therefore in a close vicinity. It shall be noted that the ARM instruction set references to the Program Pointer (PP) as Program Counter (PC), which are both the same. The movs instruction in line 75c can be swapped with either one of the load instructions in lines 75a or 75e; obviously the offsets to the program counter (pc) must be respectively adapted.

The two load instruction can now be merged (or fused) into a combined single load instruction (combined load: cldr), either by the compiler using a respectively amended instruction set or by the processor hardware. Both options are discussed in later sections of this patent.

The combined single load instruction (cldr) operates in a single load transfer, particularly if the inventive SRAM as previously described is used, e.g. as cache ($L1 and/or $L2 and/or even for higher memory hierarchies). The performance benefit of merging the two load operations can easily be calculated. Assuming modern $L1 implementations requires 4 clock cycles latency, an overall of 4 cycles is saves, as both read operations are simultaneously processed. Power is saved respectively, as the address transmission and cache (or higher level memory) access occurs only once.

Furthermore in lines 766, 768 and 76a load accesses (ldr) relative the Stack Pointer (sp+#36, sp+#56 and sp+#52) are performed. Again, all three load instructions can be merged into a single one performing the three accesses in one transfer. Obviously in this case 8 clock cycles are saved and a respective amount of power.

Store operations are not as time consuming, thought combining store operations (e.g. in line 760 and 764) saves processing cycles and reduces the energy consumption.

In some particular example embodiments, store and load operations might be merged (or fused) together. Assuming an instruction set and/or processor architecture supports parallel memory transactions (mixed load and/or store transfers) to 4 addresses within a vicinity of a base pointer. In that case, the store and load instructions in lines 764, 766, 768 and 76a might be combined into one single transfer. The previously described SRAM for example supports random simultaneous read and/or write operations within a vicinity, i.e. the addressed row or master row.

The following code section is part of <x264_encoder_encapsulate_nals>:
  00000b86: ldr r4, [r3, #0]
  00000b88: adds r3, r1, #0
  00000b8a: adds r0, r0, r4
  00000b8c: adds r6, #1
  00000b8e: adds r3, #76
  00000b90: ldr r5, [r3, #0]

```
00000b92: adds r6, #1
00000b94: adds r0, r0, r5
00000b96: adds r3, #28
00000b98: ldr r7, [r3, #0]
00000b9a: adds r6, #1
00000b9c: adds r0, r0, r7
00000b9e: adds r3, #28
00000ba0: cmp r2, r6
```

The instructions can be rearranged (at runtime by the processor hardware and/or software tools and/or a compiler) as follows:

```
adds r3', r1, #0
adds r3', #76
adds r3",r3', #28
ldr r4, [r3, #0]
ldr r5, [r3', #0]
ldr r7, [r3", #0]
adds r0, r0, r4
adds r6, #1
adds r6, #1
adds r0, r0, r5
adds r6, #1
adds r0, r0, r7
adds r3, #28
cmp r2, r6
```

The load instructions (ldr) having a common base pointer r3 been moved up and grouped. The address generation for the load instructions has been separated, grouped, and placed in front of all the load instructions (ldr). Further discussion is required on the use of register r3 and adding r1 to r3 in adds r3', r1, #0:

Register r3 is used as address in all load (ldr) operation. Grouping the load operations, separating and grouping the address generation results in an incorrect use of register r3. This can be avoided in various ways. If the reordering is done in hardware, virtual registers might be introduced for the different r3 registers. This is indicated by r3' and r3".

If already a compiler groups and orders the instructions respectively, the register allocation may use different registers for each of the r3 (r3, r3' and r3"). This is shown in the code below, in which r3' is replaced by r5 and r3" by r7 respectively:

```
adds r5, r3, r1
adds r5, #76
adds r7, r5, #28
ldr r4, [r3, #0]
ldr r5, [r5, #0]
ldr r7, [r7, #0]
adds r0, r0, r4
adds r6, #1
adds r6, #1
adds r0, r0, r5
adds r6, #1
adds r0, r0, r7
adds r3, #28
cmp r2, r6
```

The value of r1 is unknown, at least at compile time. Therefore r3' might be outside the vicinity supporting parallel access. While this might be theoretically an issue, practically each address (even those being generated by known constants (e.g. adds r3', #76) must be checked for being within the vicinity of parallel accessibility of the data. This check can be implemented in various locations, for example within the load/store unit (LSU) or within the cache management or even within the memory (e.g. the previously described SRAM). If addresses within a group (e.g. ldr r4, [r3, #0], ldr r5, [r3', #0], ldr r7, [r3", #0] in this example is called a group) are in different vicinities, the access must be split into a multi-cycle address. One access cycle is required for each of the vicinities. While ideally all addresses within a group are within the same vicinity, worst case each address might be in a completely different one, so that for each address a separate access cycle is required. Correct operation must be ensured by the hardware.

In the example below (which is part of <x264_encoder_delayed_frames>) pointer arithmetic is used to generate addresses. A pointer is retrieved by a first load instruction, which is then added to a base pointer generating the address of a second load operation:

```
000000b0: movs r6, #171
000000b2: lsls r1, r6, #2
000000b4: adds r7, r4, r1
000000b6: ldr r3, [r7, #0]
000000b8: ldr r6, [r3, r2]
000000ba: movs r3, #8
000000bc: adds r5, r5, r6
000000be: movs r7, #170
000000c0: adds r1, r4, r3
000000c2: lsls r6, r7, #2
000000c4: adds r7, r1, r6
000000c6: ldr r1, [r7, #0]
000000c8: adds r3, #4
000000ca: ldr r7, [r1, r2]
000000cc: adds r5, r5, r7
000000ce: movs r1, #170
000000d0: adds r6, r4, r3
000000d2: lsls r7, r1, #2
000000d4: adds r1, r6, r7
000000d6: ldr r6, [r1, #0]
000000d8: adds r3, #4
000000da: ldr r1, [r6, r2]
000000dc: adds r5, r5, r1
000000de: cmp r3, r0
```

The code is transformed as previously described such, that the first load operations acquiring the pointers are grouped together in a first group and the second load operations reading the data on basis of the pointer are grouped together in a second group:

```
movs r6, #171
lsls r1, r6, #2
adds r7', r4, r1
movs r3, #8
movs r7, #170
adds r1, r4, r3
lsls r6, r7, #2
adds r7", r1, r6
adds r3, #4
movs r1, #170
adds r6, r4, r3
lsls r7, r1, #2
adds r1, r6, r7
ldr r3', [r7', #0]
ldr r1', [r7", #0]
ldr r6', [r1, #0]
adds r3, #4
ldr r6, [r3', r2]
ldr r7, [r1', r2]
ldr r1, [r6', r2]
adds r5, r5, r7
adds r5, r5, r6
adds r5, r5, r1
cmp r3, r0
```

The address generation for the first group is moved in front of the entire group, where necessary (as previously discussed) registers are replaced by virtual registers (in a hardware based optimization within the processor at runtime) or the register allocation of a compiler (at compiler time) would allocate the registers correctly. Ultimately the addresses of each block might or might not be within a vicinity. If so all transfers within a group are performed in parallel and several clock cycles might be saved. If not, the hardware will perform the respective transfers sequentially where necessary.

Optimization at Compile Time

The most efficient code optimizations for supporting the inventive memory access are done at compile time. The compiler might perform various optimizations:

Arrange addresses of variables and constants such, that those typically or likely being accessed in timely vicinity are located in the memory in close address vicinity.

Combine a plurality memory accesses into groups.

If the instruction set of the processor supports memory instructions having multiple addresses and performing multiple transfers, use such instructions.

Position (naturally) all necessary address calculations in front of said groups.

Allocate registers respectively.

Optimization at Execution Time

Processors might perform all or some of the described optimizations at runtime. For example if non-optimized binaries are executed. Also, for example grouped load and/or store instructions might be combined (fused) into one (single) internal instruction or microcode.

Instruction Decoder (ID)

At this level simple optimizations can be performed, such as combining a plurality of grouped load and/or store instructions into one (single) internal instruction or microcode.

Trace Cache, Reservation station/Reorder Buffer

The binary code might be reordered and grouped in at least one of the Trace Cache, the Reservation station(s) and/or the Reorder Buffer. A similar optimizer is described in [4-11]. It shall be explicitly noted that for the purpose of disclosure [4-11] is embodied into this patent and claims may include features of the specification of [4-11]. One downside of most algorithms however is that the optimization can only be performed after the whole section of the code has been analysed. In other words, the end of a code section must be known and analysed before the beginning of the code can be modified. This means that either whole sections of the code must be first read into a buffer (e. the Trace Cache, the Reservation station(s) and/or the Reorder Buffer), analysed and optimised before it can be executed;

or during a first execution run the code is executed in its original version and analysed at the same time, so that at a later execution run an optimized version of the code might be available and is executed. In this case, the optimized code might be available for execution already in the second run or the second (and possible even further runs) might be required for further optimization and/or even analysis.

Microcode Fusion

Combining (or fusing) a plurality of load and/or store operations into one operation, e.g. a microcode, has been described. This microcode is then executed in a single execution cycle. Only if at least some of the addresses of the plurality of transfers being fused into the single microcode are not within a vicinity, multiple cycle might be required for execution.

The fusion of decoded instructions, so called microcodes, into fused microcodes is known from microprocessors.

Reference is made to [8-11] chapter 58, e.g. section "pop Fusion". However, only microcodes derived from the same instruction (macro-op) are fused, reference is made to [13-11]. Fusing microcode from different instructions and particularly fusing a plurality of load and/or store microcodes is not known in the prior art and regarded as inventive step is the fusion of a plurality of load and/or store operations into one microcode (or operation) as described in this patent.

Microcode Splitting

Some processors, particularly CISC processors as e.g. the IA family from Intel (e.g. x86: Pentium, Core2, Sandybridge, etc) do not only have dedicated memory instructions (such as load and/or store), but also support memory operations within other instructions and software may even extensively use this feature.

It is necessary to separate the function of an instruction from the load and/or store operation such, that the load/store operation can be independently performed from the (other) function. Therefore the instruction is split into at least a function (micro-)code and a load/store (micro-)code at execution time, typically by the instruction decoder (ID). The at least two parts might be treated differently in later stages of execution. Particularly the load/store (micro-)code might be reordered and grouped/fused together with other load/store (micro-)codes as described. This steps are not known in the prior art and regarded inventive.

If a load/store (micro-)code is separated from other parts of an instruction, the respective operand or result must be replaced by a reference to the separated load/store (micro code. A register of the register file might be used, but this would influence other operations. Therefore it is preferred to reference via a virtual register and/or dedicated load store registers, which might be implemented (e.g. as part of the load/store units (LSU)) for enhancing the register file and transferring data between the execution unit of the processor and the memory hierarchy.

FIG. 10 demonstrates the effects of described features, particularly in respect of Microcode splitting and fusion, on CISC instructions. The example uses Intel x86 instructions which are implemented for example in the Pentium, Core2 and Sandybridge processors. A very simplistic microcode format is used in this example, mainly the assembly instructions are replaced by microcode instructions in "<<" and ">>" brackets. Besides only little is transformed, as the goal of this example is solely to demonstrate said load/store optimizations.

An example Finite Response Filter (FIR) core written in x86 assembly language is shown in FIG. 10a. The processor hardware (typically the instruction decoder (ID)) transforms the binary of the assembly code into microcode.

As shown in FIG. 10b load and/or store transfers are separated (ldr=load data, str=store data) from the other operations (e.g. ALU operations), virtual registers (vr0, vr1, . . . , vr4) link the operations with the load and/or store transfers.

Load transfers are pulled up to be executed as early as possible, store transfers may remain in their original position or might be alternatively pulled down (FIG. 10c).

Memory transfers using the same base are combined, particularly if they likely operate in an address vicinity—which is easy to check in the given example: The offsets eax*4, eax*4+4, eax*4+8, eax*4+12 are in a close vicinity; the same register and multiplier (shift left) are used as comparators can check, together with the little difference between the constant values, 0, 4, 8, and 12. FIG. 10d shows a microoperation (micro-op) ldrm4 in which the 4 load transfers descending from different instructions are combined (or fused).

In this example the Load/Store Units (LSU) are capable of handling 4 requests simultaneously. If the execution of 5 simultaneous requests is supported (ldrm5, 1001) also the 5th load operation might be included. It uses the register ecx instead of eax as offset, which might be out of range and therefore not within the required vicinity. However, as previously described, range checking is preferably supported in hardware, so that basically random addresses may exist within a single memory transfer instruction (e.g. ldrm4, ldrm5): The execution of the ldrm5 operations would be split into (at least) 2 cycles in case ecx is out of range, so that the load transfer depending on ecx is managed in a separate cycle.

As described before, the optimization tools described in [4-11] can be respectively amended to support the shown optimization.

Scheduler Controlled Cache, LCM, and/or TCM Prefetching

A Locally or Tightly Coupled Memories (LCM or TCM) as e.g. described in [2-11] provide ideal performance once they are dedicated to a specific application. However, task or thread switches might be comparably inefficient if the data of the old task has to be saved from the respective memory to the main memory hierarchy and data of the new task has to be loaded. The process is time consuming beyond the order of magnitude of the typical time consumed by a task or thread switch. Therefore, in the prior art, TCM are mainly dedicated to a single or only a few application(s) and limited to embedded processing.

Ideally loading or off-loading (storing) of TCM and LCM data is performed in the background, prior to or after a task or thread switch.

In some embodiments, the task scheduler of the operating system and/or the application program provides information of the next scheduled task/thread or (if supported by the implementation of the task scheduler) tasks/threads to the processor. A buffer structure, e.g. a FIFO, might store the respective list of tasks/threads (TTL) in their scheduled execution order. A DMA-like (DMA=Direct Memory Access) Data Move Unit (DMU) preloads TCM and/or LCM data required by the subsequent task/thread in advance from the memory hierarchy, while the current task/thread is still running.

Multi-Buffer TCM/LCM Caching

Overlapping processor operations on TCM/LCM and the loading and/or off-loading of data requires to implement these memories (which are e.g. described in [2-11]) as at least double-buffers comprising at least two memory banks: While one bank is assigned to the processor core for data operation executing the application, the other bank is assigned to the data move unit (DMU) for off-loading the data of the previous task/thread and loading the data of the subsequent task/thread.

Figure 13:
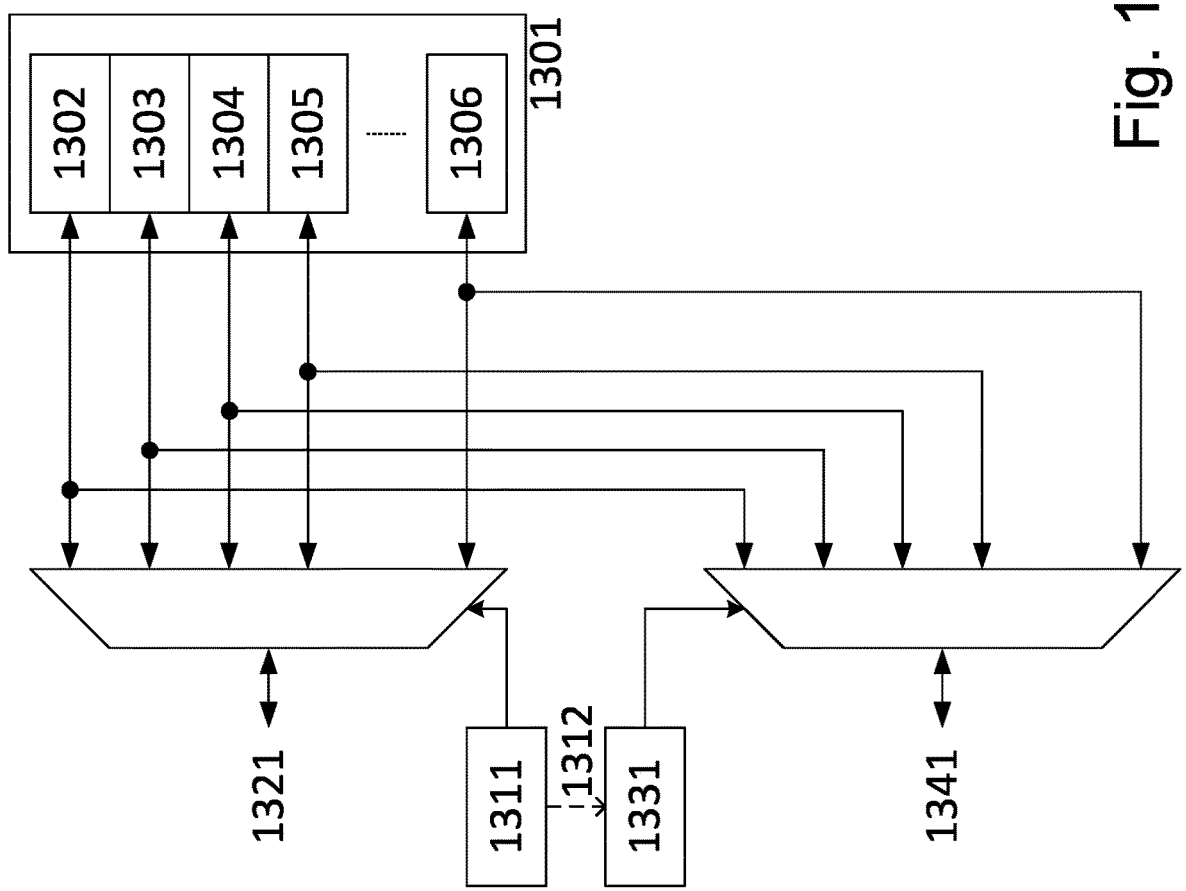
FIG. 13 is a diagrammatic illustration of an example memory configuration.

Processor build for application getting high benefit from TCM/LCM might have more focus on these memories at the expense of caches. Spending more area for LCM/TCM enables multi-bank LCM/TCM implementations, examples of which are shown in FIG. 13. A Tightly Coupled or Locally Coupled Memory (TCM/LCM) (1301) comprises a plurality of memory banks (1302, 1303, 1304, 1305, 1306).

A Memory Management Unit (MMU) (1311), which might be part of the main Memory Management Unit or a separated Memory Management Unit, one or more memory banks (1302, 1303, 1304, 1305, 1306) are assigned to the processor core (1321) at runtime according to the currently executed task and/or thread. The assignment depends on the respectively executed task/thread and is managed by the MMU based on information regarding the currently executed (scheduled) task/thread, as e.g. task/thread-identification (ID) or a base address. Data for a plurality of tasks/treads is storable in the LCM/TCM memory, for each preferably in another related memory bank. At runtime of the task the related memory bank is assigned to the processor core.

A DMU (1331) is loading and off-loading the data from and to the memory hierarchy (1341). The DMU operates on a list (TTL) of data for tasks/threads to be loaded and off-loaded.

In some embodiments, the MMU provides this list (1312) to the DMU. In these embodiments, the MMU manages the list (TTL) of tasks/threads to be started next. The MMU being in control of the accessible pages (respectively TCM/LCM banks) recognizes upcoming page misses, if the pages required for a task/thread in the TTL are not available in the TCM/LCM (1301). Consequently the MMU issues a bank/page load request to the DMU (1312).

Depending on the Page Replacement Policy (which might be implemented in the MMU or provided by the Operating System) it is decided which TCM/LCM pages/banks have to be evicted. As the MMU is in control of the accessible pages (or banks), is also issues the respective bank/page off-load request to the DMU (1312). Naturally a bank, if it was previously in use by a task/thread before, has to be off-loaded before it is loaded with data of a scheduled subsequent task/thread.

Register File Buffering

Figure 9C:
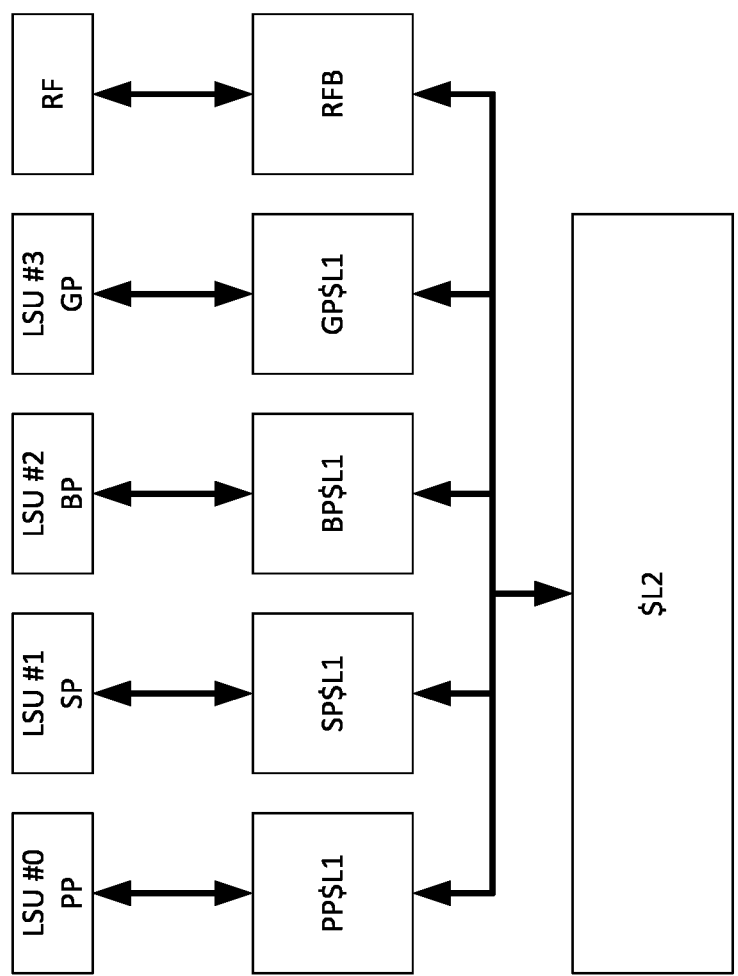
FIG. 9c is a diagrammatic illustration of an example implementation of a cache/buffer model for a memory hierarchy.

Reference is made to FIG. 9 again. FIG. 9c shows an advanced cache/buffer model. The processors Register File (RF) is connected to a Register File Cache or Register File Buffer (RFB), which then connects to the main memory hierarchy, e.g. the Level-2 cache ($L2). This structure is particularly beneficial in processors having a large register file. One example are ZZYX processors, which FIFO register file can have comprise hundreds to thousands of registers (e.g. 16 registers times 16 FIFO stages deep=256 registers total; 64 registers times 32 FIFO stages deep=2048 registers total). Other examples are Sun Sparc processors having register windows, providing a reduced view of a huge register file. Yet another example are modern x86 processors, as e.g. Intel Core2 and Sandybridge having about 200 registers.

In the prior art, for context switching those registers are loaded from (pop) and off-loaded to (push) the Level-1 cache. This leads to various issues, e.g. but not limited to: a) the cache gets easily trashed; b) the cache bandwidth is either limited or large cache interfaces are required; c) this may lead to increase area and power dissipation.

In some embodiments for context switching the register file is loaded from (pop) and off-loaded to (push) the RFB. The RFB may provide a wider interface, so that a plurality of registers can be moved simultaneously. Additionally or alternatively the RFB might be a multi-bank and/or multi-port memory structure, of which—in some embodiments— the RF might be a subset. In some embodiments the RFB is deep enough to store, depending on the implementation, 4 to 64 (in future even more) complete register file contexts. This allows for fast and efficient exchange of the Register File in case of context switches.

In some embodiments the RFB might comprise multi-buffers, as e.g. described in FIG. 13. Particularly the described prefetching and/or loading and off-loading in the background under control of a scheduler is highly efficient and greatly reduces task switching overhead (e.g. time and/or energy).

Depending on the implementation, Instruction Set Architecture and/or programming model a different stack pointer and/or stack might be used for loading and/or off-loading the register file.

In some cases it might be necessary to have a reference to the memory address of the register file. In those cases, the operation off-loading the register file might leave a reference to the address of the off-loaded register file on the normal data stack, just where usually the register file would have been off-loaded to. Whenever the register file is loaded again, the address can be retrieved from the stack at the position at which usually the actual register file would be found on the stack.

In some cases, e.g. if a FIFO Register File is implemented (e.g. according to [1-11]) only the amount of actually used registers (e.g. FIFO stages or entries) are off-loaded. The actual amount of off-loaded registers (e.g. the FIFO depth) is written onto the stack (e.g. finally at the top of the stack) such, that a subsequent load operation can retrieve this value before the actual load operation, so that the number of registers (e.g. FIFO stages) to load can be correctly determined.

Serial Interface

This part of described features starts with the perception that a plurality of unrelated serial channels capable of operating independently of each other connecting a plurality of processor cores (e.g. in a multi-core processor or multi-processor system) and/or cache banks (e.g. the previously described independent memory banks and/or caches) to the system memory might be more efficient than the bottleneck of a single parallel bus.

The transfer rate of each serial channel is lower than the one of the parallel bus, but in summa all the serial channels together can achieve the same or even higher transfer rates. Simultaneously serial buses are simpler to handle in complex systems and may consume significantly less power.

Today's multi-core processors interface via one global cache and a global memory controller (which may handle multiple but dependent memory channels) with the system memory.

In difference the inventive architecture provides one or a plurality of serial channels for each of the processor cores to the system memory, eliminating the cache hierarchy and/or memory controller bottleneck. Each serial bus may independently transfer data and operate in specific address ranges. This allows each processor to operate in its own memory space, without impairing the data transfer and caching of the other processors.

It has been recognized, that—as described above—a plurality of address generators (or Load/Store Units) (for examples see [1-11] e.g. FIGS. 7 and 9) are beneficial in most applications, allowing each of them to perform on its own address space. Reference is also made to the LCM and TCM of [2-11]. FIGS. 8 and 9 of [2-11] show example memory hierarchies for multi-core processor systems. Particularly, as described above, a plurality of caches (e.g. the previously described level 1 caches PP$L1, SP$L1, BP$L1, GP$L1) might be implemented. Obviously the interface to the main memory (0810, 0910) forms the major bottleneck. Ideally, each of the memory channels (e.g. TCM, L1, L1LCM) could access the main memory in parallel via serial interfaces. This is particularly beneficial if data buffers are implemented in the memory channels, which hold data of a specific address range. If multiple memories (e.g. TCM, PP$L1, SP$L1, BP$L1, GP$L1) use a single channel, likely the buffers will be continuously trashed as each source likely operates in a different address range.

For achieving higher bandwidth, a processor core may combine a plurality of its serial channels, if high data bandwidth from a single address range is required.

On the memory side, each serial interface can connect to a dedicated memory or memory bank, allowing independent parallel access to the plurality of memories without the limitation of a single monolithic memory.

Therefore described features include a) use of a plurality of (e.g., serial) data transmission channels, b) each may operate on a different address and/or be driven by a different processor core or unit within a processor core (e.g. different caches, LCM, TCM, etc); c) at least a subset of the plurality of channels are capable of connecting to the same higher level memory system and/or device. In one mode the subset of channels may operate completely independent driven by different cores and/or units with a core and/or operate on different addresses, in another mode they might be bundled for increasing the data transmission bandwidth operating on the same address and driven by the same core or unit within a core.

One major benefit of described features is the unimpaired operation and transfer of the serial memory channels. Address sequences can be completely independent. The memory banks can independently precharge, particularly in respect of time. Caches and cache hierarchies may be independent, so that there is no collision between the address spaces of a plurality of processor cores and/or software threads.

In some implementations, there are at least as many (serial) memory channels as cores implemented. If the cores or at least some of the cores support multiple address generators (AGU) and/or Load/Store Units (LSU), preferably more (serial) memory channels than processor cores exist, preferably at least one channel for each respective unit (AGU and/or LSU). For even greater performance, at least for some of the respective units (AGU and/or LSU) more than one memory channel is available.

Figure 1:
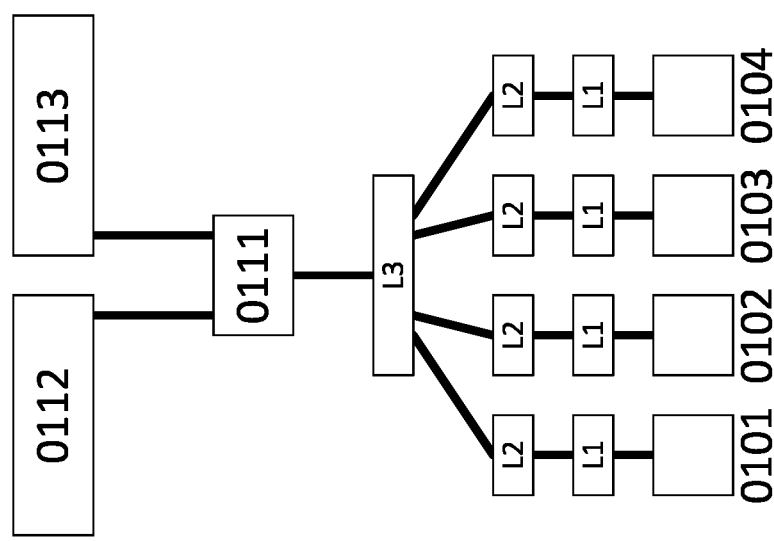
FIG. 1 is a diagrammatic illustration of a multi-core processor memory architecture of the prior art.

FIG. 1 shows a multi-core processor memory architecture of the prior art having 4 processor cores (0101, 0102, 0103, 0104). Each core may have its dedicated Level-1 Cache (L1) and possibly Level-2 Cache L2. According to [2-11] each of the level may comprise local direct access memory (TCM and/or LCM). The cores memory paths are combined into a single Level-3 Cache (L3). A memory controller (0111) connects the L3 cache to the main memory. Shown are 2 example memory banks, 0112 and 0113). The memory banks may operate ganged or unganged. Examples for such architectures are the Intel Core2Duo, i5, i7 or the newer Sandybridge Architecture, in which the lower level caches may be shared and/or accessed by the cores via a ring-bus.

FIG. 2 shows a respective example for an architecture according to some described features. The fundamental architecture is the same, the 4 cores are embodied (0101, 0102, 0103, 0104), each core may have its dedicated Level-1 Cache (L1) and possibly Level-2 Cache L2, each of the level may comprise local direct access memory (TCM and/or LCM). It shall explicitly be noted, that in some embodiments, the Level-1 (L1) and Level-2 (L2) memory hierarchy might be implemented according to [2-11]. The memory channels are not combined into a single L3 cache, but switched by a switch (0201), so that depending on the respective address a matching memory bank is selected. The switch (0201) could, for example, be implemented as a crossbar, or if in some embodiments the channels are already serialized at this point, using switches similar to the well know LAN or ATM network switches. Important is, that the channels from the caches are not merged (funnelled) into a single channel or very limited amount of channels (3 or less) to the memory banks (0207, 0208, 0209, 0210, but are preferably kept completely separated (or only minimally combined (e.g. a 1:2 or 1:4 ratio for large multi-core systems (e.g. >8 cores)).

The switch, however, not only connects the channels via independent and/or dedicated memory controllers (0203, 0204, 0205, 0206) to the memory banks, but also arbitrates the access, in case a plurality of channels requests access to the same memory bank.

Each channel has its own and independent memory controller (0203, 0204, 0205, 0206), interfacing to the independent system memory banks (0207, 0208, 0209, 0210).

In some embodiments, a joint L3 cache (0202) might be attacked to the switch, in which e.g. jointly accessed data may reside, which is shared or exchanged between the cores. Other jointly used data may reside in a LCM according to [2-11]. The L3 cache (0202) might be monolithic or also split into a plurality of banks, so that each of the banks can be accessed in parallel without significantly impairing other accesses.

Preferably cores comprise a plurality of independent address generators and/or Load/Store Units (for example Intel Core2Duo, i7, Sandybridge, in which at least one store and one load operation can be independently performed, for more complex architectures see also [1-11] and [2-11]).

Figure 3:
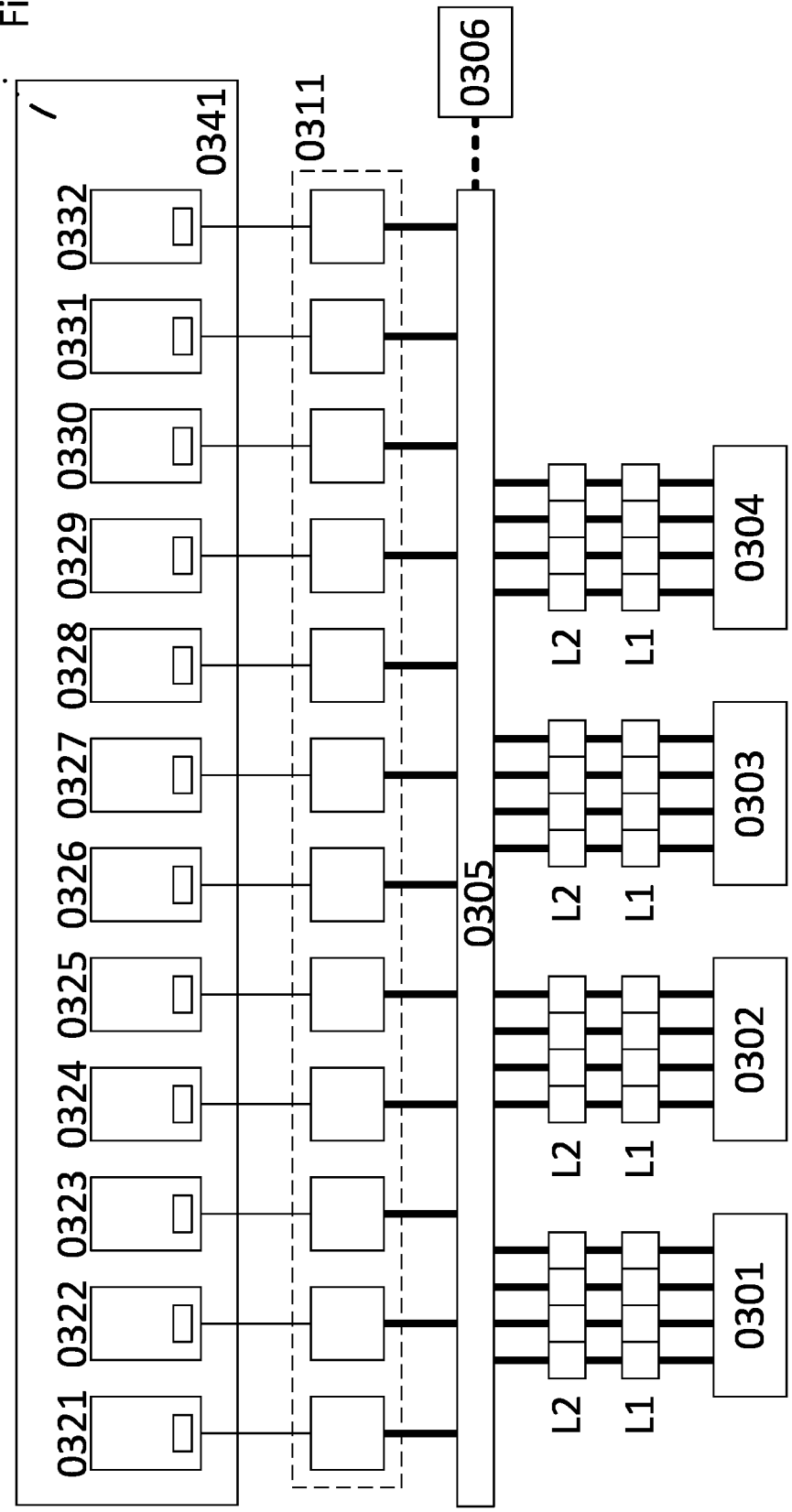
FIG. 3 is a diagrammatic illustration of another example multi-core processor memory architecture of the present disclosure.

An example implementation is shown in FIG. 3. Again 4 cores are implemented (0301, 0302, 0303, 0304), having a L1 and L2 memory hierarchy similar to FIG. 2. Each core has 4 independent channels, connected to 4 independent address generators and/or Load/Store Units. It shall be noted, that the channels are not necessarily as homogeneous as shown in FIG. 3 but not need to have an identical architecture: For example, some may have L1 and L2 caches, others may only have a L1 cache, others may comprise a TCM and/or LCM according to [2-11].

The example 16 channels (4 channels per core, 4 cores in total), are connected to a switch (0305), which may be implemented as described in FIG. 2 (0201).

In this example embodiment fewer memory banks the memory channels exist. Therefore the switch arbitrates and multiplexes the access of the n channels onto m memory banks (0321, 0322, 0323, 0324, 0325, 0326, 0327, 0328, 0329, 0330, 0331, 0332).

The memory banks are preferably located within a unit (0314) such as a memory chip or a memory module, e.g. a SIMM or DIMM. A respective example implementation is shown in FIG. 12, with e.g. 1221 corresponding to 0321, 1222 to 0322, 1223 to 0323, and so on.

Figure 3A:
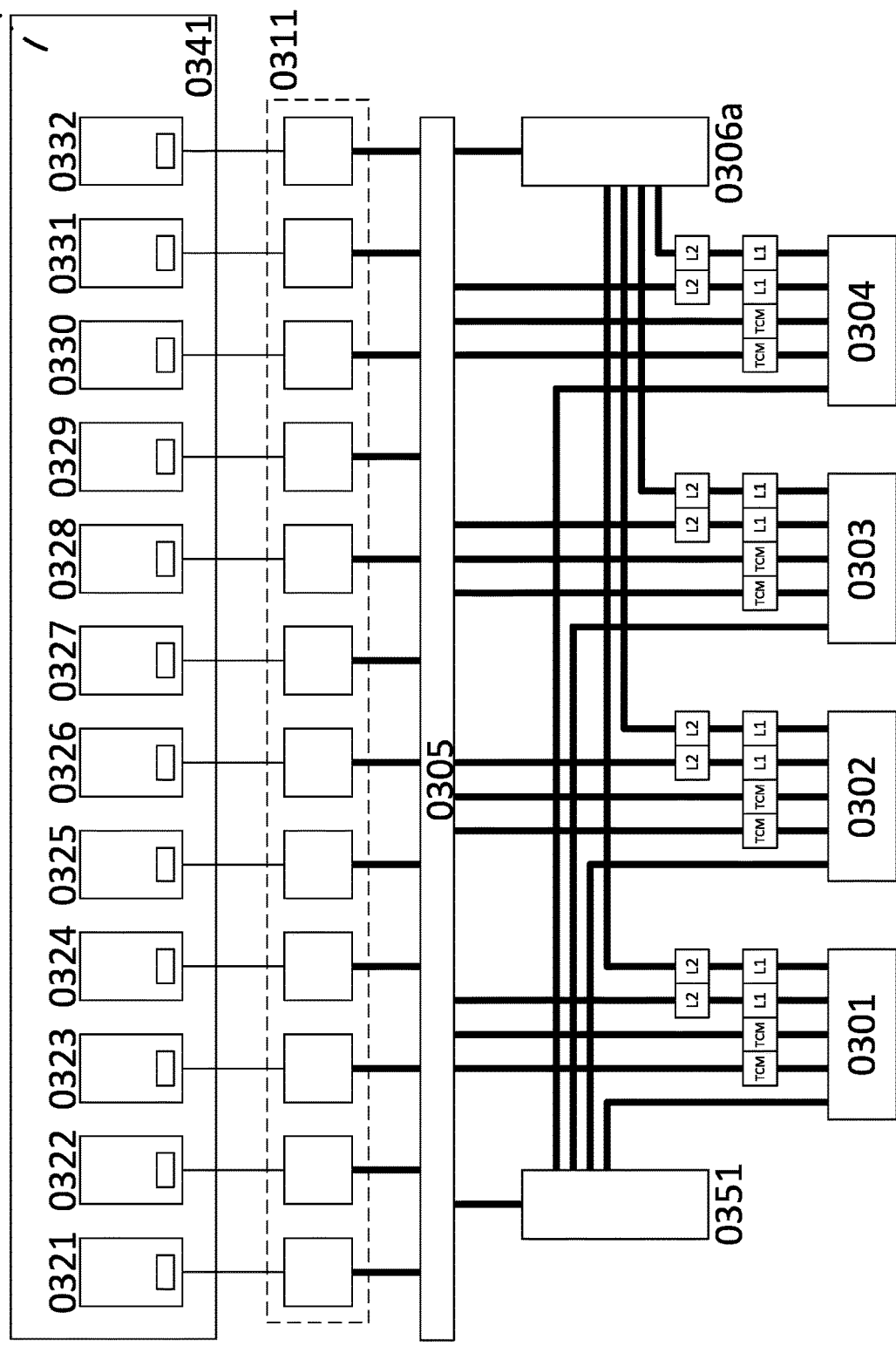
FIG. 3a is a diagrammatic illustration of another example multi-core processor memory architecture of the present disclosure.
Figure 12:
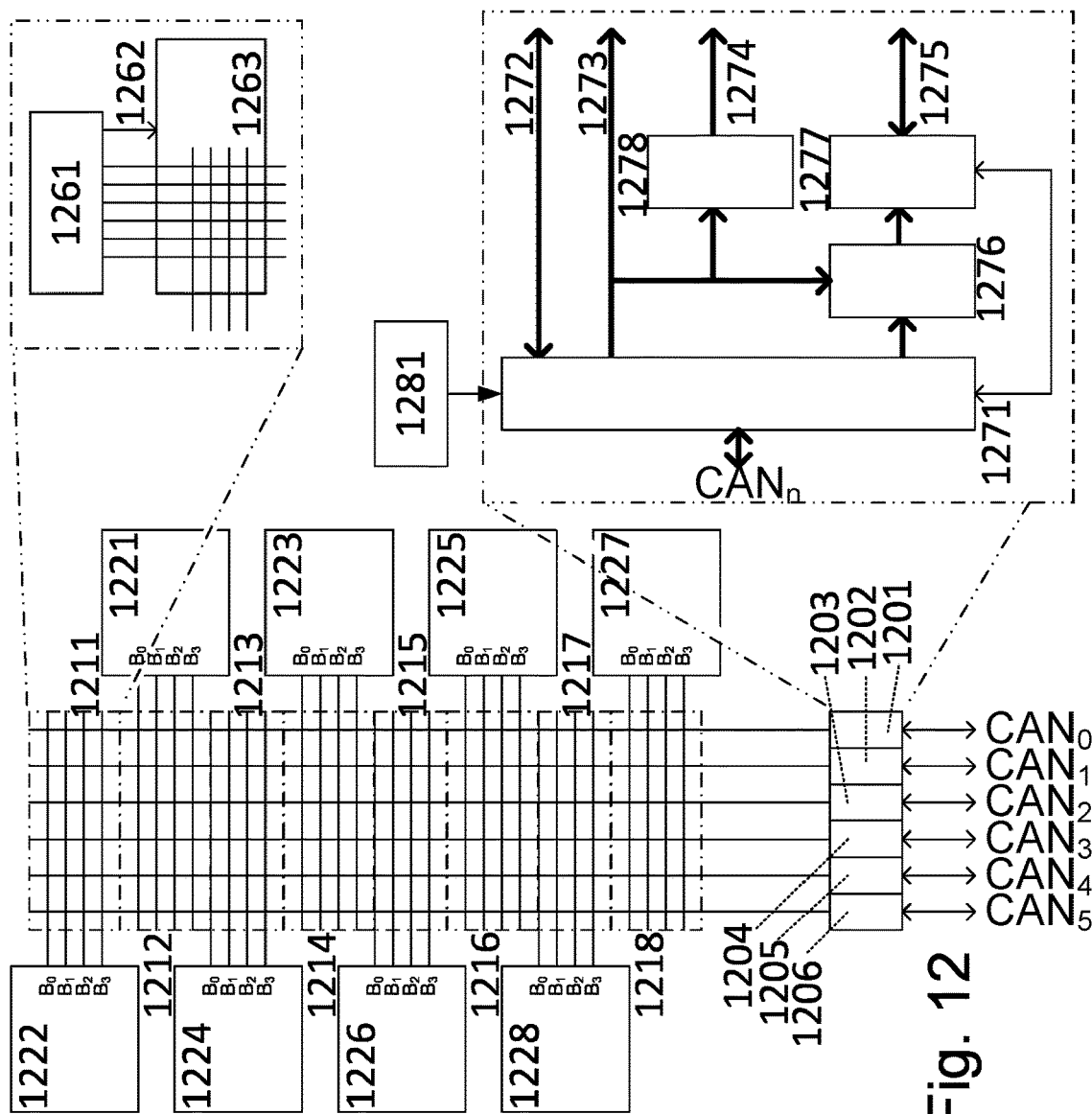
FIG. 12 is a diagrammatic illustration of an example memory chip according to the present disclosure.

The embodiment in FIG. 12 comprises 8 memory banks, while FIG. 3 and FIG. 3a show 12 banks. However it is obvious for one skilled in the art, that memories with more than 8 banks can be implemented according to described features and in some implementations may even be preferred. In 8 processor-core systems memories with 32 banks seem preferable, assuming that each core comprises 4 independent load/store units. More or less load/store units will change the preferred ratio, as well as a higher or lower number of processor-cores in the system.

As described in FIG. 2 (0202) a L3 cache may be attached to the switch (0306).

It shall be expressively noted, that in some embodiments the switch (0201, or 0306) may not be located between the cores and the memory controllers (as shown), but between the memory controllers and the memory banks. Particularly in those implementations serial switches similar to LAN and/or ATM network switches may be implemented. However, both the memories and the memory controller, particularly the protocol in between, must be adapted, so that a random plurality of memory controllers may communicate with a random plurality of memory banks.

Yet another example embodiment is shown in FIG. 3a. Embodiments like this example one are preferred as it comprises advanced and more efficient local memory architectures as described in [2-11], which is entirely incorporated by reference for full disclosure and respective features might be claimed. Each of the processor cores interfaces through 5 channels to the memory banks (0321, 0322, 0323, 0324, 0325, 0326, 0327, 0328, 0329, 0330, 0331, 0332) of the main memory (0341) which might be a chip or module.

The channels are connected in different ways to the switch (0305) and ultimately to the main memory: One of these channels connects to a Locally Connected Memory (LCM, 0351) according to [2-11], which is in this example shared between all cores. 2 channels per core are connected to Tightly Coupled Memories (TMC) according to [2-11]. One channel is connected via a Level-1 and Level-2 cache hierarchy. Yet another channel is via a Level-1 and Level-2 cache hierarchy to a shared Level 3 cache (0306a).

In such an embodiment, data might be partitioned into 3 groups:

Shared by many cores (SBM)

Accessible by many cores but assigned to a preferred owner (processor-core) (ABM)

Exclusively dedicated to a single owner (processor-core) (EDO)

Data shared by many cores (SBM) is preferably treated (by the operating system and/or Memory Management Unit) such, that it resides in the shared Level 3 cache and/or the shared LCM (0351).

The sharing the Level-3 cache requires a coherency protocol implemented in the paths from the processor cores through the Level-1 and Level-2 cache to the Level-3 cache. (It shall be noted that in slightly modified embodiments, the Level-2 cache might be already shared (as e.g. shown in FIG. 1). Sharing data via the LCM (0351) is preferably software managed using dedicated locking and/or scheduling mechanisms. For further details, protocols and mechanism reference is made to the patent [2-11] incorporated by reference.

Data accessible by many cores but assigned to a preferred owner (processor-core) (ABM), might be transferred via any of the channels. However, in some embodiments, no implicit coherence management is provided by the hardware, but explicit software management is preferred, e.g. using dedicated locking and/or scheduling mechanisms.

Data exclusively dedicated to a single owner (processor-core) (EDO) might be transferred via any of the channels. However, as no coherence management is required, it is preferably transferred via channels not having coherence measures implemented in order to avoid the resulting overhead (e.g. energy consumption, bandwidth reduction, etc).

Memory Architecture

Within an inventive system, a plurality of memory banks exist (e.g. FIG. 3: 0321, 0322, . . . , 0332). The banks may be implemented as dedicated memory chips, which could be combined on one or a plurality of memory modules, similar to DIMMs known in the prior art. Also and preferably all banks or a plurality of banks may be combined into one single memory chip. For example could a memory chip comprise 4 banks. This allows to implement the memory system of FIG. 3 into 3 chips, a first one comprising 0321, 0322, 0323, 0324, a second one comprising 0325, 0326, 0327, 0328 and a third one comprising 0329, 0330, 0331, 0332. Those chips may be mounted onto a single memory module. In other embodiments, a memory module may comprise 2 chips, so that 2 memory modules are required for the memory system in FIG. 3, with one chip unused. In yet other embodiments, a memory module may comprise 4 chips, so that only one module (with one chip unused) is required for the example system of FIG. 3.

However, it is clearly preferred to achieve the highest possible integration density. Therefore, if possible memory chips comprise the plurality of independently operable banks. If this is not possible, e.g. due to complexity or cost, a plurality of memories are implemented on a single module such that they form a plurality of independently operable banks.

"Independently operable" means that each bank or at least some of the plurality of the banks can be simultaneously accessed by different channels; and read and write data, precharge, etc. independently from other banks.

Multiple memories may be combined to form a larger memory space, for example by forwarding the serial channels from one module to the next. Respective technologies are known in the prior art, e.g. Rambus XDR [7-11] and FBDIMMs [6-11].

FIG. 4 shows an example embodiment of a memory. Four banks (0401, 0402, 0403, 0404) are implemented. The banks may operate independent, e.g. be separately access, addressed, precharged, etc. As each bank usually has a close relation to a single or very small amount of address generators and/or Load/Store Units, in some embodiments each bank may comprise its dedicated small cache or data buffer (0405, 0406, 0407, 0408). Each bank may be reserved for or at least preferably accessed at runtime by a single processor core (in a multi-core environment) or a group of closely cooperating processor cores, sharing the data located in the memory bank. In an optimal environment banks might even be dedicated (at least temporarily) to a cache and/or load/store unit (e.g. an address generator) within a processor core.

If a bank is reserved for a processor core, this core has unrestricted access to the bank. No other core is allowed accessing the data unless the core it is reserved for explicitly grants access. This can be done by a hardware mechanism or preferably the application program executed or the operating system.

As a result of this, bandwidth is greatly increased as only the core the bank is reserved for has unlimited access. Simultaneously coherency issues are greatly reduced as the data in the memory bank is by definition reserved for that single core. If other cores request access, the request and approval is handled explicitly allowing for explicit and controlled (e.g. by the application program or operating system) sharing of data, so that coherency is software managed.

This leads to high data locality and dedication, reducing the likelihood of accesses to a specific memory bank by other processor cores or units within a processor core. This dedication to a core or unit allows for undisturbed data access enabling data transmission at high bandwidth and low latency.

The close relationship between the memory banks and the software accessing the data (via said address generators and/or Load/Store units) leads to decent locality of the access patterns to efficiently enable the implementation of a cache closely coupled to the memory bank. Also or alternatively each bank may have the means for independent and/or dedicated precharge and possible some buffers (if no cache is implemented).

4 independent serial interfaces (0409, 0410, 0411, 0412) may independently transfer data via a serial channel (0413, 0414, 0415, 0416) to the accessing core.

In some embodiments, multiple channels can be dynamically combined to achieve higher bandwidth, even transmitting from a single block. For example this can be achieved by implementing multiplexer/demultiplexer stages (0421, 0422, 0423, 0424) between the serial interfaces and the memory banks and/or cache.

If for example a memory bank (or its cache) provides a 64 bit interface to the serial interface, a multiplexer could sequentially select in 4 steps 16 bits (Step 1: bits 0 . . . 15, Step 2: bits 16 . . . 31, step 3: bits 32 . . . 47, step 4: bits 48 . . . 63) for transmission via the serial interface. When 2 interfaces are combined only two sequential steps are necessary: In the first step, the first multiplexer of the first serial interface selects bits 0 . . . 15 and the second multiplexer of the second interface selects bits 16 . . . 31; in the second step the first multiplexer of the first serial interface selects bits 32 . . . 47 and the second multiplexer of the second interface selects bits 48 . . . 63.

When (temporarily) even all 4 channels are combined for transmitting data, only one single step is required: The first multiplexer of the first serial interface selects bits 0 . . . 15 and the second multiplexer of the second interface selects bits 16 . . . 31, third multiplexer of the third serial interface selects bits 32 . . . 47 and the fourth multiplexer of the fourth interface selects bits 48 . . . 63.

The exemplary memory in FIG. 4 comprises only 4 memory banks, which may be insufficient. Ideally the banks are rather fine grained, so that each memory provides 1024 banks or even more to provide reasonable flexibility.

In some embodiments the banks are have no strict relationship to a specific interface, but each interface can access the banks freely. This can be achieved via a switch connecting temporarily a bank to a channel depending on the address transmitted by the channel. The switch might be similar to the one on the processor side (e.g. 0201, 0305) as previously discussed. If a plurality of channels addresses the same bank, one channel is arbitrated first for data transfer, afterwards the next channel is arbitrated, and so on. In cheaper memory implementations, all or at least some bank to interface relations may be limited to one exclusive connection at a time. This minimizes the hardware complexity of the switch but simultaneously reduced the number of parallel transfers between the interfaces and the memory banks.

In some embodiments memory banks might be locked to specific interfaces. If other interfaces (which means other processor cores) require access, the core currently owning the bank has to unlock the bank first. This allows for implementing data coherence and/or locking mechanisms for shared data, as well as efficient memory protection.

One particular advantage of the inventive architecture is the predictability of the memory access patterns. In architectures of the prior art, a plurality of threads share the memory, the access patterns depend on the currently active thread and the currently arbitrated core. This prohibits any kind of intelligent forward looking mechanism locally associated with the memory blocks for speeding up the memory access. However, given the increased locality and virtual close and direct connection of a memory block to the respective AGU and/or LSU in the core, precharging and/or precaching and/or preaddressing features might be implemented in the memory blocks for reducing the over-all access time.

Based on temporal or spatial locality of data, future data accesses can be predetermined and executed in advance, providing faster access.

A variety of methods can be implemented, either exclusively or (as preferred) in combination. For example:

The memory banks could speculatively precharge and/or precache a next data block. For example a local pattern generator in the memory may select the sequentially next block or a next block according to a previously analysed access pattern (e.g. by analysing past address patterns).

A local pattern generator in the memory may receive during an initialization or setup sequence an address pattern, either as a list of addresses or a formula how to calculate the addresses and then selects at access time the next block to preload (e.g. precharge and/or precache) on basis of the current addresses.

A local pattern generator in the memory may receive with each data transfer (ideally block transfers) a directive which block has to be preloaded (e.g. precharged and/or precached) next.

The memory architecture according to [5-11] or the known XDR memory architecture of Rambus may constitute a potential foundation for implementing memories according to described features.

FIG. 11 shows an example DRAM of the prior art. The addresses (1101) are fed to a command decoder (1102), which also receives the control signals, such as RAS, CAS, etc. The command decoder feed the controller (1103) generating the internal control signals and timing (e.g. read, write, refresh, precharge, etc). The addresses are also fed to the row buffer (1104) buffering the row address and column buffer (1105) buffering the column address. The row decoder (1106) and column decoder (1107) respectively decode the addresses from the buffers and drive the memory banks. Sense amplifiers (1107) acquire the read signals from each related memory bank. In this example 8 memory banks are implemented (1108a, . . . , 1108d, . . . , 1180h), which are selected by the control logic. Data control logic (1109) selects the data word to be read or written and masks unmodified bits. A latch arrangement (1110) stores the respective read or write data.

Another example embodiment of a memory chip according to described features is shown in FIG. 12. This implementation comprises 6 IO channels (CANO-5, which might be completely serial, partially serial or even parallel). Each channel has a respective controller for managing the channel interface (1201, . . . , 1206). Each channel drives an internal bus system, which might be fully parallel (address, data, and control each have separate lines), multiplexed (e.g. first and second address part are multiplexed, data and control are multiplexed and transmitted in 2 cycles; address, data and control are all multiplex and transmitted in 3 cycles; or other combinations), or serial.

Parallel busses are fast and don't require much logic at the side of the memory banks for further management. However they are big, making the later on described connector structures (1211, . . . 1218) large and inefficient.

Serial busses are small, theoretically leading to small crossbar structures, but requiring significant amount of additional management structures at each of the memory banks and within the crossbar structures.

Multiplexed busses are a compromise and in some implementations, may be regarded as preferred.

However, ultimately the chosen implementation is purely a design choice, depending on specific requirements for e.g. performance, power dissipation and area; also the specification of e.g. the memory size, number of banks, number of channels, protocol complexity; further, the silicon technology and abilities of the processor, and certainly other factors.

This example embodiment comprises 8 memory banks (1221, . . . , 1228). The memory banks are connected via a flexible and runtime controllable connector structures (1211, . . . , 1218) to the channel interfaces (1201, . . . , 1206). The connector structure is under control of the channel interfaces and connects the memory banks flexibly to the channels are request by the addresses provided by each of the channels. For each address, the actual connection setting between channel and memory bank may change as required by the current address. Each connector structure may comprise multiplexer structures, crossbar structures or any suitable means for providing the runtime configurable connectivity.

In some embodiments memory banks might be connected via one bus to exactly one channel. In other embodiments a plurality of channels may access a memory bank simultaneously, so that a plurality of connections to a plurality of channels is provided. In the shown example embodiment, each bank provides 4 connections (B0, B1, B2, B3) and has therefore the capability to connect simultaneously to up to 4 channels. For example 2, 3, or all 4 channels might be combined to transfer a plurality of data words in parallel to a single processor core and/or to a single load/store unit and/or a single cache and thus increasing the available bandwidth by a respective factor.

Each example memory bank comprises a memory array (1241), sense amplifiers (1246), row decoder (1242) and column decoder (1243), as well as the respective row address buffer (1244) and column address buffer (1245). A data control unit (1247) selects the addressed data word for read access and masks unselected parts for write access. Depending on the internal bus type a latch and/or register might be implemented for buffering the data and a bus controller managing the internal bus (1248).

The example embodiment in FIG. 14 has the capability of merging cannel so that a bundle of channels can transfer data jointly between a memory bank and a processor core and/or load/store unit and/or cache. In some embodiments, subsequent data words are transferred by the merged channels. The first channel is master controlling the data transfer and transmitting addresses and control. For example in a merged setup using 2 channels, channel 1 (CAN1) might be master and transferring words of the odd address (word aligned) and channel 3 (CAN3) might transfer words of the even address. As another example, a setup using 4 channels might use channel 5 (CAN5) as master, transferring the data word at address A1 . . . 0=00; and channels 1, 2, and 4 (CAN1, CAN2, CAN4) as depending channels, e.g. with CAN1 transferring words of address A1 . . . 0=01, CAN2 transferring words of address A1 . . . 0=10, CAN4 transferring words of address A1 . . . 0=11. In yet another 4 channel setup channels CAN0, CAN1, CAN2, and CAN3 might be linearly merged.

Which channels are connected to a memory bank is configured by the connector structure as well as the alignment. Each channel being a transfer master can request access to a memory bank by an arbiter (1261) in each of the connector structures. The master channel indicates together with the request for access the slave channels and their alignment to the arbiter. Once the arbiter grants permission it respectively drives (1262) the connector (1263), which e.g. might be a switch, multiplexer and/or crossbar.

Referring back to the memory banks of the example embodiment of FIG. 12, each bank receives the number (1250) of merged channels from the respective arbiter (and/or the first interface bus). The data control unit provides basically access to 4 words simultaneously. A merge control unit (1249) selects the respective part and amount of the data provided by the data control unit (1247), e.g. using multiplexers.

Each bank receives the address (1251) from the respective arbiter (and/or the first interface bus B0).

An example channel interface comprises a bus controller (1271), which might comprise a serializer/deserializer if serial channels according to some embodiments are implemented. The bus controller generates the internal bus signals, e.g. data (1272), address (1273), bank select (1274) selecting the respective memory bank (and accordingly arbiter of the connector structure) for access, and control (1275) controlling the access and internal data transfer, including the arbiters. The channel interface comprises a command decoder (1276), decoding the commands from the microprocessor core (e.g. a cache or load/store unit) transmitted by the channel. The decoder transmits the command to a control logic (1277) which generates the respective control signals (1275). A bank decoder (1278) generates the bank select signals (1274) by decoding the respective part of the address (1273).

In some embodiments, the memory chip comprises a specification memory (1281), in which the specification of the memory chip is stored, e.g. indicating the number of banks, capabilities of merging channels, banks size, etc. This specification memory is readable by the attached processor and/or processor core. Its information can be used by the Memory Management Unit and/or the Operating System to setup the memory layout such that the physical memory range of each processor core (and/or the caches, and/or TCMs, and/or LCMs, and/or load/store units) are aligned to the memory banks of the chip. This information enables, the Memory Management Unit of the processor and/or each of the processor cores, or the Operating System to define the physical memory layout in a way that allows for maximum independency between the memory banks, so that ideally each bank is dedicated to a single processor core and/or cache and/or load/store unit. For ideal independence, particularly memory banks can be dedicated to specific processes and/or tasks and/or threads, to allow for parallel access to the memory banks. Simultaneously the dedication of complete memory banks to specific processes and/or tasks and/or threads minimized coherence issues and allows for reduced coherence management by both, hardware (e.g. coherence protocols) and software (e.g. locking).

Effect on the Processor Architecture

Crossbar

In some embodiments, one major change of the processor architecture is the implementation of a crossbar capable of flexibly interconnecting the external memory channels with the internal AGU and/or LSU.

In some embodiments, the switch decodes for each access either on a word or block oriented basis the memory address and accordingly sets the connection. However, this increases not only the switch's complexity and latency but simultaneously its power dissipation. Therefore, in some embodiments, the switch is controlled by the Memory Management Units, setting the interconnection of the switch in accordance with the currently used memory pages of the data transfers.

As previously described the switch may be embodied in a vast variety of implementations, e.g. multiplexers, crossbar switches, serial/parallel network switches or optical switches.

Memory Management Unit (MMU)

Each core may comprise a local MMU.

In some embodiments, a global MMU might be implemented instead. One global MMU might be more efficient to manage by the operating system, than a plurality of local MMUs per core. Virtual memory addresses are used in the memory hierarchy up to the global MMU.

As one single global MMU might be overloaded with the data traffic generated by the plurality of processor cores, in some embodiments, each processor has its local MMU, which is under control of one global MMU or MMU interface to reduce the burden of the Operating System managing each processor cores MMU separately.

In some embodiments, a unique channel identification is available for each of the memory channels.

In some embodiments the physical addresses are extended such that the unique identification is part of the physical address, e.g. the upper most part of the address. This address part defines the memory channel which is used for the transfer.

In a preferred implementation, the MMU operates on the physical granularity of memory banks and accordingly manages the physical addresses. Each memory bank has a unique identifier, which may be translated to the channel identifier. The translation might be done within a separate Channel Management Unit, yet in some embodiments it is implemented as part of the MMU.

Bypassing MMU and/or Crossbar

In some embodiments some channels may bypass the MMU and/or crossbar, for reducing latency and saving energy. In some embodiments, with reference to [2-11] the TCM and or LCM paths may use such bypasses for increasing their efficiency. In most cases, at least the TCM contain solely local data, which other cores do not access. Therefore it is possible and efficient to bypass all parts of the memory hierarchy increasing latency and wasting power.

As bypassing the MMU may rise major issues managing virtual and physical addresses in the memory space, it is preferred that at least a minimal address translation is performed, for example as described in [2-11] FIGS. 10, 11, and 12.

Memory Technologies

It shall be expressively noted, that the features laid out in this patent are neither limited to SRAM nor to DRAM technology. A person of ordinary skill in the art understands that these features can be applied with other memory technology, such as SRAM, Flash or new upcoming technologies (e.g. TRAM, TTRAM, Z_RAM, FRAM, Magnetoresistive RAM, PMC, Racetrack, SONGS, NRAM, and other technologies). Some of those memory technologies are briefly described in [2-11], which is fully incorporated by reference.

The described features are independent of the memory technology. Some described features are drawn to more efficient data transfer and access and therefore basically applicable on all existing and future technologies.

Benefits of Serial Memory Channels

The described inventive features reduce the amount of I/O pins per memory channel on a chip. More memories can be implemented in a system and supplied by the processor core with data. This significantly increases the over-all data bandwidth. At the same time the power dissipation per channel might be reduced by the reduced number of I/O pads and/or drivers. At the same time the required silicon area on the chip might be reduced.

The processor might be implemented on a single silicon chip or a stack of silicon chips. The external memories might be part of the stack of silicon chips or separately implemented either as a separated stack or outside the processor package. Alternatively or in addition, the processor may comprise multiple chips (or chiplets) mounted on a (preferably silicon) substrate. The (preferably silicon) substrate might also carry some chip stacks, e.g. High Bandwidth Memories (HBM) memories (see [18]).

Documents [16] and [17] describe related features and are fully incorporated by reference herein.

Example Embodiment

An example processor comprises a data processing unit including the ALU-Block. As described the ALU-Block contains a plurality of arithmetic data processing elements. The example processor further comprises a multi-level cache hierarchy with at least a first (L1) and second level (L2) data cache. The highest level data cache is connected to the main memory, preferably through a plurality of memory channels. The memory channels might be serial. In particular the main memory might comprise a plurality of concurrently accessible memory banks, for example according to FIG. 12.

The second level cache is split into a plurality of memory segments (PE Memories, PEM), each segment having an associated data processing element (PE). During operation, under control of a software program which might be an operating system or user application such as a task or thread, each segment can be individually selected for cache operation (e.g. as a cache line or bank) or as local random access read/write or read only memory dedicated to and/or tightly coupled to a processing element (PE). In some embodiments data for the memory segments is loaded from and/or stored to a higher level cache or main memory by the respectively associated cache controller, for example as described in FIG. 23A.

For increased data bandwidth each of the memory segments (PE Memories; PEM) or groups thereof are connected to associated memory channels for transferring data to higher level (e.g. main) memory. For example each PEM or each group of PEMs might have an associated channel CANn according to FIG. 12 for independently and concurrently transferring data to and from the main memory which may consist of multiple memory blocks (e.g. chips or stack layers of Higher Bandwidth Memories (HBM), reference is made to [18]) and/or banks (e.g. 1221, 1222, 1223, . . . 1228).

LITERATURE AND PATENTS OR PATENT APPLICATIONS INCORPORATED BY REFERENCE

The following references are fully incorporated by reference herein for complete disclosure. It is expressively noted, that claims may comprise elements of any reference incorporated into the specification:

[1] ZZYX07: PCT/EP 2009/007415 (WO2010/043401); Vorbach
[2] ZZYX08: PCT/EP 2010/003459 (WO2010/142432); Vorbach
[3] ZZYX09: PCT/EP 2010/007950; Vorbach
[4] ZZYX10: PCT/EP 2011/003428; Vorbach
[5] ZZYX11: PCT/EP 2012/000713; Vorbach
[6] ZZYX12: DE 11 007 370.7; Vorbach
[7] ZZYX13: US 2014-0351563A1; Vorbach
[8] PACT10: U.S. Pat. No. 6,480,937; Vorbach
[9] PACT17: U.S. Pat. No. 7,003,660; Vorbach; Vorbach
[10] ZZYX16: PCT/US2015/065418; Vorbach
[11] PACT15: U.S. Pat. No. 7,581,076; Vorbach
[12] PACT18: PCT/EP02/02403; Vorbach
[13] PACT45: PCT/EP2004/006547; Vorbach
[14] PACT50: PCT/EP2004/003603; Vorbach
[15] ZZYX16: PCT/US2015/065418; Vorbach[16] Intel Corporation; Accelerating Innovation Through A Standard Chiplet Interface: The Advanced Interface Bus (AIB)
[17] Cambridge Consultants; Chiplets: The Path To IoT Diversity; 2019
[18] Micron Technology, Inc.; 2020; Spencer Homan; Micron White Paper; The Demand for High-Performance Memory
[1-11] ZZYX07: PCT/EP 2009/007415 (WO2010/043401); Vorbach
[2-11] ZZYX08: PCT/EP 2010/003459 (WO2010/142432); Vorbach
[3-11] ZZYX09: PCT/EP 2010/007950; Vorbach
[4-11] ZZYX10: PCT/EP 2011/003428; Vorbach
[5-11] US2006/0117155; Ware et al.
[6-11] Technical Note FBDIMM—Channel Utilization (Bandwidth and Power); PDF: 09005aef8251c075 Micron Technology, Inc., tn4721.fm—Rev. B 1/10 EN
[7-11] RAMBUS XDR Architecture; DL-0161 Advance Information, Version 0.8
[8-11] The unabridged Pentium 4; IA32 Processor Genealogy; Tom Shanley; Mindshare Inc.; ISBNO-321-25656-X
[9-11] CMOS VLSI Design; Fourth Edition; A circuits and systems perspective; Neil H. E. Weste and David Money Harris; Addison-Wesley; ISBN-13:978-0-321-54774-3
[10-11] Minimizing Test power in SRAM through Reduction of Pre-charge Activity; Luigi Dilillo, Paul Rosinger, Bashir M. Al-Hashimi of University of Southampton and Patrick Girard of Laboratoire d'informatique, de Robotique et de Microélectronique de Montpellier
[11-11] ARM926EJ-SmRevision: r0p5 Technical Reference Manual; DI0198E arm926ejs r0p5 trm.pdf; ARM Ltd.
[12-11] http://www.videolan.org/developers/x264.html: VideoLAN, VLC media player and x264 are trademarks registered (or in registration process) by the VideoLAN non-profit organization. Software are licensed under the GNU General License.
[13-11] White Paper "Inside Intel® Corem Microarchitecture Setting New Standards for Energy-Efficient Performance"; Ofri Wechsler Intel Fellow, Mobility Group Director, Mobility Microprocessor Architecture Intel Corporation; Copyright © 2006
Intel Corporation. Printed in the United States. 0306/RMR/HBD/2K 311830-001US
[14-11] Pentium PRO and Pentium II System Architecture; Second Edition; Tom Shanley; Mindshare Inc.; ISBN978-0-201-30973-7

What is claimed is:

1. A data processor comprising:
   at least one data processing unit having a plurality of processing elements to process data; and
   a data cache hierarchy to cache the data processed by the at least one data processing unit, the data cache hierarchy being part of a memory hierarchy having at least a main memory and the data cache hierarchy hierarchically below the main memory, the data cache hierarchy including as part of the data processor:

a plurality of levels of data caches, the data caches including at least:
a lower level data cache;
a higher level data cache connected to the lower level data cache; and
at least one cache controller for each of the data caches, the at least one cache controller controlling the operation thereof;
wherein the main memory is connected to at least one of: a highest level data cache of the data cache hierarchy or an interface connecting at least the data cache hierarchy to the main memory,
wherein:
at least one of the higher level data cache or the lower level data cache is unitarily used as a common cache for the plurality of processing elements during a first period of time,
the at least one of the higher level data cache or the lower level data cache is divided into a plurality of cache segments,
at least one processing element of the plurality of processing elements has at least one cache segment of the plurality of cache segments associated therewith for use as its tightly coupled memory during a second period of time; and
the at least one cache controller is adapted to, during operation of the data processor, exclude the at least one cache segment associated with the at least one processing element at least temporarily from cache operation during the second period of time, such that during the second period of time the at least one processing element has access to the at least one cache segment without access control by the at least one cache controller.

2. The data processor of claim 1, wherein the at least one cache controller that excludes the at least one of the plurality of cache segments performs data transfers to a higher level of the memory hierarchy.

3. The data processor of claim 1, wherein the data processing unit comprises a two-dimensional arrangement of processing elements.

4. The data processor of claim 1, wherein the highest level cache of the data cache hierarchy is connected to the main memory via a plurality of memory channels.

5. The data processor of claim 4, wherein groups of the plurality of cache segments are connected to the plurality of memory channels such that each group can transfer data on a different memory channel in parallel.

6. The data processor of claim 1, wherein the main memory includes a plurality of memory banks that are concurrently accessible.

7. The data processor of claim 1, wherein one or more of the at least one cache segment and the at least one associated processing element are located on the same silicon die.

8. The data processor of claim 1, wherein one or more of the at least one cache segment and the at least one associated processing element are located on adjacent silicon dies in a silicon die stack.

9. The data processor of claim 1, wherein the data processor is adapted to:
following exclusion of the at least one cache segment from cache operation as a tightly coupled memory coupled tightly to the associated at least one processing element,
cause data from the at least one cache segment to offload into a level in the memory hierarchy higher than a level of the at least one cache segment in the memory hierarchy by the at least one cache controller.

10. The data processor of claim 9 wherein the data processor is adapted for multithreading, wherein the exclusion of the at least one cache segment is ended in response to a thread switch and enables, after the exclusion, the cache controller to off-load content of the at least one cache segment into a higher level of the memory hierarchy and load other content into the at least one cache segment from a higher level of the memory hierarchy.

11. The data processor of claim 10, wherein the at least one cache controller is adapted to load content into a given cache segment that has been previously used in a first thread as an excluded cache segment, wherein the content is previously offloaded from the given cache segment when switching from the first thread to another thread,
wherein the content that has been previously offloaded when switching from the first thread to another thread, is loaded back into the at least one cache segment for continuing execution of the first thread.

12. The data processor of claim 11, wherein the at least one cache controller is adapted to re-exclude the at least one cache segment from cache operation after the content previously offloaded has been loaded back into the at least one cache segment.

13. A data processor chip comprising
at least one data processing unit having a plurality of processing elements to process data; and
a data cache hierarchy to cache the data processed by the at least one data processing unit, the data cache hierarchy being part of a memory hierarchy having at least a main memory and the data cache hierarchy hierarchically below the main memory, the data cache hierarchy including as part of the data processor chip:
a plurality of levels of data caches, the data caches including at least:
a lower level data cache;
a higher level data cache connected to the lower level data cache; and
at least one cache controller for each of the data caches, the at least one cache controller controlling the operation thereof;
wherein the main memory is connected to at least one of: a highest level data cache of the data cache hierarchy or an interface connecting at least the data cache hierarchy to the main memory,
wherein:
at least one of the higher level data cache or the lower level data cache is unitarily used as a common cache for the plurality of processing elements during a first period of time,
the at least one of the higher level data cache or the lower level data cache is divided into a plurality of cache segments,
at least one processing element of the plurality of processing elements has at least one cache segment of the plurality of cache segments associated therewith for use as its tightly coupled memory during a second period of time;
the at least one cache controller is adapted to, during operation of the data processor chip, exclude the at least one cache segment associated with the at least one processing element at least temporarily from cache operation during the second period of time, such that during the second period of time the at least one processing element has access to the at least one cache segment without access control by the at least one cache controller; and each of multiple cache segments is associated with a respective processing element as tightly coupled memory and is located physically close to the associated processing element such that the multiple cache segments are spread across the data processor chip.

14. The data processor chip of claim 13, wherein each of a plurality of excludable cache segments is accessible by the associated processing element simultaneously to access of other processing elements to associated excludable cache segments.

15. The data processor chip of claim 14, wherein the data processor chip is adapted to:

following exclusion of the at least one cache segment from cache operation as a tightly coupled memory coupled tightly to the associated at least one processing element, cause data from the at least one cache segment to offload into a level in the memory hierarchy higher than a level of the at least one cache segment in the memory hierarchy by the at least one cache controller.

16. The data processor chip of claim 15 wherein the data processor chip is adapted for multithreading, wherein the exclusion of the at least one cache segment is ended in response to a thread switch and enables, after the exclusion, the cache controller to offload content of the at least one cache segment into a higher level of the memory hierarchy and load other content into the at least one cache segment from a higher level of the memory hierarchy.

17. The data processor chip of claim 16, wherein the at least one cache controller is adapted to load content into a given cache segment that has been previously used in a first thread as an excluded cache segment, wherein the content is previously offloaded from the given cache segment when switching from the first thread to another thread, wherein the content that has been previously offloaded when switching from the first thread to another thread, is loaded back into the at least one cache segment for continuing execution of the first thread.

18. The data processor chip of claim 17, wherein the at least one cache controller is adapted to re-exclude the at least one cache segment from cache operation after the content previously offloaded has been loaded back into the at least one cache segment.

19. The data processor of claim 1, wherein excluding the at least one cache segment at least temporarily from the cache operation includes evicting data from a respective cache segment prior to switching the respective cache segment from the cache operation into tightly-coupled-memory operation.

20. The data processor of claim 19, wherein after switching the respective cache segment into tightly-coupled-memory operation, the cache controller stops operating the respective cache segment.

21. The data processor of claim 20, wherein, upon request, the cache controller preloads and/or offloads data of the respective cache segment to or from the memory hierarchy while the respective cache segment is switched into tightly-coupled-memory operation.

* * * * *